(12) United States Patent
Kawashima et al.

(10) Patent No.: US 9,698,186 B2
(45) Date of Patent: Jul. 4, 2017

(54) NEAR-INFRARED-ABSORBING COMPOSITION, NEAR-INFRARED CUT-OFF FILTER USING SAME, CAMERA MODULE, AND MANUFACTURING METHOD THEREFOR

(71) Applicant: FUJIFILM Corporation, Minato-ku, Tokyo (JP)

(72) Inventors: Takashi Kawashima, Haibara-gun (JP); Hidenori Takahashi, Haibara-gun (JP); Toshihide Ezoe, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 34 days.

(21) Appl. No.: 14/793,456

(22) Filed: Jul. 7, 2015

(65) Prior Publication Data

US 2015/0311244 A1    Oct. 29, 2015

Related U.S. Application Data

(63) Continuation of application No. PCT/JP2014/052303, filed on Jan. 31, 2014.

(30) Foreign Application Priority Data

Feb. 19, 2013  (JP) ................................. 2013-030488
Jul. 24, 2013  (JP) ................................. 2013-153990

(51) Int. Cl.
*F21V 9/04*  (2006.01)
*F21V 9/06*  (2006.01)
(Continued)

(52) U.S. Cl.
CPC ........ *H01L 27/14621* (2013.01); *G02B 5/208* (2013.01); *G02B 5/223* (2013.01);
(Continued)

(58) Field of Classification Search
CPC .......... G02B 5/22; G02B 5/208; G02B 5/223; H01L 27/14621; H01L 27/14685
(Continued)

(56) References Cited

U.S. PATENT DOCUMENTS

2004/0185588 A1\*  9/2004  Fukuyoshi ........... G02B 3/0012
438/22

FOREIGN PATENT DOCUMENTS

JP     WO9926952   \*  6/1999  ............... C07F 9/09
JP     2008-091535 A    4/2008
(Continued)

OTHER PUBLICATIONS

Notification of Reasons for Refusal, dated Nov. 24, 2015, issued in corresponding JP Application No. 2014-026717, 7 pages in English and Japanese.
(Continued)

*Primary Examiner* — Bijan Ahvazi
(74) *Attorney, Agent, or Firm* — Sughrue Mion, PLLC

(57) ABSTRACT

A near-infrared-absorbing composition includes a copper compound and a compound having a partial structure represented by Formula (1) described below and the content of the copper compound is in a range of $3\times10^{-3}$ mol to 1 mol in relation to 1 g of the compound having the partial structure represented by Formula (1) described below,

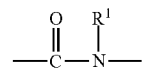

Formula (1)

in Formula (1), $R^1$ represents a hydrogen atom or an organic group.

13 Claims, 2 Drawing Sheets

(51) Int. Cl.
  *G02B 5/22*      (2006.01)
  *G02B 5/26*      (2006.01)
  *H01L 27/146*    (2006.01)
  *G02B 5/20*      (2006.01)
  *H01L 31/0232*   (2014.01)
  *H01L 21/00*     (2006.01)
  *G02B 13/00*     (2006.01)

(52) U.S. Cl.
  CPC .. *H01L 27/14618* (2013.01); *H01L 27/14625* (2013.01); *H01L 27/14685* (2013.01); *G02B 13/003* (2013.01)

(58) Field of Classification Search
  USPC ......... 252/586, 587; 348/340, 342; 359/359; 427/160, 162; 430/7; 438/70; 556/110; 257/432
  See application file for complete search history.

(56) References Cited

FOREIGN PATENT DOCUMENTS

| | | | | |
|---|---|---|---|---|
| JP | 2010-134457 | A | 6/2010 | |
| JP | 2011-227528 | * | 11/2011 | ............... G02B 5/22 |
| JP | 2011-227528 | A | 11/2011 | |
| TW | 201027147 | A | 7/2010 | |
| WO | 99/26952 | A1 | 6/1999 | |
| WO | 2004/006336 | A1 | 1/2004 | |

OTHER PUBLICATIONS

Communication, dated May 27, 2016, from the Korean Intellectual Property Office in counterpart Korean application No. 10-2015-7018728.

Communication dated Aug. 31, 2016, issued by the Sate Intellectual Property Office of the P.R.C. in corresponding Chinese Application No. 201480004079.3.

International Preliminary Report on Patentability and Written Opinion, dated Aug. 25, 2015, issued in corresponding International Application No. PCT/JP2014/052303, 8 pages in English.

International Search Report for PCT/JP2014/052303 dated Apr. 28, 2014 [PCT/ISA/210], 5 pages in Japanese and English.

Written Opinion for PCT/JP2014/052303 dated Apr. 28, 2014 [PCT/ISA/237].

Office Action dated Feb. 3, 2017, issued by the Korean Intellectual Property Office in corresponding Korean Application No. 10-2015-7018728.

Office Action dated Feb. 8, 2017 from the Taiwanese Patent Office in counterpart Taiwanese Application No. 103105383.

Office Action dated Feb. 3, 2016, issued by the Korean Intellectual Property Office in corresponding Korean Application No. 10-2015-7018728.

Communication dated Nov. 29, 2016, issued by the Korean Intellectual Property Office in corresponding Korean Application No. 10-2015-7018728.

* cited by examiner

NEAR-INFRARED-ABSORBING COMPOSITION, NEAR-INFRARED CUT-OFF FILTER USING SAME, CAMERA MODULE, AND MANUFACTURING METHOD THEREFOR

CROSS-REFERENCE TO RELATED APPLICATIONS

This application is a Continuation of PCT International Application No. PCT/JP2014/52303, filed on Jan. 31, 2014, which claims priority under 35 U.S.C. §119(a) to Japanese Patent Application No. 2013-030488, filed on Feb. 19, 2013 and Japanese Patent Application No. 2013-153990, filed on Jul. 24, 2013. Each of the above application(s) is hereby expressly incorporated by reference, in its entirety, into the present application.

BACKGROUND OF THE INVENTION

1. Field of the Invention

The present invention relates to a near-infrared-absorbing composition, a near-infrared cut-off filter using the same, a camera module, and a manufacturing method therefor.

2. Description of the Related Art

A CCD or CMOS image sensor that is a solid-state imaging element for color images has been used for video cameras, digital still cameras, mobile phones equipped with a camera function, and the like. In the solid-state imaging element, since a silicon photodiode having sensitivity to near-infrared rays is used in the light-receiving section, it is necessary to revise the luminosity factor and a near-infrared cut-off filter (hereinafter, also referred to as the IR cut-off filter) is frequently used.

As a material for the near-infrared cut-off filter, JP2010-134457A discloses an infrared shielding film that includes an infrared shielding resin obtained by adding a metallic compound to a copolymer of a reactant of (meth)acrylamide and phosphoric acid or a hydrolysate thereof and a compound having an ethylenic unsaturated bond.

SUMMARY OF THE INVENTION

As a result of intensive studies, the present inventors found the following fact. In the technique disclosed in JP2010-134457A, since a copper compound is added to a copolymer including phosphoric acid and a compound having an ethylenic unsaturated bond, when the amount of the copper compound added is too large, a crosslinked structure originating from a copper complex or the copper compound is formed in the copolymer including phosphoric acid and it becomes difficult to form a thin film. Therefore, it was found that, in the technique disclosed in JP2010-134457A, it is not possible to increase the amount of the copper compound added and, consequently, it is not possible to obtain a near-infrared-absorbing composition capable of forming a cured film having excellent moisture resistance while maintaining strong near-infrared shielding properties when a cured film is produced.

An object of the present invention is to provide a near-infrared-absorbing composition capable of forming a cured film having excellent moisture resistance while maintaining strong near-infrared shielding properties when a cured film is produced.

As a result of intensive studies on the basis of the above-described circumstances, the present inventors found that, when a compound having a partial structure of —C(=O)NR¹— (R¹ represents a hydrogen atom or an organic group) and a certain amount of a copper compound in relation to the above-described compound are blended in a near-infrared-absorbing composition, the above-described problem can be solved.

Specifically, the above-described object has been achieved by means <1> described below and preferably means <2> to <16>.

<1> A near-infrared-absorbing composition, including:
a copper compound; and
a compound having a partial structure represented by Formula (1) described below,
in which a content of the copper compound is in a range of $3 \times 10^{-3}$ mol to 1 mol in relation to 1 g of the compound having the partial structure represented by Formula (1) described below, Formula (1)

in Formula (1), $R^1$ represents a hydrogen atom or an organic group.

<2> The near-infrared-absorbing composition according to <1>, in which a content of the compound having the partial structure represented by Formula (1) is in a range of 5 mass % to 80 mass % in the near-infrared-absorbing composition.

<3> The near-infrared-absorbing composition according to <1> or <2>, in which the copper compound is a copper complex.

<4> The near-infrared-absorbing composition according to any one of <1> to <3>, in which the compound having the partial structure represented by Formula (1) is a polymer.

<5> The near-infrared-absorbing composition according to <4>, in which the polymer has the partial structure represented by Formula (1) at a side chain thereof.

<6> The near-infrared-absorbing composition according to any one of <1> to <5>, in which the compound having the partial structure represented by Formula (1) has a structure represented by any one of Formulae (1-1) to (1-5) described below, Formula (1-1)

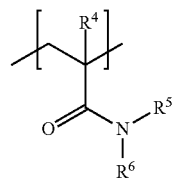

Formula (1-2)

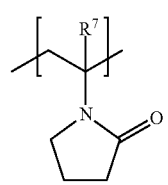

Formula (1-3)

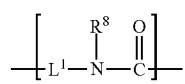

Formula (1-4)

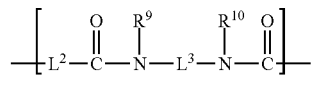

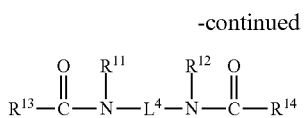

Formula (1-5)

(In Formula (1-1), $R^4$ represents a hydrogen atom or a methyl group and each of $R^5$ and $R^6$ independently represents a hydrogen atom or an organic group. In Formula (1-2), $R^7$ represents a hydrogen atom or a methyl group. In Formula (1-3), $L^1$ represents a divalent linking group and $R^8$ represents a hydrogen atom or an organic group. In Formula (1-4), each of $L^2$ and $L^3$ independently represents a divalent linking group and each of $R^9$ and $R^{10}$ independently represents a hydrogen atom or an organic group. In Formula (1-5), $L^4$ represents a divalent linking group and each of $R^{11}$ to $R^{14}$ independently represents a hydrogen atom or an organic group.)

<7> The near-infrared-absorbing composition according to <6>, in which the compound having the partial structure represented by Formula (1) is a compound represented by Formula (1-1).

<8> The near-infrared-absorbing composition according to any one of <1> to <7>, further including: a curable compound and a solvent.

<9> The near-infrared-absorbing composition according to any one of <1> to <8>, in which a solid content of the near-infrared-absorbing composition is in a range of 35 mass % to 90 mass %.

<10> The near-infrared-absorbing composition according to any one of <1> to <9> which is used in a form of a coated film formed on an image sensor for a solid-state imaging element.

<11> A near-infrared-absorbing composition, including:
a copper compound; and
a compound having a partial structure represented by Formula (1)' described below and no anionic group,

Formula (1)' in Formula (1)', $R^2$ represents a hydrogen atom or an organic group.

<12> The near-infrared-absorbing composition according to any one of <1> to <10>,
in which the compound having the partial structure represented by Formula (1) further includes an epoxy group or an oxetanyl group.

<13> The near-infrared-absorbing composition according to any one of <1> to <10>,
in which the compound having the partial structure represented by Formula (1) is a polymer including a repeating unit that has the partial structure represented by Formula (1) and a repeating unit that includes an epoxy group or an oxetanyl group.

<14> The near-infrared-absorbing composition according to <11>,
in which the compound having the partial structure represented by Formula (1)' further includes an epoxy group or an oxetanyl group.

<15> The near-infrared-absorbing composition according to <11> or <14>,
in which the compound having the partial structure represented by Formula (1)' is a polymer including a repeating unit that has the partial structure represented by Formula (1)' and a repeating unit that includes an epoxy group or an oxetanyl group.

<16> A near-infrared cut-off filter produced using the near-infrared-absorbing composition according to any one of <1> to <15>.

<17> A camera module, including: a solid-state imaging element substrate; and the near-infrared cut-off filter according to <16> disposed on a light-receiving side of the solid-state imaging element substrate.

<18> A method for manufacturing a camera module including a solid-state imaging element substrate and the near-infrared cut-off filter disposed on a light-receiving side of the solid-state imaging element substrate, including a step of applying the near-infrared absorbing composition according to any one of <1> to <15> to the light-receiving side of the solid-state imaging element substrate so as to form the near-infrared cut-off filter.

According to the present invention, it is possible to provide a near-infrared-absorbing composition capable of forming a cured film having excellent moisture resistance while maintaining strong near-infrared shielding properties when a cured film is produced.

DESCRIPTION OF THE PREFERRED EMBODIMENTS

Figure 1:
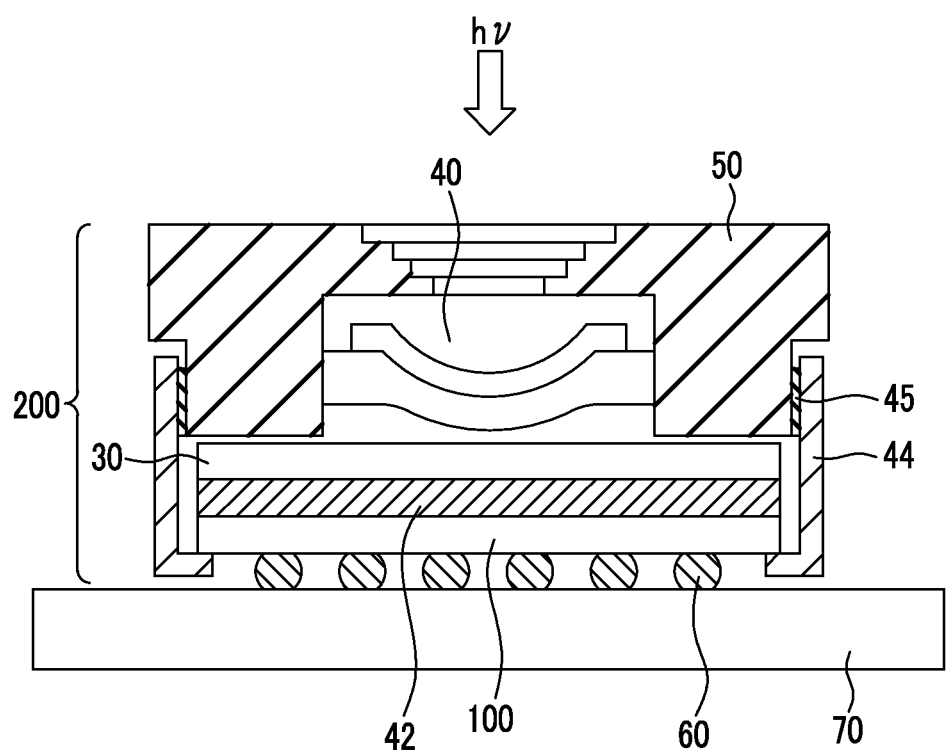
FIG. 1 is a schematic sectional view illustrating a configuration of a camera module including a solid-state imaging element according to an embodiment of the present invention.

Hereinafter, the contents of the present invention will be described in detail. In the present specification, "to" used to express numerical ranges will be used with a meaning that numerical values before and after the "to" are included in the numerical ranges as the lower limit value and the upper limit value.

In the present specification, "(meth)acrylates" represent acrylates and methacrylates, "(meth)acrylic" represents acrylic and methacrylic, and "(meth)acryloyl" represents acryloyl and methacryloyl. The monomers are classified into oligomers and polymers and refer to compounds having a weight-average molecular weight of 2,000 or less.

In the present specification, polymerizing compounds refer to compounds having a polymerizable functional group and may be monomers or polymers. Polymerizable functional groups refer to groups that participate in polymerization reactions.

Regarding the denotation of groups (atomic groups) in the present specification, groups with no denotation of 'substituted' and 'unsubstituted' include both groups (atomic groups) having no substituent and groups (atomic groups) having a substituent.

In the present specification, near-infrared rays refer to light rays having a maximum absorption wavelength range of 700 nm to 2500 nm.

In the present invention, a copper compound and a compound having a partial structure represented by Formula (1) are blended into a near-infrared-absorbing composition. The mechanism thereof is not clear, but it is assumed that, when the above-described composition of the present invention is produced, the structure of the copper compound is distorted and thus it becomes possible to improve light absorption capability in the near-infrared range while not absorbing light in the visible light range. Furthermore, it is possible to form a cured film having excellent moisture resistance while maintaining strong near-infrared shielding properties when a cured film is produced.

<First Embodiment of Near-Infrared-Absorbing Composition>

A near-infrared-absorbing composition of the present invention includes a copper compound and a compound having a partial structure represented by Formula (1) described below, in which the content of the copper compound is in a range of $3 \times 10^{-3}$ mol to 1 mol in relation to 1 g of the compound having the partial structure represented by Formula (1) described below.

Formula (1)

(in Formula (1), $R^1$ represents a hydrogen atom or an organic group.)

When the near-infrared-absorbing composition of the present invention includes a copper compound and a compound having the partial structure represented by Formula (1) and the content of the copper compound is in a range of $3 \times 10^{-3}$ mol to 1 mol in relation to 1 g of the compound having the partial structure represented by Formula (1), it is possible to provide a near-infrared-absorbing composition capable of forming a cured film having excellent moisture resistance while maintaining strong near-infrared shielding properties when a cured film is produced.

<<Copper Compound>>

Copper in the copper compound used in the present invention is preferably monovalent or divalent copper and more preferably divalent copper.

The content of copper in the copper compound used in the present invention is preferably in a range of 2% by mass to 40% by mass and more preferably in a range of 5% by mass to 40% by mass.

The copper compound used in the present invention is not particularly limited as long as the copper compound has the maximum absorption wavelength in a wavelength range of 700 nm to 1000 nm (near-infrared range).

The copper compound used in the present invention is preferably a copper complex.

In a case in which the copper compound used in the present invention is a copper complex, there is no particular limitation regarding a ligand L that coordinates copper as long as the ligand is capable of forming a coordination bond with a copper ion and examples thereof include a compound having phosphoric acid, a phosphoric ester, phosphonic acid, phosphonic ester, phosphinic acid, substituted phosphinic acid, sulfonic aid, carboxylic acid, a carbonyl (ester or ketone), an amine, an amide, sulfonamide, urethane, urea, an alcohol, a tiol, and the like. Among these, phosphoric acid, a phosphoric ester, phosphonic acid, a phosphonic ester, phosphinic acid, substituted phosphinic acid, and sulfonic acid are preferred and a phosphoric ester, a phosphonic ester, substituted phosphinic acid, or sulfonic acid are more preferred.

Specific examples of the copper compound used in the present invention include a phosphorous-containing copper compound, a sulfonic acid copper compound, and a copper compound represented by Formula (A) described below. Regarding the phosphorous-containing copper compound, specifically, for example, the compounds described in Row 27 on Page 5 to Row 20 on Page 7 of WO2005/030898 can be referenced and the content thereof is incorporated into the specification of the present application by reference.

The copper compound used in the present invention is preferably a copper compound represented by Formula (A) described below.

Formula (A)

In Formula (A), L represents a ligand that coordinates copper and X is not present or represents a halogen atom, $H_2O$, $NO_3$, $ClO_4$, $SO_4$, CN, SCN, $BF_4$, $PF_6$, $BPh_4$ (Ph represents a phenyl group), or an alcohol. Each of n1 and n2 independently represents an integer from 1 to 4.

The ligand L has a substituent including C, N, O, or S as an atom that can coordinate copper and more preferably has a group having a lone electron pair of N, O, S, or the like. The number of kinds of the group that can coordinate copper in the molecule may be one or more and the group may or may not be dissociated. In a case in which the group is not dissociated, X is not present.

A copper complex as the near-infrared absorbing substance is in a form of a copper complex (copper compound) in which the ligand coordinates copper which is the central metal. In the copper complex of the present invention, copper is divalent copper and the copper can be obtained by, for example, mixing and reacting a compound or a salt thereof, which serves as the ligand, with a copper component. Therefore, an "infrared absorbing composition including copper and a ligand" is expected to form a copper complex in a composition.

There is no particular limitation regarding the compound or the salt thereof which serves as the ligand and preferred examples thereof include organic acid compounds (for example, sulfonic acid compounds, carboxylic acid compounds, and phosphoric acid compounds) and salts thereof.

The compound or the salt thereof which serves as the ligand is preferably a compound including an acid group or a salt thereof and is preferably represented by General Formula (i) described below.

General Formula (i)

(In General Formula (i), $R^1$ represents an n-valent organic group, $X^1$ represents an acid group, and n represents an integer from 1 to 6.)

In General Formula (i), the n-valent organic group is preferably a hydrocarbon group and more preferably an aliphatic hydrocarbon group or an aromatic hydrocarbon group. The hydrocarbon group may have a sub stituent and examples of the sub stituent include a halogen atom (preferably a fluorine atom), a (meth)acryloyl group, and a group having an unsaturated double bond.

In the case of a monovalent hydrocarbon group, an alkyl group or an aryl group is preferred and an aryl group is more preferred. In the case of a divalent hydrocarbon group, an alkylene group, an arylene group, or an oxyalkylene group is preferred and an arylene group is more preferred. In the case of a trivalent hydrocarbon group, trivalent hydrocarbon groups that correspond to the above-described hydrocarbon groups are preferred.

The number of carbon atoms in the alkyl group and the alkylene group is preferably in a range of 1 to 20, more preferably in a range of 1 to 10, and still more preferably in a range of 1 to 5.

The number of carbon atoms in the aryl group and the arylene group is preferably in a range of 6 to 18, more preferably in a range of 6 to 12, and still more preferably 6.

In General Formula (i), $X^1$ is preferably at least one of a sulfonic acid group, a carboxylic acid group, and an acid group having a phosphorous atom. The number of $X^1$s may be one or more and is preferably two or more.

In General Formula (i), n is preferably in a range of 1 to 3, more preferably 2 or 3, and still more preferably 3.

The molecular weight of the compound or the salt thereof (the compound including an acid group or a salt thereof) which serves as the ligand is preferably 1000 or less, more preferably in a range of 70 to 1000, and still more preferably 130 to 500.

A preferred aspect of the compound including an acid group or a salt thereof is (1) a compound having at least one of a sulfonic acid group, a carboxylic acid group, and an acid group including a phosphorous atom, a more preferred aspect is (2) a compound having 2 or more acid groups, and a still more preferred aspect is (3) a compound having a sulfonic acid group and a carboxylic acid group. In the above-described aspects, an infrared absorbing function that is the capability of absorbing near-infrared rays is more effectively exhibited. Furthermore, when a compound having a sulfonic acid group and a carboxylic acid group is used, it is possible to further improve color valency.

(1) Specific examples of the compound having at least one of a sulfonic acid group, a carboxylic acid group, and an acid group including a phosphorous atom are as described below. In addition, specific examples of the compound having a sulfonic acid group also include the specific examples of sulfonic acid compounds described below. In addition, among compounds described in the aspects (2) and (3) described below, compounds that correspond to the present aspect can also be preferred examples.

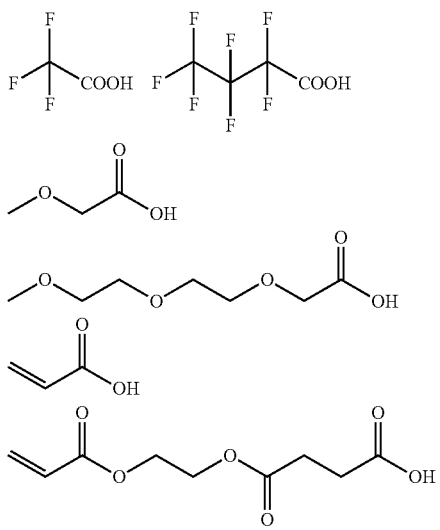

(2) Specific examples of the compound having at least two acid groups are as described below. In addition, among compounds described in the aspect (3) described below, compounds that correspond to the present aspect can also be preferred examples.

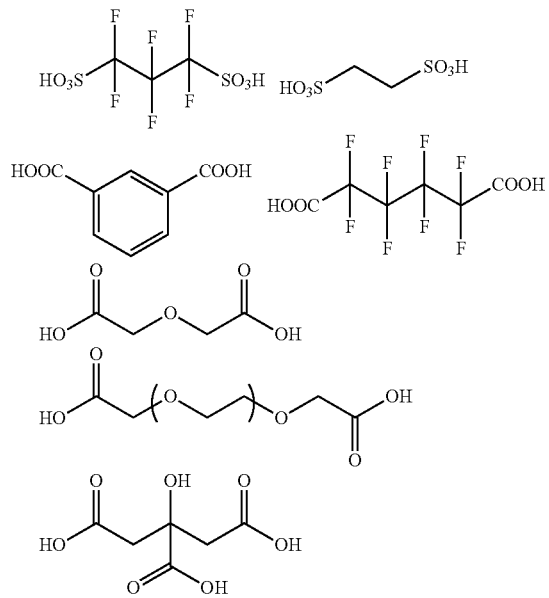

(3) Specific examples of the compound having a sulfonic acid group and a carboxylic acid group are as described below. In addition, specific examples of the compound having a sulfonic acid group and a carboxylic acid group represented by Formula (1) described below can also be the specific examples.

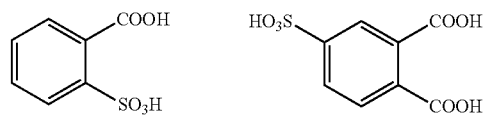 [SMILES: O=C(O)c1ccccc1S(=O)(=O)O ; O=C(O)c1ccc(S(=O)(=O)O)cc1C(=O)O]

Hereinafter, the copper compound used in the present invention and the compound forming the ligand L will be described in detail.

<<Phosphorous-Containing Copper Complex>>

A phosphorous-containing copper complex is not particularly limited as long as the complex has a ligand that contains a phosphorous compound as the ligand of the complex, but is preferably a phosphoric acid copper complex, a phosphoric ester copper complex, a phosphonic acid copper complex, a phosphonic ester copper complex, a phosphinic acid copper complex, or a substituted phosphinic acid copper complex and more preferably a phosphoric ester copper complex, a phosphonic ester copper complex, or a substituted phosphinic acid copper complex.

<<<Phosphoric Ester Copper Complex>>>

The phosphoric ester copper complex has copper as the central metal and a phosphoric ester compound as the ligand.

The phosphoric ester compound that forms the ligand L is more preferably a compound represented by Formula (B) described below.

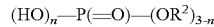  Formula (B)

In Formula (B), $R^2$ represents an organic group and n represents 1 or 2.

(In the formula, $R^2$ represents an alkyl group having 1 to 18 carbon atoms, an aryl group having 6 to 18 carbon atoms, an aralkyl group having 1 to 18 carbon atoms, or an alkenyl group having 1 to 18 carbon atoms, —$OR^2$ represents a polyoxyalkyl group having 4 to 100 carbon atoms, a (meth)

acryloyloxy alkyl group having 4 to 100 carbon atoms, or a (meth)acryloyl polyoxyalkyl group having 4 to 100 carbon atoms, and n represents 1 or 2.)

When n is 1, $R^2$s may be identical to or different from each other.

Examples of the phosphoric ester compound used in the present invention include a phosphoric monoester (n=2 in Formula (B)) and a phosphoric diester (n=1 in Formula (B)) and, from the viewpoint of near-infrared shielding properties and solubility, a phosphoric diester is preferred and a compound represented by Formula (C) is preferred.

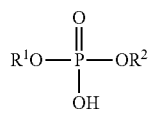

Formula (C)

(In Formula (C), each of $R^1$ and $R^2$ independently represents a monovalent organic group or a divalent organic group and may form a ring structure.)

The compound represented by Formula (C) and a salt thereof act as a ligand that coordinates copper. Here, the ligand refers to an atom, an ion, an atomic group, a group, a neutral molecule, or the like which is sterically disposed around a copper atom in the copper complex and is bonded to the copper atom.

Each of $R^1$ and $R^2$ in Formula (C) independently represents a monovalent organic group. The monovalent organic group is preferably an organic group having 3 or more carbon atoms, more preferably an organic group having 5 or more carbon atoms, and still more preferably an organic group having 5 to 20 carbon atoms.

In addition, in Formula (C), $R^1$ and $R^2$ may be bonded together and thus form a ring structure. In this case, both $R^1$ and $R^2$ are divalent organic groups. The total number of carbon atoms in a group (divalent organic group) having a bonded ring structure is 3 or more, preferably 5 or more, and still more preferably in a range of 5 to 20.

There is no particular limitation regarding specific monovalent organic groups and examples thereof include linear, branched or cyclic alkyl groups, aryl groups, and heteroaryl groups. Here, the above-described groups may be formed through a divalent linking group (for example, a linear, branched, or cyclic alkylene group, arylene group, heteroarylene group, —O—, —S—, —CO—, —COO—, —OCO—, —SO$_2$—, —NR— (R represents a hydrogen atom or an alkyl group), or the like). In addition, the monovalent organic group may have a substituent.

The linear or branched alkyl group is preferably an alkyl group having 3 to 20 carbon atoms, more preferably an alkyl group having 3 to 10 carbon atoms, and still more preferably an alkyl group having 3 to 8 carbon atoms.

The cyclic alkyl group may be a single ring or may be polycyclic. The cyclic alkyl group is preferably a cycloalkyl group having 3 to 20 carbon atoms, more preferably a cycloalkyl group having 4 to 10 carbon atoms, and still more preferably a cycloalkyl group having 6 to 10 carbon atoms.

The aryl group is preferably an aryl group having 6 to 18 carbon atoms, more preferably an aryl group having 6 to 14 carbon atoms, and still more preferably an aryl group having 6 to 10 carbon atoms.

The heteroaryl group is preferably a 5-membered ring or a 6-membered ring. In addition, the heteroaryl group may be a single ring or a condensed ring, is preferably a single ring or a condensed ring having 2 to 8 condensations, and more preferably a single ring or a condensed ring having 2 to 4 condensations.

Specifically, a single ring containing at least one of nitrogen, oxygen, and sulfur atoms or a heteroaryl group derived from a polycyclic aromatic ring is used. Examples of a heteroaryl ring in the heteroaryl group include an oxazol ring, a thiophene ring, a thianthrene ring, a furan ring, a pyran ring, an isobenzofuran ring, a chromene ring, a xanthene ring, a phenoxazine ring, a pyrrol ring, a pyrazole ring, an isothiazole ring, an isoxazole ring, a pyrazine ring, a pyrimidine ring, a pyridazine ring, an indolizine ring, an isoindolizine ring, an indole ring, an indazole ring, a purine ring, a quinolizine ring, an isoquinolizine ring, a naphthyridine ring, a quinazoline ring, a sinoline ring, a pteridine ring, a carbazole ring, a carboline ring, a phenanthrene ring, an acridine ring, a perimidine ring, a phenanthroline ring, a phthalazine ring, a phenalxazine ring, a furazan ring, and the like.

Examples of the linear, branched, or cyclic alkylene group, arylene group, or heteroarylene group, which is a divalent linking group, include divalent linking groups derived by removing a hydrogen atom from the above-described linear, branched, or cyclic alkyl group, aryl group, or heteroaryl group.

Examples of the substituent that the monovalent organic group may have include an alkyl group, a polymerizable group (for example, a vinyl group, a (meth)acryloyl group, an epoxy group, an oxetane group, or the like), a halogen atom, a carboxyl group, a carboxylic ester group (for example, —CO$_2$CH$_3$ or the like), a hydroxyl group, an amide group, a halogenated alkyl group (for example, a fluoroalkyl group or a chloroalkyl group), and the like.

In addition, the phosphoric diester copper complex of the present invention has a structure represented by Formula (D) described below.

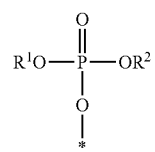

Formula (D)

(In Formula (D), each of $R^1$ and $R^2$ independently represents a monovalent organic group or a divalent organic group and may form a ring structure. "*" indicates a portion at which a coordination bond with copper is formed.)

In Formula (D), $R^1$ and $R^2$ have the same meaning and preferred range as $R^1$ and $R^2$ in Formula (C).

The molecular weight of the phosphoric ester compound represented by Formula (C) is preferably in a range of 200 to 1000, more preferably in a range of 250 to 750, and still more preferably in a range of 300 to 500.

Specific examples of the phosphoric ester compound are as illustrated below.

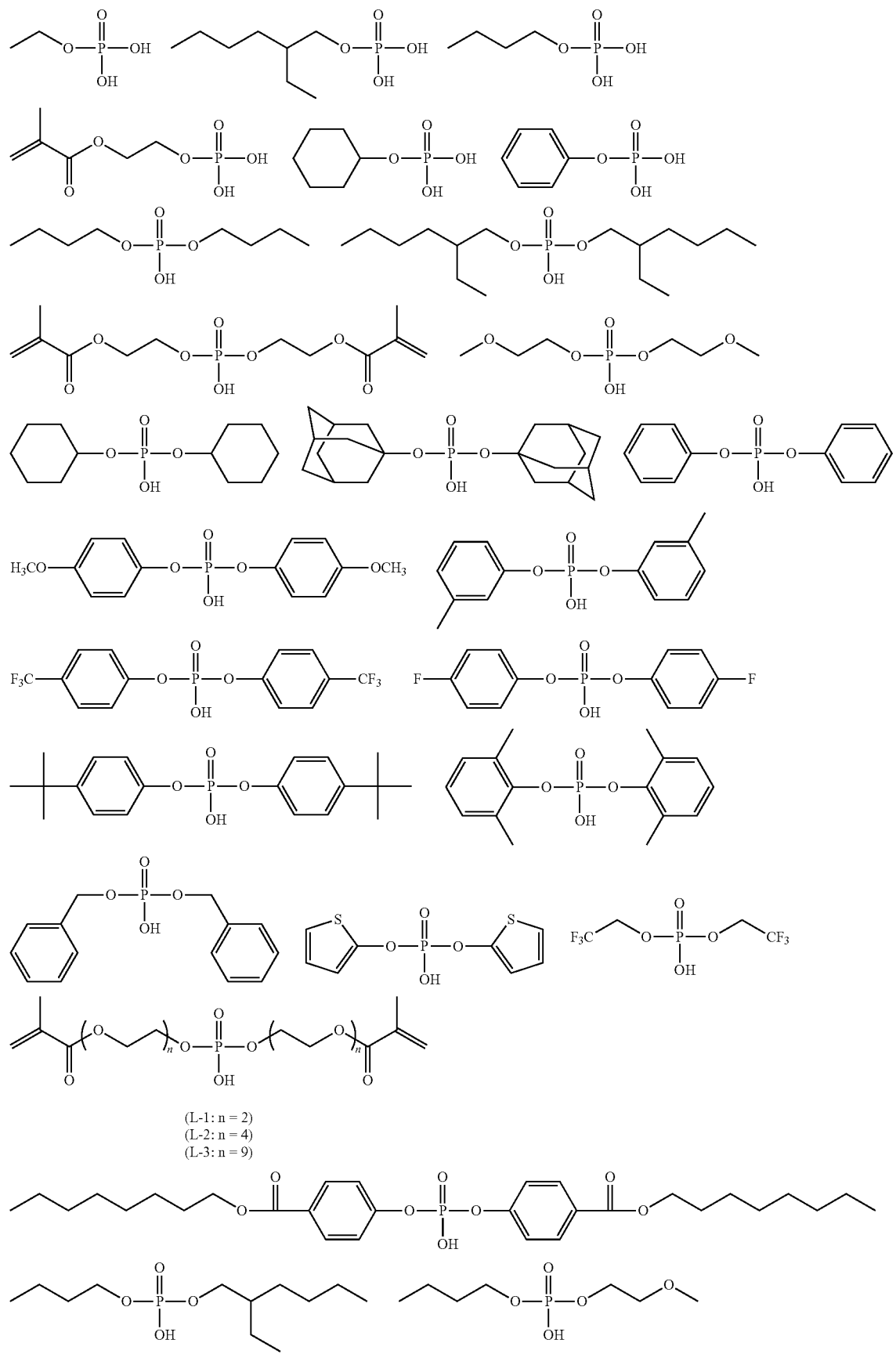

-continued

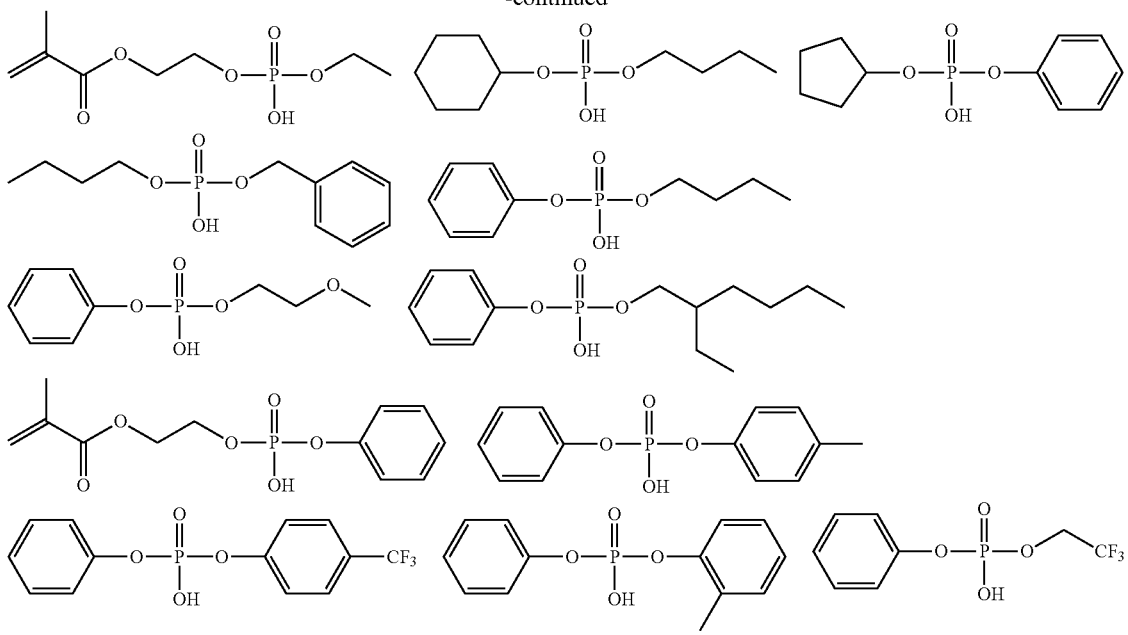

<<<Phosphonic Ester Copper Complex>>>

The phosphonic ester copper complex used in the present invention may have copper as the central metal and a phosphonic ester compound as the ligand.

The phosphonic ester compound forming the ligand L is more preferably a compound represented by Formula (E) described below.

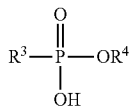

Formula (E)

(In Formula (E), each of $R^3$ and $R^4$ independently represents a monovalent organic group.)

The compound represented by Formula (E) and a salt thereof act as the ligand that coordinates copper.

In Formula (E), each of $R^3$ and $R^4$ independently represents a monovalent organic group. There is no particular limitation regarding specific monovalent organic groups and examples thereof include linear, branched, or cyclic alkyl groups, alkenyl groups, aryl groups, and heteroaryl groups. Here, the above-described groups may be formed through a divalent linking group (for example, an alkylene group, a cycloalkylene group, an arylene group, a heteroarylene group, —O—, —S—, —CO—, —COO—, —OCO—, —SO$_2$—, —NR— (R represents a hydrogen atom or an alkyl group), or the like) in the middle. In addition, the monovalent organic group may have a substituent.

The linear or branched alkyl group is preferably an alkyl group having 1 to 20 carbon atoms, more preferably an alkyl group having 1 to 10 carbon atoms, and still more preferably an alkyl group having 1 to 8 carbon atoms.

The cyclic alkyl group, aryl group, and heteroaryl group have the same meaning and preferred range as the cyclic alkyl group, aryl group, and heteroaryl group in Formula (C).

The alkenyl group is preferably an alkenyl group having 2 to 10 carbon atoms, more preferably an alkenyl group having 2 to 8 carbon atoms, and still more preferably an alkenyl group having 2 to 4 carbon atoms. Specific examples thereof include a vinyl group, a 1-propenyl group, a 1-butenyl group, and the like.

Examples of the linear, branched, or cyclic alkylene group, arylene group, or heteroarylene group, which is a divalent linking group, include divalent linking groups described in Formula (C).

Examples of the substituent that the monovalent organic group may have include substituents described in Formula (C).

In addition, the phosphoric ester copper complex used in the present invention has a structure represented by Formula (F).

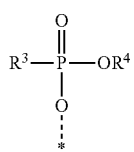

Formula (F)

(In Formula (F), each of $R^3$ and $R^4$ independently represents a monovalent organic group. "*" indicates a portion at which a coordination bond with copper is formed.)

In Formula (F), $R^3$ and $R^4$ have the same meaning and preferred range as $R^3$ and $R^4$ in Formula (E).

The molecular weight of the phosphonic ester compound represented by Formula (E) is preferably in a range of 200 to 1000, more preferably in a range of 250 to 750, and still more preferably in a range of 300 to 500.

Specific examples of the phosphonic ester compound are as illustrated below.

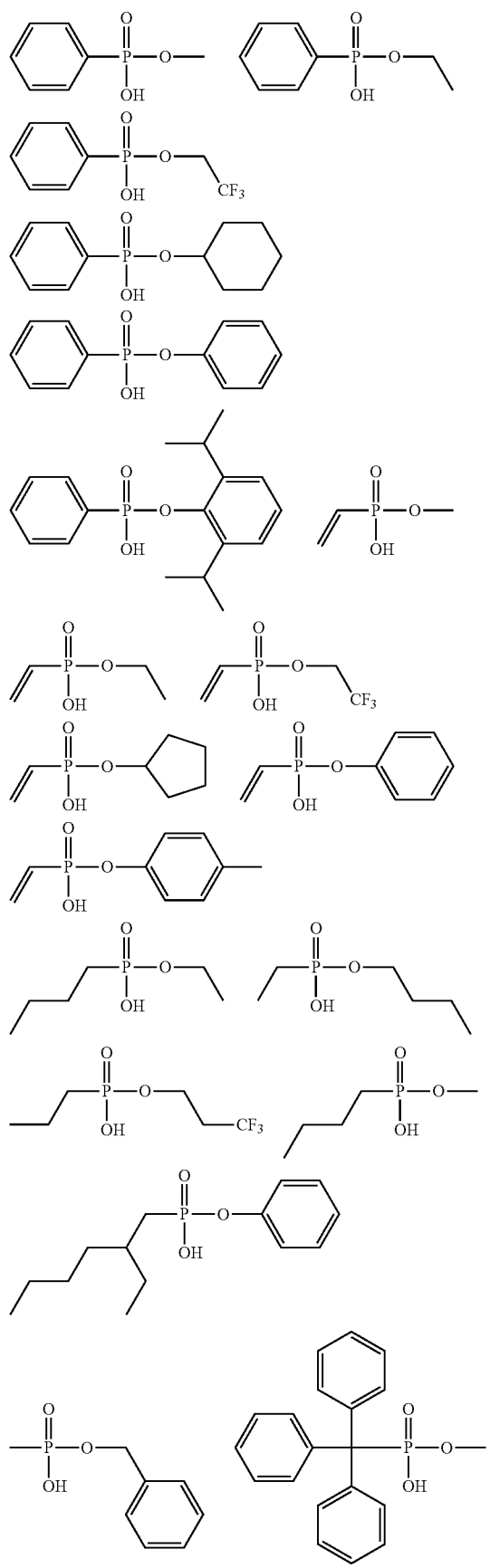

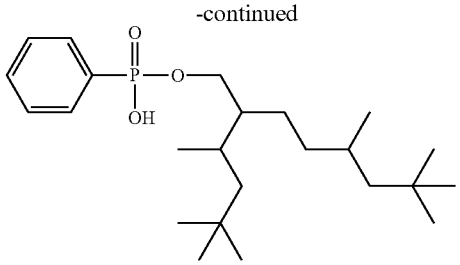

-continued

<<<Substituted Phosphinic Acid Copper Complex>>>

The substituted phosphinic acid copper complex used in the present invention has copper as the central metal and a substituted phosphinic acid compound as the ligand. The substituted phosphinic acid compound forming the ligand L is more preferably a compound represented by Formula (G) described below.

Formula (G)

(In Formula (G), each of $R^5$ and $R^6$ independently represents a monovalent organic group.)

The compound represented by Formula (G) and a salt thereof act as the ligand that coordinates copper.

In Formula (G), each of $R^5$ and $R^6$ independently represents a monovalent organic group. There is no particular limitation regarding specific monovalent organic groups and examples thereof include linear, branched, or cyclic alkyl groups, aryl groups, and heteroaryl groups. Here, the above-described groups may be formed through a divalent linking group (for example, an alkylene group, a cycloalkylene group, an arylene group, a heteroarylene group, —O—, —S—, —CO—, —COO—, —OCO—, —SO$_2$—, —NR— (R represents a hydrogen atom or an alkyl group), or the like) in the middle. In addition, the monovalent organic group may have a substituent.

The linear or branched alkyl group is preferably an alkyl group having 1 to 20 carbon atoms, more preferably an alkyl group having 1 to 10 carbon atoms, and still more preferably an alkyl group having 1 to 8 carbon atoms. Specific examples thereof include a methyl group, an n-butyl group, 2-ethylhexyl group, and the like.

The cyclic alkyl group, aryl group, and heteroaryl group have the same meaning and preferred range as the cyclic alkyl group, aryl group, and heteroaryl group in Formula (C).

Examples of the linear, branched, or cyclic alkylene group, arylene group, or heteroarylene group, which is a divalent linking group, include divalent linking groups described in Formula (C).

Examples of the substituent that the monovalent organic group may have include substituents described in Formula (C).

In addition, the substituted phosphinic acid copper complex used in the present invention has a structure represented by Formula (H).

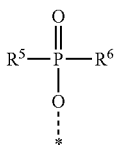

Formula (H)

(In Formula (H), each of $R^5$ and $R^6$ independently represents a monovalent organic group. "*" indicates a portion at which a coordination bond with copper is formed.)

In Formula (H), $R^5$ and $R^6$ have the same meaning and preferred range as $R^5$ and $R^6$ in Formula (G).

The molecular weight of the substituted phosphinic acid compound represented by Formula (G) is preferably in a range of 50 to 750, more preferably in a range of 50 to 500, and still more preferably in a range of 80 to 300.

Specific examples of the substituted phosphinic acid compound are as illustrated below.

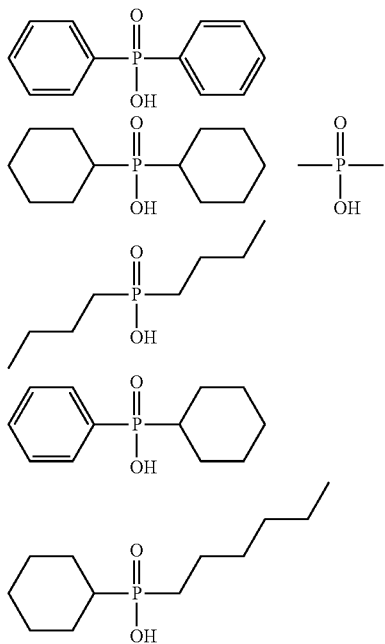

The phosphorous-containing copper complex used in the present invention can be obtained by reacting a copper component and the phosphorous-containing compound (for example, a phosphoric ester, a phosphonic ester, a substituted phosphinic acid, or the like) which serves as a ligand or a salt thereof.

As the above-described copper component, it is possible to use copper or a copper-containing compound. As the copper-containing compound, it is possible to use, for example, copper oxide or a copper salt. The copper salt is preferably monovalent or divalent copper and more preferably divalent copper. The copper salt is more preferably copper acetate, copper chloride, copper formate, copper stearate, copper benzoate, copper ethyl acetoacetate, copper pyrophosphate, copper naphthenate, copper citrate, cupric nitrate, copper sulfate, copper carbonate, copper chlorate, copper (meth)acrylate, or copper perchlorate and still more preferably copper acetate, copper chloride, copper sulfate, copper benzoate, or copper (meth)acrylate.

The phosphorous-containing compound used in the present invention can be synthesized with reference to, for example, a well-known method.

For example, the phosphoric ester compound can be obtained by reacting 2-hydroxyethyl methacrylate, phenyl phosphate ester, and 1,3,5-triisopropyl sulfonate chloride in a pyridine solvent.

The salt of the phosphorous-containing compound used in the present invention is preferably, for example, a metallic salt and specific examples thereof include a sodium salt, a potassium salt, a magnesium salt, a calcium salt, a borate salt, and the like.

When the copper component and the above-described phosphorous-containing compound or a salt thereof are reacted together, the reaction ratio is preferably in a range of 1:1.5 to 1:4 in terms of molar ratio.

In addition, when the copper component and the above-described phosphorous-containing compound or a salt thereof are reacted together, the reaction conditions are preferably set to, for example, 20° C. to 50° C. for 0.5 hours or longer.

The phosphorous-containing copper complex of the present invention has the maximum absorption wavelength ($\lambda_{max}$) in a near-infrared wavelength range of 700 nm to 2500 nm, preferably has the maximum absorption wavelength in a range of 700 nm to 2500 nm, more preferably has the maximum absorption wavelength in a range of 720 nm to 890 nm, and still more preferably has the maximum absorption wavelength in a range of 730 nm to 880 nm. The maximum absorption wavelength can be measured using, for example, a Cary 5000 UV-Vis-NIR (spectrophotometer, manufactured by Agilent Technologies Japan, Ltd.).

In addition, the phosphorous-containing copper complex of the present invention preferably has a gram absorbance of 0.04 or more (g/mL), more preferably has a gram absorbance of 0.06 or more (g/mL), and still more preferably has a gram absorbance of 0.08 or more (g/mL).

The gram absorbance can be computed using, for example, a Cary 5000 UV-Vis-NIR (spectrophotometer, manufactured by Agilent Technologies Japan, Ltd.) instrument.

<<Sulfonic Acid Copper Complex>>

The sulfonic acid copper complex used in the present invention has copper as the central metal and a sulfonic acid compound as the ligand.

The sulfonic acid compound as the ligand is more preferably a compound represented by Formula (I) described below.

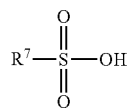

Formula (I)

(In Formula (I), $R^7$ represents a monovalent organic group.)

The compound represented by Formula (I) and a salt thereof act as the ligand that coordinates copper.

There is no particular limitation regarding specific monovalent organic groups and examples thereof include linear, branched or cyclic alkyl groups, alkenyl groups, and aryl groups. Here, these groups may be formed through a divalent linking group (for example, an alkylene group, a cycloalkylene group, an arylene group, —O—, —S—, —CO—, —COO—, —OCO—, —SO$_2$—, —NR— (R represents a hydrogen atom or an alkyl group), or the like). In addition, the monovalent organic group may have a substituent.

The linear or branched alkyl group is preferably an alkyl group having 1 to 20 carbon atoms, more preferably an alkyl group having 1 to 12 carbon atoms, and still more preferably an alkyl group having 1 to 8 carbon atoms.

The cyclic alkyl group may be a single ring or may be polycyclic. The cyclic alkyl group is preferably a cycloalkyl group having 3 to 20 carbon atoms, more preferably a cycloalkyl group having 4 to 10 carbon atoms, and still more preferably a cycloalkyl group having 6 to 10 carbon atoms. The alkenyl group is preferably an alkenyl group having 2 to 10 carbon atoms, more preferably an alkenyl group having 2 to 8 carbon atoms, and still more preferably an alkenyl group having 2 to 4 carbon atoms.

The aryl group is preferably an aryl group having 6 to 18 carbon atoms, more preferably an aryl group having 6 to 14 carbon atoms, and still more preferably an aryl group having 6 to 10 carbon atoms.

Examples of the alkylene group, cycloalkylene group, or arylene group, which is a divalent linking group, include divalent linking groups derived by removing a hydrogen atom from the above-described alkyl group, cycloalkylene group, or aryl group.

Examples of the substituent that the monovalent organic group may have include an alkyl group, a polymerizable group (for example, a vinyl group, a (meth)acryloyl group, an epoxy group, an oxetane group, or the like), a halogen atom, a carboxyl group, a carboxylic ester group (for example, —CO$_2$CH$_3$ or the like), a hydroxyl group, an amide group, a halogenated alkyl group (for example, a fluoroalkyl group or a chloroalkyl group), and the like.

In addition, the sulfonic acid copper complex of the present invention includes a structure represented by Formula (J) described below.

Formula (J)

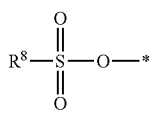

(In Formula (J), R$^8$ represents a monovalent organic group. "*" indicates a portion at which a coordination bond with copper is formed.)

In Formula (J), R$^8$ has the same meaning and preferred range as R$^7$ in Formula (I).

The molecular weight of the sulfonic acid copper complex represented by Formula (I) is preferably in a range of 80 to 750, more preferably in a range of 80 to 600, and still more preferably in a range of 80 to 450.

Specific examples of the sulfonic acid copper complex represented by Formula (I) will be illustrated below, but the present invention is not limited thereto.

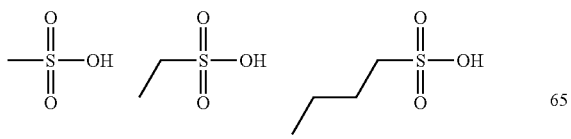

-continued

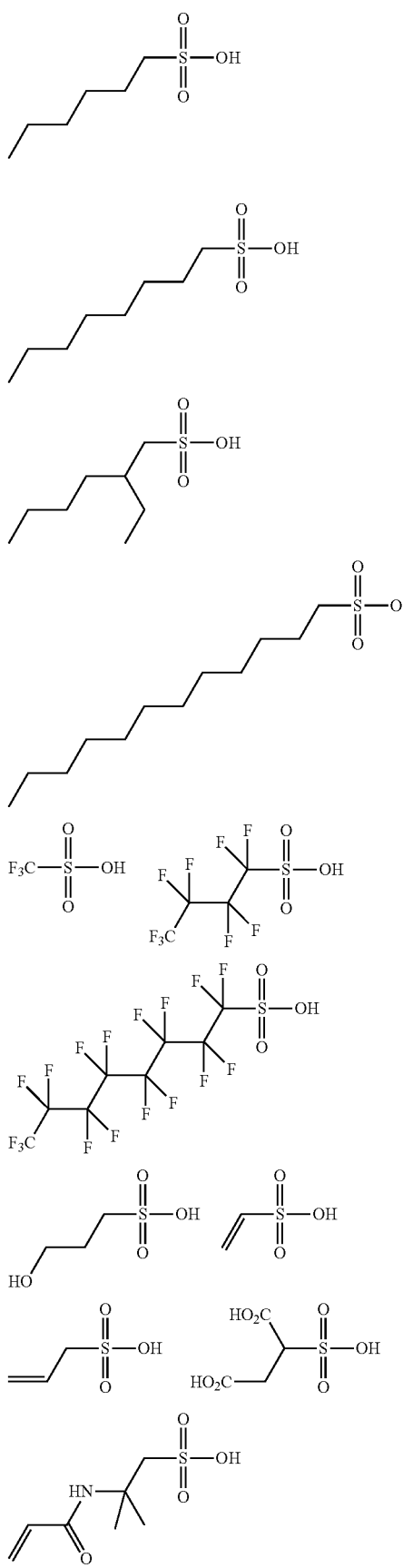

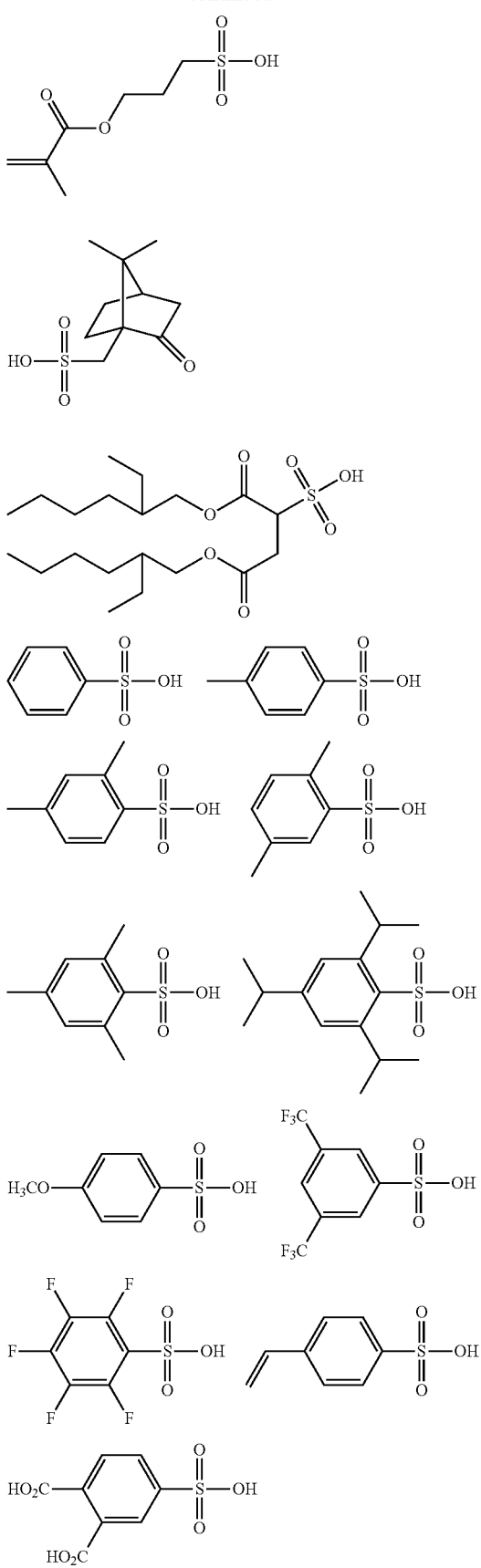

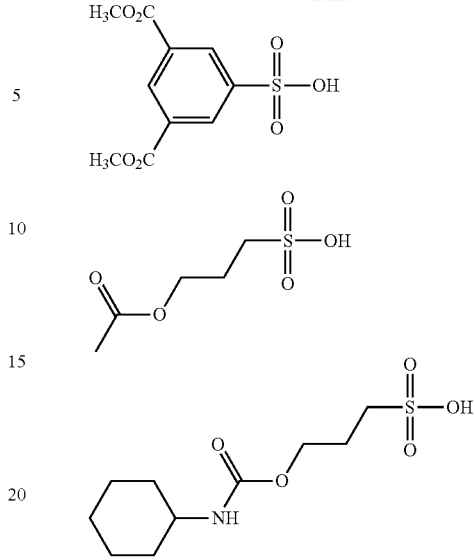

The sulfonic acid copper complex used in the present invention can be obtained by reacting a copper component and the sulfonic acid compound which serves as a ligand or a salt thereof.

The above-described copper component has the same meaning and preferred range as the copper component for the above-described phosphorous-containing copper complex.

As the sulfonic acid compound used in the present invention, it is also possible to use a commercially available sulfonic acid and the sulfonic acid compound can also be synthesized with reference to a well-known method.

The salt of the sulfonic acid compound used in the present invention is preferably, for example, a metallic salt and specific examples thereof include a sodium salt, a potassium salt, and the like.

When the copper component and the above-described sulfonic acid compound or a salt thereof are reacted together, the reaction ratio is preferably in a range of 1:1.5 to 1:4 in terms of molar ratio. At this time, the number of kinds of the sulfonic acid compound or the salt thereof being used may be one or more.

In addition, when the copper component and the above-described sulfonic acid compound or a salt thereof are reacted together, the reaction conditions are preferably set to, for example, 20° C. to 50° C. for 0.5 hours or longer.

The maximum absorption wavelength and gram absorbance of the sulfonic acid copper complex of the present invention are identical to those for the above-described phosphorous-containing copper complex and the preferred range is also identical.

<<Other Copper Compounds>>

As the copper compound used in the present invention, in addition to the above-described compounds, a copper compound having a carboxylic acid ester as the ligand may be used. Meanwhile, it is needless to say that the present invention is not limited thereto. For example, a compound represented by Formula (K) described below is preferred.

Formula (K)

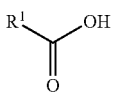

(In Formula (K), $R^1$ represents a monovalent organic group.)

In Formula (K), $R^1$ represents a monovalent organic group. The monovalent organic group is not particularly limited and is identical to, for example, the monovalent organic group in Formula (C) described above.

The content of the copper compound used in the present invention is $3 \times 10^{-3}$ mol to 1 mol, preferably in a range of $3 \times 10^{-3}$ mol to 0.2 mol, and more preferably in a range of $3 \times 10^{-3}$ mol to 0.05 mol in relation to 1 g of the compound having a partial structure represented by Formula (1). When the content of the copper compound is set to 1 mol or less in relation to 1 g of the compound having the partial structure represented by Formula (1), the formation of a crosslinked structure originating from the copper compound can be suppressed when the near-infrared-absorbing composition of the present invention is cured. Therefore, even in a case in which a certain amount or more of the copper compound is added to the near-infrared-absorbing composition of the present invention, it is possible to form a thin film. For example, it is possible to form a thin film of 200 µm or less as the near-infrared cut-off filter for which the near-infrared-absorbing composition of the present invention is used.

The near-infrared-absorbing composition of the present invention preferably includes the above-described copper complex. When the above-described copper complex is used, the composition of the present invention is capable of providing a near-infrared-absorbing composition including a copper complex having excellent solubility in a solvent and being capable of maintaining strong near-infrared shielding properties when a cured film is produced.

The copper in the copper complex of the present invention is generally divalent copper and can be obtained by, for example, mixing and reacting the above-described compound or a salt thereof, which serves as the ligand, and the copper component (copper or a copper-containing compound). Here, when the structure of a compound which serves as the copper component and the ligand can be detected from the composition of the present invention, it is possible to say that the copper complex is formed in the composition of the present invention. For example, as a method for detecting copper and the phosphoric ester compound from the composition of the present invention, ICP emission spectrometry can be used and copper and the phosphoric ester compound can be detected using this method.

Regarding the amount of the copper complex blended in the composition of the present invention, the composition of the present invention preferably includes the copper complex at a ratio in a range of 5% by mass to 60% by mass and more preferably includes the copper complex at a ratio in a range of 10% by mass to 40% by mass.

The amount of the copper complex blended in the solid content of the composition of the present invention is preferably in a range of 30% by mass to 90% by mass, more preferably in a range of 35% by mass to 85% by mass, and still more preferably in a range of 40% by mass to 80% by mass.

(Inorganic Fine Particles)

The composition of the present invention may include inorganic fine particles as a near-infrared absorbing compound other than the above-described copper compound. Only one kind of inorganic fine particles may be used or two or more kinds of inorganic fine particles may be used.

The inorganic fine particles refer to particles that play a role of shielding (absorbing) infrared rays. The inorganic fine particles are preferably at least one selected from the group consisting of metal oxide particles and metal particles in terms of more favorable infrared shielding properties.

Examples of the inorganic fine particles include metal oxide particles such as indium tin oxide (ITO) particles, antimony tin oxide (ATO) particles, particles of zinc oxide which may be doped with aluminum (ZnO which may be doped with aluminum), fluorine-doped tin dioxide (F-doped $SnO_2$) particles, and niobium-doped titanium dioxide (Nb-doped $TiO_2$) particles and metal particles such as silver (Ag) particles, gold (Au) particles, copper (Cu) particles, and nickel (Ni) particles. Meanwhile, in order to satisfy both infrared shielding properties and photolithography performance, inorganic fine particles having a high transmissivity at an exposure wavelength (365 nm to 405 nm) and indium tin oxide (ITO) particles or antimony tin oxide (ATO) particles are preferred.

The shapes of the inorganic fine particles are not particularly limited, may be any of non-spherical and spherical, and may be sheet shapes, wire shapes, or tube shapes.

In addition, as the inorganic fine particles, a tungsten oxide-based compound can be used and, specifically, the inorganic fine particles are more preferably a tungsten oxide-based compound represented by General Formula (Composition Formula) (I) described below.

$$M_xW_yO_z \qquad (I)$$

M represents metal, W represents tungsten, and O represents oxygen.

$$0.001 \leq x/y \leq 1.1$$

$$2.2 \leq z/y \leq 3.0$$

Examples of the metal M include alkali metals, alkali earth metals, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os, and Bi. The metal M is preferably an alkali metal, more preferably Rb or Cs, and still more preferably Cs. The number of the metals M may be one or more.

When x/y is 0.001 or more, it is possible to sufficiently shield infrared rays and, when x/y is 1.1 or less, it is possible to more reliably avoid the generation of impurity phases in the tungsten oxide-based compound.

When z/y is 2.2 or more, it is possible to further improve chemical stability as a material and, when z/y is 3.0 or less, it is possible to sufficiently shield infrared rays.

The metal oxide is preferably cesium tungsten oxide.

Specific examples of the tungsten oxide-based compound represented by Formula (I) include $Cs_{0.33}WO_3$, $Rb_{0.33}WO_3$, $K_{0.33}WO_3$, $Ba_{0.33}WO_3$, and the like, $Cs_{0.33}WO_3$ or $Rb_{0.33}WO_3$ is preferred, and $Cs_{0.33}WO_3$ is more preferred.

The metal oxide preferably has a fine particle form. The average particle diameter of the fine particles of the metal oxide is preferably 800 nm or less, more preferably 400 nm or less, and still more preferably 200 nm or less. When the average particle diameter is in the above-described range, the metal oxide is not capable of easily shielding visible light through light scattering and thus it is possible to more reliably transmit light in the visible light range. From the viewpoint of avoiding light scattering, the average particle diameter is preferably small; however, in consideration of ease of handling during the manufacturing of the metal oxide, the average particle diameter of the metal oxide is generally 1 nm or more.

The tungsten oxide-based compound can be produced in a form of, for example, a dispersion of tungsten fine particles such as YMF-02 manufactured by Sumitomo Metal mining Co., Ltd.

The content of the metal oxide is preferably in a range of 0.01% by mass to 30% by mass, more preferably in a range of 0.1% by mass to 20% by mass, and still more preferably in a range of 1% by mass to 10% by mass in relation to the total solid content mass of the composition including the metal oxide.

<Compound Having Partial Structure Represented by Formula (1)>

The near-infrared-absorbing composition of the present invention includes a compound having the partial structure represented by Formula (1), that is, —C(=O)NR$^1$— (R$^1$ represents a hydrogen atom or an organic group). The blending of the compound having the above-described partial structure in the near-infrared-absorbing composition improves the near-infrared shielding properties when a cured film is produced using the near-infrared-absorbing composition of the present invention and thus humidity resistance can be improved.

In Formula (1), R$^1$ represents a hydrogen atom or an organic group. Examples of the organic group include hydrocarbon groups and specifically include alkyl groups and aryl groups. An alkyl group having 1 to 20 carbon atoms, an aryl group having 6 to 20 carbon atoms, or a group obtained by combining the above-described group and a divalent linking group is preferred.

Specific examples of the preferred organic group described above include —OR', —SR', and combinations of the above-described group and at least one of —(CH$_2$)$_m$— (m is an integer from 1 to 10), a cyclic alkylene group having 5 to 10 carbon atoms, —O—, —CO—, —COO—, and —NH—. Here, R' is preferably a hydrogen atom, a linear alkyl group having 1 to 10 carbon atoms, a branched alkyl group having 3 to 10 carbon atoms, a cyclic alkyl group having 3 to 10 carbon atoms (preferably a linear alkyl group having 1 to 7 carbon atoms, a branched alkyl group having 3 to 7 carbon atoms, a cyclic alkyl group having 3 to 7 carbon atoms), an aryl group having 6 to 10 carbon atoms (preferably a phenyl group), or a combination of an aryl group having 6 to 10 carbon atoms and an alkylene group having 1 to 10 carbon atoms.

In addition, in Formula (1), R$^1$ and C may be bonded together and thus form a ring structure (heterocyclic structure). A hetero atom in the heterocyclic structure is a nitrogen atom in Formula (1). The heterocyclic structure is preferably a 5- or 6-membered ring structure and more preferably a 5-membered ring structure. The heterocyclic structure may be a condensed ring, but is preferably a single ring.

Specific examples of particularly preferred R' include a hydrogen atom, an alkyl group having 1 to 3 carbon atoms, groups obtained by combining —OR' (R' is a liner alkyl group having 1 to 5 carbon atoms) and —(CH$_2$)$_m$— (m is an integer from 1 to 10 and preferably an integer from 1 to 5), and groups in which R$^1$ and C in Formula (1) are bonded together and thus form a heterocyclic structure (preferably a 5-membered ring structure).

The compound having the partial structure represented by Formula (1) is preferably represented by (the main chain structure of the polymer-the partial structure (1)-R$^1$) or (A-the partial structure (1)-B). Here, A is a linear alkyl group having 1 to 10 carbon atoms, a branched alkyl group having 3 to 10 carbon atoms, or a cyclic alkyl group having 3 to 10 carbon atoms. In addition, B is a group obtained by combining —(CH$_2$)$_m$— (m is an integer from 1 to 10 and preferably an integer from 1 to 5), the partial structure (1), and a polymerizable group.

In addition, the compound having the partial structure represented by Formula (1) preferably has a structure represented by any one of Formulae (1-1) to (1-5) described below.

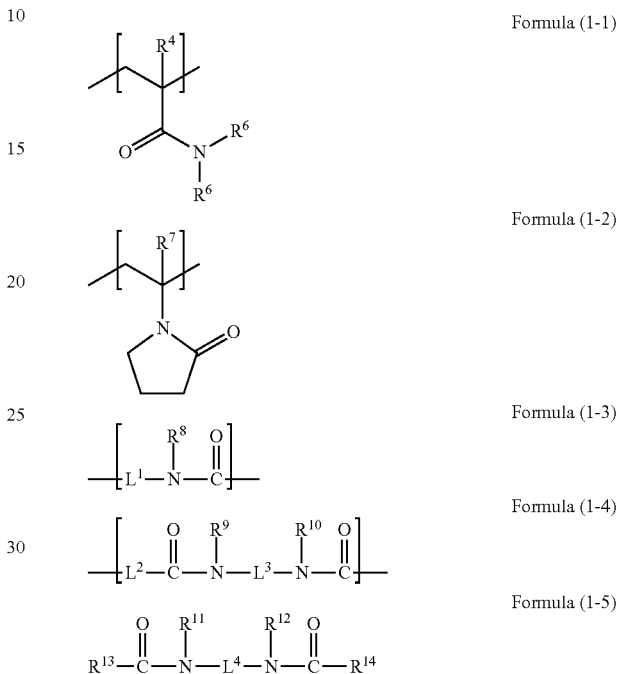

(In Formula (1-1), R$^4$ represents a hydrogen atom or a methyl group and each of R$^5$ and R$^6$ independently represents a hydrogen atom or an organic group. In Formula (1-2), R$^7$ represents a hydrogen atom or a methyl group. In Formula (1-3), L$^1$ represents a divalent linking group and R$^8$ represents a hydrogen atom or an organic group. In Formula (1-4), each of L$^2$ and L$^3$ independently represents a divalent linking group and each of R$^9$ and R$^{10}$ independently represents a hydrogen atom or an organic group. In Formula (1-5), L$^4$ represents a divalent linking group and each of R$^{11}$ to R$^{14}$ independently represents a hydrogen atom or an organic group.)

In Formula (1-1), each of R$^5$ and R$^6$ independently represents a hydrogen atom or an organic group. The organic group is identical to R$^1$ in Formula (1) and the preferred range thereof is also identical.

In Formulae (1-3) to (1-5), L$^1$ to L$^4$ represent divalent linking groups. The divalent linking group is preferably a divalent linking group obtained through a combination with at least one of —(CH$_2$)$_m$— (m is an integer from 1 to 10), a cyclic alkylene group having 5 to 10 carbon atoms, —O—, —CO—, —COO—, and —NH— and more preferably —(CH$_2$)$_m$— (m is an integer from 1 to 8).

In Formulae (1-3) to (1-5), each of R$^8$ to R$^{14}$ independently represents a hydrogen atom or an organic group. The organic group is preferably a hydrocarbon group, specifically, an alkyl group or an alkenyl group.

The alkyl group may be substituted. In addition, the alkyl group may have a linear shape, a branched shape, or a ring shape, but preferably has a linear shape or a ring shape. The alkyl group is preferably an alkyl group having 1 to 10 carbon atoms, more preferably an alkyl group having 1 to 8 carbon atoms, and still more preferably an alkyl group having 1 to 6 carbon atoms.

The alkenyl group may be substituted. The alkenyl group is preferably an alkenyl group having 1 to 10 carbon atoms, more preferably an alkenyl group having 1 to 4 carbon atoms, and particularly preferably a vinyl group.

Examples of the substituent include a polymerizable group, a halogen atom, an alkyl group, a carboxylic ester group, a halogenated alkyl group, an alkoxy group, a methacryloyloxy group, an acryloyloxy group, an ether group, a sulfonyl group, a sulfide group, an amide group, an acyl group, a hydroxyl group, a carboxyl group, or the like. Among the above-described substituents, a polymerizable group (for example, a vinyl group, a (meth)acryloyloxy group, a (meth)acryloyl group, an epoxy group, an aziridinyl group, or the like) is preferred and a vinyl group is more preferred.

In addition, the compound having the partial structure represented by Formula (1) may be a monomer or a polymer, but is preferably a polymer. The compound having the partial structure represented by Formula (1) is preferably a compound represented by Formula (1-1) or (1-2) and more preferably a compound represented by Formula (1-1).

In addition, in a case in which the compound having the partial structure represented by Formula (1) is a polymer, the compound preferably has the partial structure represented by Formula (1) at the side chain of the polymer.

The molecular weight of the compound having the partial structure represented by Formula (1) is preferably in a range of 50 to 1,000,000 and more preferably in a range of 500 to 500,000. When the molecular weight is set in the above-described range, it is possible to more effectively achieve the effects of the present invention.

The content of the compound having the partial structure represented by Formula (1) is preferably in a range of 5% by mass to 80% by mass and more preferably in a range of 10% by mass to 60% by mass in the composition of the present invention.

Specific examples of the compound having the partial structure represented by Formula (1) include compounds having structures described below or exemplary compounds described below, but the compound is not limited thereto. In the present invention, particularly, the compound having the partial structure represented by Formula (1) is preferably polyacrylamide.

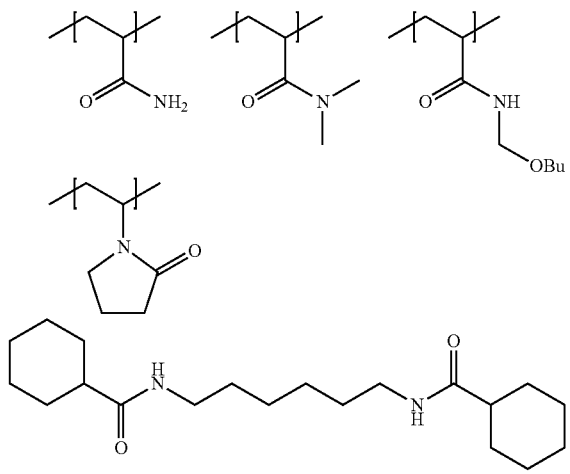

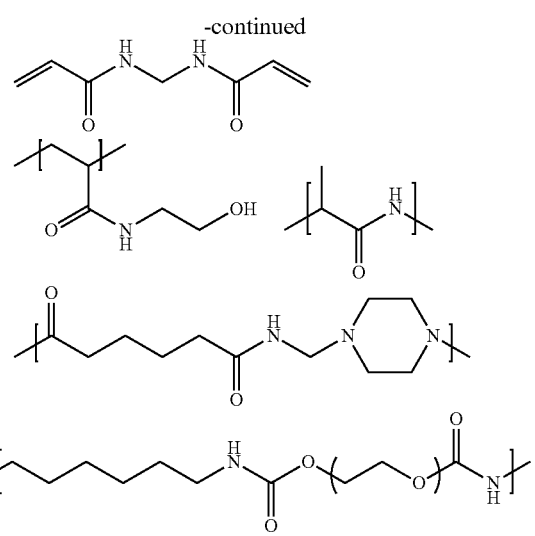

In addition, specific examples of the compound having the partial structure represented by Formula (1) include water-soluble polymers and examples of the preferred main chain structure include polyvinylpyrrolidone, poly(meth)acrylamide, polyamide, polyurethane, and polyuria. The water-soluble polymer may be a copolymer and the copolymer may be a random copolymer.

As the polyvinylpyrrolidone, trade names K-30, K-85, K-90, K-30W, K-85W, and K-90W (manufactured by Nippon Shokubai Co., Ltd.) can be used.

Examples of the poly(meth)acrylamide include polymers and copolymers of (meth)acrylamide. Specific examples of the acrylamide include acrylamide, N-methylacrylamide, N-ethyl acryl amide, N-propylacrylamide, N-butylacrylamide, N-hexylacrylamide, N-hydroxyethylacrylamide, N-phenylacrylamide, N-tolylacrylamide, N-(hydroxyphenyl)acrylamide, N-(sulfamoylphenyl)acrylamide, N-(phenylsulfonyl)acrylamide, N-(tolylsulfonyl)acrylamide, N,N-dimethylacrylamide, N-methyl-N-phenylacrylamide, N-hydroxyethyl-N-methylacrylamide, and the like. In addition, methacrylamides corresponding to the above-described poly(meth)acrylamides can also be used in a similar manner.

Examples of the water-soluble polyamide resin particularly include compounds obtained by copolymerizing a polyamide resin and a hydrophilic compound. A derivative of the water-soluble polyamide resin refers to a compound in which the structure of an amid bond is changed by the substitution or addition reaction of an atom in the water-soluble polyamide resin molecule such as a compound in which a water-soluble polyamide resin is used as a raw material and a hydrogen atom in an amid bond (—CONH—) is substituted with a methoxymethyl group (—CH$_2$OCH$_3$).

Examples of the polyamide resin include so-called "n-nylon" that is synthesized by the polymerization of ω amino acids and so-called "n,m-nylon" that is synthesized by the copolymerization of a diamine and dicarboxylic acid. Among these, from the viewpoint of imparting hydrophilic properties, a copolymer of a diamine and dicarboxylic acid is preferred and a reaction product of ε-caprolactam and dicarboxylic acid is more preferred.

Examples of a hydrophilic compound include hydrophilic nitrogen-containing cyclic compounds, polyalkylene glycols, and the like.

Here, the hydrophilic nitrogen-containing cyclic compound refers to a compound including a ternary amine component at the side chain or the main chain and examples thereof include aminoethyl piperazine, bisaminopropyl piperazine, α-dimethylamino ε-caprolactam, and the like.

Meanwhile, in the compound in which the polyamide resin and the hydrophilic compound are copolymerized together, for example, at least one selected from the group consisting of hydrophilic nitrogen-containing cyclic compounds and polyalkylene glycols is copolymerized at the main chain of the polyamide resin. Therefore, the hydrogen bond capability at the amide-bonded portion in the polyamide resin is strong with respect to N-methoxymethylated nylon.

Among the compounds in which the polyamide resin and the hydrophilic compound are copolymerized together, 1) the reaction products of ε-caprolactam, the hydrophilic nitrogen-containing cyclic compound, and dicarboxylic acid and 2) the reaction products of ε-caprolactam, polyalkylene glycol, and dicarboxylic acid are preferred.

The above-described compounds are commercially available under a trademark of, for example, "AQ NYLON" from Toray Fine Chemicals Co., Ltd. The reaction products of ε-caprolactam, the hydrophilic nitrogen-containing cyclic compound, and dicarboxylic acid can be procured from AQ NYLON-90 manufactured by Toray Fine Chemicals Co., Ltd., and the reaction products of ε-caprolactam, polyalkylene glycol, and dicarboxylic acid can be procured from AQ NYLON-70 manufactured by Toray Fine Chemicals Co., Ltd. AQ NYLON A-90, P-70, P-95, and T-70 (manufactured by Toray Fine Chemicals Co., Ltd.) can be used.

The present invention preferably includes a polymer having a crosslinked group such as an unsaturated double bond, an epoxy group, or an oxetanyl group. In addition, the polymer having the partial structure represented by Formula (1) described above may have a crosslinked group such as an unsaturated double bond, an epoxy group, or an oxetanyl group. Therefore, it is possible to further improve film-forming properties (the suppression of cracking or warping) and humidity resistance when a cured film is produced. Specific examples thereof include polymers (copolymers) having a repeating unit described below. The polymer having the following repeating unit is preferably a polymer (copolymer) having a repeating unit that includes an epoxy group or an oxetanyl group and more preferably a polymer (copolymer) having a repeating unit that includes an epoxy group.

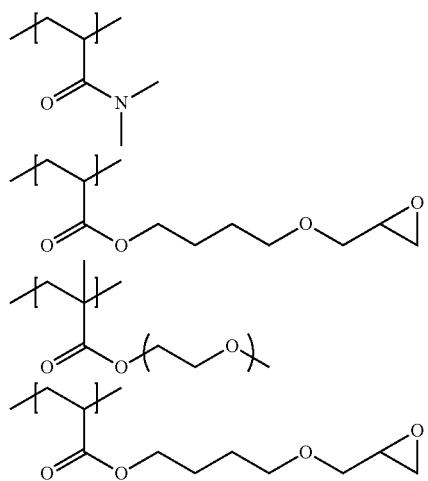

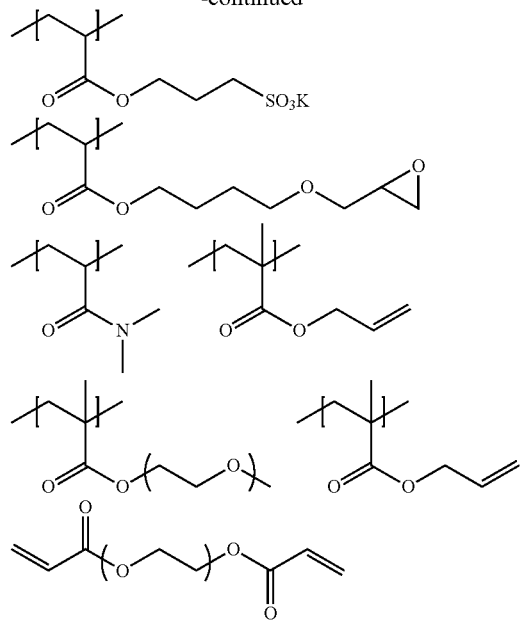

The molar ratio between a repeating unit that includes the partial structure represented by Formula (1) described above and a polymer (copolymer) having a repeating unit that includes an epoxy group or an oxetanyl group is preferably in a range of 10/90 to 90/10 and more preferably in a range of 30/70 to 70/30. The weight-average molecular weight of the copolymer is preferably in a range of 3,000 to 1,000,000 and more preferably in a range of 5,000 to 200,000.

In a case in which a polymer (copolymer) having a repeating unit that includes a crosslinked group is used, the content ratio of the polymer is preferably in a range of 10% by mass to 75% by mass, more preferably in a range of 20% by mass to 65% by mass, and particularly preferably in a range of 20% by mass to 60% by mass in relation to the total solid content of the composition of the present invention excluding the solvent.

<Second Embodiment of Near-Infrared-Absorbing Composition>

The near-infrared-absorbing composition of the present invention may be a near-infrared-absorbing composition including a copper compound and a compound having a partial structure represented by Formula (1)' described below and no anionic group.

Formula (1)'

$$-\overset{O}{\underset{\|}{C}}-\overset{R^2}{\underset{|}{N}}-$$

(in Formula (1)', $R^2$ represents a hydrogen atom or an organic group.)

<Compound Having Partial Structure Represented by Formula (1)' and No Anionic Group>

In Formula (1)', $R^2$ represents a hydrogen atom or an organic group. The organic group is identical to that of $R^1$ in Formula (1) and the preferred range is also identical.

Examples of the anionic group include acid groups capable of forming a complex with copper, specifically, a carboxyl group, a sulfonic acid group, a phosphoric acid group, a phosphonic acid group, and the like. Particularly, the compound having the partial structure represented by Formula (1)' and no anionic group is preferably a compound having neither a sulfonic acid group nor a phosphoric acid group.

For example, the compound having the partial structure represented by Formula (1)' and no anionic group is preferably the compound having the partial structure represented by Formula (1).

When a compound having an anionic group is used, in a case in which the amount of the copper compound added is large, the copper compound and the anionic group form a complex and, consequently, it becomes difficult to form a thin film using the near-infrared-absorbing composition. Therefore, it is not possible to increase the amount of the copper compound added and it is not possible to obtain a near-infrared-absorbing composition capable of forming a cured film having excellent moisture resistance while maintaining strong near-infrared shielding properties when a cured film is produced.

<Solvent>

The composition of the present invention may include a solvent. The number of the solvents may be one or more. In the composition of the present invention, the solid content of the near-infrared-absorbing composition is preferably in a range of 35% by mass to 90% by mass and more preferably in a range of 38% by mass to 80% by mass. That is, the fraction of the solvent in the composition of the present invention is preferably in a range of 10% by mass to 65% by mass, more preferably in a range of 20% by mass to 62% by mass, and particularly preferably in a range of 30% by mass to 60% by mass.

In addition, the composition of the present invention may include water or an aqueous solvent. The kinds of water or the aqueous solvents may be one or more.

In a case in which the composition of the present invention includes water or an aqueous solvent, the solid content of the near-infrared-absorbing composition is preferably in a range of 10% by mass to 80% by mass and more preferably in a range of 15% by mass to 70% by mass. That is, the composition of the present invention preferably includes water or the aqueous solution in a range of 20% by mass to 90% by mass and more preferably includes water or the aqueous solution in a range of 30% by mass to 85% by mass. Regarding the solvent used in the present invention, there is no particular limitation and any solvent can be appropriately selected depending on the purpose as long as the solvent is capable of uniformly dissolving or dispersing the respective components of the composition of the present invention. Preferred examples thereof include water and aqueous solvents such as alcohols. In addition, additional examples of the solvent used in the present invention preferably include organic solvents, ketones, esters, aromatic hydrocarbons, halogenated hydrocarbons, dimethylformamide, dimethylacetoamide, dimethylsulfoxide, sulfolane, and the like. These solvents may be used singly or two or more solvents may be jointly used. In a case in which two or more solvents are jointly used, particularly preferred examples thereof include mixed solutions made up of two or more solvents selected from 3-ethoxy methyl propionate, 3-ethoxy ethyl propionate, ethyl cellosolve acetate, ethyl lactate, diethylene glycol dimethyl ether, butyl lactate, 3-methoxy methyl propionate, 2-heptanone, cyclohexanone, ethyl carbitol acetate, butyl carbitol acetate, ethylene glycol monobutyl ether acetate, propylene glycol monomethyl ether, and pirpylene glycol monomethyl ether acetate.

Specific examples of the alcohols, the aromatic hydrocarbons, and the halogenated hydrocarbons include those described in Paragraph [0136] and the like in JP2012-194534A and the content thereof is incorporated into the specification of the present application by reference. In addition, specific examples of the esters, the ketones, and the ethers include those described in Paragraph [0497] in JP2012-208494A (Paragraph [0609] in the corresponding US2012/0235099A) and further include n-amyl acetate, ethyl propionate, dimethyl phthalate, ethyl benzoate, methyl sulfate, acetone, methyl isobutyl ketone, diethyl ether, ethylene glycol monobutyl ether acetate, and the like.

<Curable Compound>

The composition of the present invention may further include a curable compound. However, in a case in which the copper complex is a curable compound having a polymerizable group, the composition does not necessarily include the curable compound. The curable compound may be a polymerizing compound or a non-polymerizing compound such as a binder. In addition, the curable compound may be a thermosetting compound or a photocrosslinkable compound and is preferably a thermosetting composition due to its high reaction rate.

<<Compound Having Polymerizable Group>>

Examples of the curable compound include a compound having a polymerizable group (hereinafter, in some cases, referred to as the "polymerizing compound"). The above-described compound group is widely known in the corresponding industrial field and, in the present invention, the above-described compounds can be used without any particular limitation. The compounds may have any chemical form of, for example, a monomer, an oligomer, a prepolymer, a polymer, and the like.

The polymerizing compound may be monofunctional or polyfunctional and is preferably polyfunctional. The inclusion of the polyfunctional compound makes it possible to improve near-infrared shielding properties and heat resistance. The number of the functional groups is not particularly specified, but is preferably in a range of 2 to 8.

In a case in which the composition of the present invention includes the curable composition, a preferred aspect of the curable compound includes the following. The present invention is not limited to the following aspects.

(1) The curable compound included in the composition of the present invention is a (meth)acrylate.

(2) The curable compound included in the composition of the present invention is a polyfunctional (meth)acrylate.

(3) The curable compound included in the composition of the present invention is a tri- to hexafunctional (meth)acrylate.

(4) The curable compound included in the composition of the present invention is a polybasic acid-denatured acrylic oligomer.

(5) The curable compound included in the composition of the present invention is an epoxy resin.

(6) The curable compound included in the composition of the present invention is a polyfunctional epoxy resin.

<<A: Polymerizing Monomer and Polymerizing Oligomer>>

A first preferred embodiment of the composition of the present invention includes a monomer having a polymerizable group (polymerizing monomer) or an oligomer having a polymerizable group (polymerizing oligomer) (hereinafter, in some cases, the polymerizing monomer and the polymerizing oligomer will be collectively referred to as "the polymerizing monomer and the like") as the polymerizing compound.

Examples of the polymerizing monomer and the like include unsaturated carboxylic acids (for example, acrylic acid, methacrylic acid, itaconic acid, crotonic acid, isocrotonic acid, maleic acid, and the like), esters thereof, and amides thereof and esters of an unsaturated carboxylic acid and an aliphatic polyvalent alcohol compound and amides of an unsaturated carboxylic acid and an aliphatic polyvalent amine compound are preferred. Addition reactants of an unsaturated carboxylic ester or amide having a nucleopetal substituent such as a hydroxyl group, an amino group, or a mercapto group and a monofunctional or polyfunctional isocyanate or epoxy, dehydration and condensation reactants of the unsaturated carboxylic ester or amide and a monofunctional or polyfunctional carboxylic acid, and the like are also preferably used. In addition, addition reactants of an unsaturated carboxyl ester or an amide having an electrophilic substituent such as an isocyanate group or an epoxy group and a monofunctional or polyfunctional alcohol, amine, or thiol and, furthermore, substitution reactants of an unsaturated carboxylic ester or amide having a desorbable sub stituent such as a halogen group or a tosyloxy group and a monofunctional or polyfunctional alcohol, amine, or thiol are also preferred.

As additional examples, it is also possible to use a compound group in which the above-described unsaturated carboxylic acid is substituted with an unsaturated phosphonic acid, a vinyl benzene derivative such as styrene, a vinyl ether, an aryl ether, or the like.

As the specific compounds thereof, the compounds described in Paragraphs [0095] to [0108] in JP2009-288705A can be preferably used even in the present invention.

In addition, the polymerizing monomer and the like are also preferably compounds having an ethylenic unsaturated group which has at least one addition-polymerizing ethylene group and a boiling point of 100° C. or higher at normal pressure. Specifically, the polymerizing monomer and the like are preferably monofunctional (meth)acrylates, difunctional (meth)acrylates, or tri- or more-functional (meth) acrylates (for example, tri- to hexafunctional (meth)acrylate).

Examples thereof include monofunctional acrylates or methacrylates such as polyethylenen glycol mono(meth)acrylate, polypropylene glycol mono(meth)acrylate, and phenoxyethyl (meth)acrylate;

monomers and oligomers obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol(meth)acrylate, trimethylolpropane tri(acryloyloxypropyl)ether, tri(acryloyloxyethyl)isocyanurate, glycerin, or trimethylolethane and then (meth)acrylating the mixture;

polyfunctional acrylate or methacrylate such as urethane (meth)acrylates as respectively described in JP1973-41708B (JP-S48-41708B), and JP1975-6034B (JP-S50-6034B), JP1976-37193B (JP-S51-37193B), polyester acrylates respectively described in JP1973-64183B (JP-S48-64183B), JP1974-43191B (JP-S49-43191B), and JP1977-30490B (JP-S52-30490B), epoxy acrylates that are reaction products of an epoxy polymer and (meth)acrylic acid and mixtures thereof.

Among these, the polymerizing compound is preferably ethyleneoxy-denatured pentaerythritol tetraacrylate (NK ester ATM-35E as a commercially available product: manufactured by Shin-Nakamura Chemical Co., Ltd.), dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol penta(meth)acrylate (KAYARAD D-310 as a commercially available product; manufactured by Nippon Kayaku Co., Ltd.), dipentaerythritol hexa(meth)acrylate (KAYARAD DPHA as a commercially available product; manufactured by Nippon Kayaku Co., Ltd.), and structures in which the above-described (meth)acryloyl groups are through ethylene glycol and propylene glycol residues. In addition, the oligomer types thereof can also be used.

Examples of the polymerizing compound include polyfunctional (meth)acrylates and the like obtained by reacting a polyfunctional carboxylic acid and a compound having a cyclic ether group such as glycidyl (meth)acrylate and an ethylenic unsaturated group.

In addition, as other preferred polymerizing monomers and the like, it is also possible to use compounds and curled polymers having a fluorene ring and a di- or more-functional ethylenic polymerizable group which are described in JP2010-160418A, JP2010-129825A, JP4364216B, and the like.

In addition, the compounds having a boiling point of 100° C. or higher at normal pressure and having at least one addition-polymerizing ethylenic unsaturated group are also preferably the compounds described in Paragraphs [0254] to [0257] in JP2008-292970A.

The compounds obtained by adding an ethylene oxide or propylene oxide to the polyfunctional alcohol, which are described as General Formulae (1) and (2) together with specific examples thereof in JP1998-62986A (JP-H10-62986A),), and then (meth)acrylating the ethylene oxide or propylene oxide can also be used as the polymerizing monomer.

The polymerizing monomer used in the present invention is preferably a polymerizing monomer represented by General Formulae (MO-1) to (MO-6).

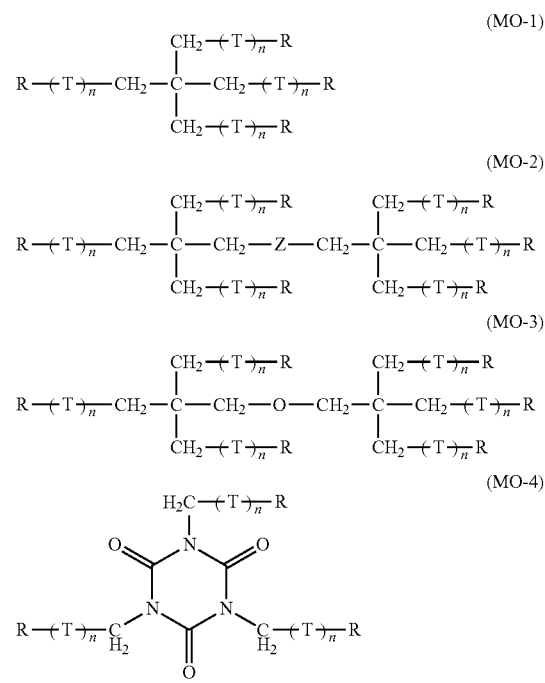

-continued (MO-5)

$$R-(T)_n-H_2C-N\begin{matrix}CH_2-(T)_n-R\\CH_2-(T)_n-R\end{matrix}$$

(MO-6)

$$\begin{matrix}O-(T)_n-R & O-(T)_n-R\\HC-CH_2-O-CH_2-CH\\CH_2-O-(T)_n-R & CH_2-O-(T)_n-R\end{matrix}$$

$$R= H_2C=CH-\underset{O}{\overset{\|}{C}}-O-, \quad H_2C=\underset{O}{\overset{CH_3}{\underset{\|}{C}}}-\underset{O}{\overset{\|}{C}}-O-,$$

$$-O-\underset{O}{\overset{\|}{C}}-(CH_2)_m-\underset{O}{\overset{\|}{C}}-OH$$

$$-O-\underset{O}{\overset{\|}{C}}-\underset{H}{\overset{|}{N}}-(CH_2)_m-\underset{O}{\overset{\|}{C}}-OH, \quad -OH, \quad -CH_3,$$

$$T= -(CH_2)_m-, \quad -OCH_2-, \quad -O(CH_2)_2-,$$
$$-O(CH_2)_3-, \quad -O(CH_2)_4-$$

$$-O-\underset{O}{\overset{\|}{C}}-(CH_2)_m-, \quad -\underset{O}{\overset{\|}{C}}-O-(CH_2)_m-,$$

$$-O\underset{}{\overset{CH_3}{\underset{|}{C}H}}-CH_2-, \quad -OCH_2\underset{}{\overset{CH_3}{\underset{|}{C}H}}-$$

$$Z= -O-\underset{O}{\overset{\|}{C}}-\underset{H}{\overset{|}{N}}-(CH_2)_m-\underset{H}{\overset{|}{N}}-\underset{O}{\overset{\|}{C}}-O-$$

(In the formulae, ns are 0 to 14 respectively and ms are 1 to 8 respectively. The multiple R, T, and Z present in a molecule may be identical to or different from each other. In a case in which T is an oxyalkylene group, the terminal on the carbon atom side is bonded to R. At least one of the Rs is a polymerizable group.)

n is preferably 0 to 5 and more preferably 1 to 3.
m is preferably 1 to 5 and more preferably 1 to 3.
Rs are preferably the following four structures.

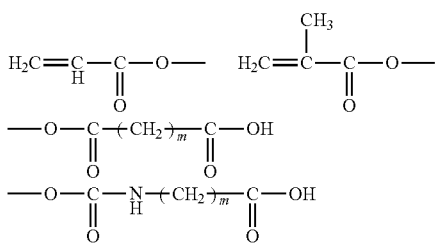

Rs are preferably the following two structures out of the above-described four structures.

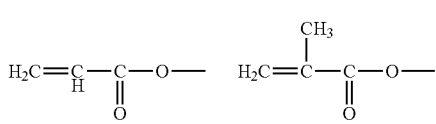

As specific examples of a radical polymerizing monomer represented by General Formulae (MO-1) to (MO-6), the compounds described in Paragraphs [0248] to [0251] in JP2007-269779A can also be preferably used in the present invention.

Among these, examples of the polymerizing monomer and the like include the polymerizing monomer and the like described in Paragraph [0477] in JP2012-208494A (Paragraph [0585] in the corresponding US2012/0235099A) and the content thereof is incorporated into the specification of the present application. In addition, diglycerin E0 (ethylene oxide)-denatured (meth)acrylate (M-460 as a commercially available product; manufactured by Toagosei Co., Ltd.) is preferred. Pentaerythritol tetraacrylate (manufactured by Shin-Nakamura Chemical Co., Ltd., A-TMMT) and 1,6-hexanediol diacrylate (manufactured by Nippon Kayaku Co., Ltd., KAYARAD HDDA) are also preferred. The oligomer types thereof can also be used.

Examples thereof include RP-1040 (manufactured by Nippon Kayaku Co., Ltd.).

The polymerizing monomer and the like are polyfunctional monomers and may have an acid group such as a carboxylic group, a sulfonic acid group, or a phosphorous acid group. Therefore, an ethylenic compound can be used as it is as long as the compound has an unreacted carboxylic group like a mixture-form compound. If necessary, it is also possible to introduce an acid group by reacting a hydroxyl group into the above-described ethylenic compound and a non-aromatic carboxy anhydride. In this case, specific examples of the non-aromatic carboxy anhydride being used include anhydrous tetrahydrophthalic acid, alkylated anhydrous tetrahydrophthalic acid, anhydrous hexahydrophthalic acid, alkylated anhydrous hexahydrophthalic acid, anhydrous succinic acid, and anhydrous maleic acid.

In the present invention, the monomer having an acid group is preferably an ester of an aliphatic polyhydroxy compound and an unsaturated carboxylic acid which is a polyfunctional monomer provided with an acid group by reacting an unreacted hydroxyl group in an aromatic polyhydroxy compound and a non-aromatic carboxy anhydride. In the above-described ester, the aliphatic polyhydroxy compound is particularly preferably pentaerythritol and/or dipentaerythritol. Examples of commercially available products thereof include ARONIX series M-305, M-510, M-520, and the like which are polybasic acid-denatured acryl oligomers manufactured by Toagosei Co., Ltd.

The acid value of the polyfunctional monomer having an acid group is preferably in a range of 0.1 mg-KOH/g to 40 mg-KOH/g and particularly preferably in a range of 5 mg-KOH/g to 30 mg-KOH/g. In a case in which two or more polyfunctional monomers having different acid groups are jointly used or polyfunctional monomers having no acid group are jointly used, it is preferable to adjust the polyfunctional monomer so that the acid value of the polyfunctional monomer falls in the above-described range as a whole.

In addition, the polymerizing monomer and the like preferably include a polyfunctional monomer having a caprolactam-denatured structure.

The polyfunctional monomer having a caprolactam-denatured structure is not particularly limited as long as the polyfunctional monomer has a caprolactam-denatured structure in the molecule. Examples of the polyfunctional monomer having a caprolactam-denatured structure include E-caprolactam-denatured polyfunctional (meth)acrylates obtained by esterifying a polyvalent alcohol such as trimethylol ethane, ditrimethylol ethane, trimethylol propane, ditrimethylol propane, pentaerythritol, dipentaerythritol, tripentaerythritol, glycerin, diglycerol, or trimethylol melamine, (meth)acrylic acid, and ε-caprolactone. Among these, polyfunctional monomers having a caprolactam-denatured structure represented by Formula (1) described below are preferred.

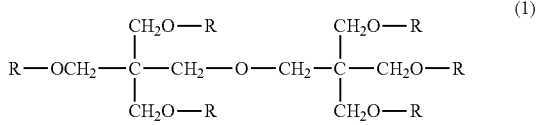

(In the formula, all of the six Rs are groups represented by Formula (2) described below or one to five of the six Rs are the groups represented by Formula (2) described below and the remaining Rs are groups represented by Formula (3) described below.)

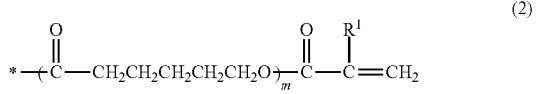

(In the formula, $R^1$ represents a hydrogen atom or a methyl group, m represents a number of 1 or 2, and "*" indicates a direct bond.)

(In the formula, le represents a hydrogen atom or a methyl group and "*" indicates a direct bond.)

The above-described polyfunctional monomer having a caprolactam-denatured structure is commercially available under the name of, for example, KAYARAD DPCA series manufactured by Nippon Kayaku Co., Ltd. and examples thereof include DPCA-20 (compound in which m=1 in Formulae (1) to (3), the number of the groups represented by Formula (2)=2, and all the les are hydrogen atoms), DPCA-30 (compound in which m=1 in the same formulae, the number of the groups represented by Formula (2)=3, and all the les are hydrogen atoms), DPCA-60 (compound in which m=1 in the same formulae, the number of the groups represented by Formula (2)=6, and all the $R^1$s are hydrogen atoms), DPCA-120 (compound in which m=2 in the same formulae, the number of the groups represented by Formula (2)=6, and all the $R^1$s are hydrogen atoms), and the like.

In the present invention, the polyfunctional monomer having a caprolactam-denatured structure can be used singly or a mixture of two or more monomers can be used.

In addition, the polymerizing monomer and the like in the present invention are preferably at least one selected from the group of compounds represented by General Formula (i) or (ii).

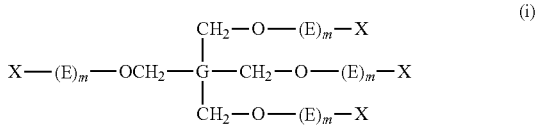

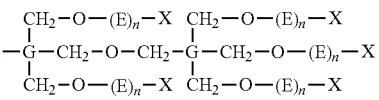

In General Formulae (i) and (ii), each of the Es independently represents $-((CH_2)_yCH_2O)-$ or $((CH_2)_yCH(CH_3)O)-$, each of ys independently represents an integer from 0 to 10, and each of Xs independently represents an acryloyl group, a methacryloyl group, a hydrogen atom, or a carboxyl group.

In General Formula (i), the total number of the acryloyl groups and the methacryloyl groups is 3 or 4, each of the ms independently represents an integer from 0 to 10, and the total number of the respective ms is an integer from 0 to 40. In a case in which the total number of the respective ms is 0, any one of the Xs is a carboxyl group.

In General Formula (ii), the total number of the acryloyl groups and the methacryloyl groups is 5 or 6, each of the ns independently represents an integer from 0 to 10, and the total number of the respective ns is an integer from 0 to 60. In a case in which the total number of the respective ns is 0, any one of the Xs is a carboxyl group.

In General Formula (i), m is preferably an integer from 0 to 6 and more preferably an integer from 0 to 4. In addition, the total number of the respective ms is preferably an integer from 2 to 40, more preferably an integer from 2 to 16, and particularly preferably an integer from 4 to 8.

In General Formula (ii), n is preferably an integer from 0 to 6 and more preferably an integer from 0 to 4. In addition, the total number of the respective ns is preferably an integer from 3 to 60, more preferably an integer from 3 to 24, and particularly preferably an integer from 6 to 12.

In addition, $-((CH_2)_yCH_2O)-$ or $((CH_2)_yCH(CH_3)O)-$ in General Formulae (i) and (ii), the terminal on the oxygen atom side is preferably bonded to X.

The compound represented by General Formula (i) or (ii) may be used singly or two or more compounds may be jointly used. Particularly, in General Formula (ii), all of the six Xs are preferably acryloyl groups.

The compound represented by General Formula (i) or (ii) can be synthesized through a step of bonding a ring-opened skeleton using a ring-opening addition reaction between pentaerythritol or dipentaerythritol and ethylene oxide or propylene oxide and a step of introducing a (meth)acryloyl group using a reaction between a terminal hydroxyl group in the ring-opened skeleton and, for example, (meth)acryloyl chloride. The respective steps are well-known steps and a person skilled in the art can easily synthesize the compound represented by General Formula (i) or (ii).

Among the compounds represented by General Formula (i) or (ii), pentaerythritol derivatives and/or dipentaerythritol derivatives are more preferred.

Specific examples thereof include compounds represented by Formulae (a) to (f) described below (hereinafter, referred to as "Exemplary Compounds (a) to (f)") and, among these, Exemplary Compounds (a), (b), (e), and (f) are preferred.

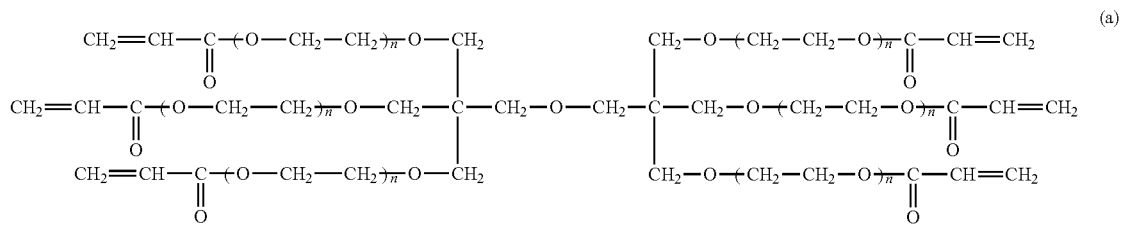
(a)
(the total of individual nS is 6)
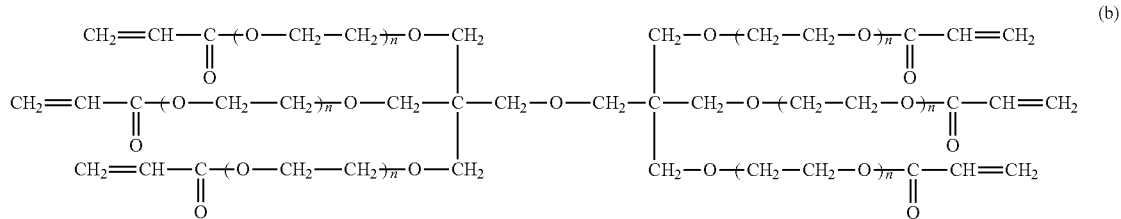
(b)
(the total of individual nS is 12)
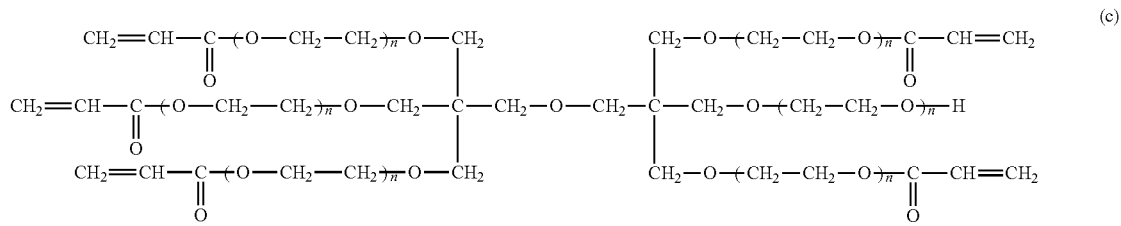
(c)
(the total of individual nS is 12)
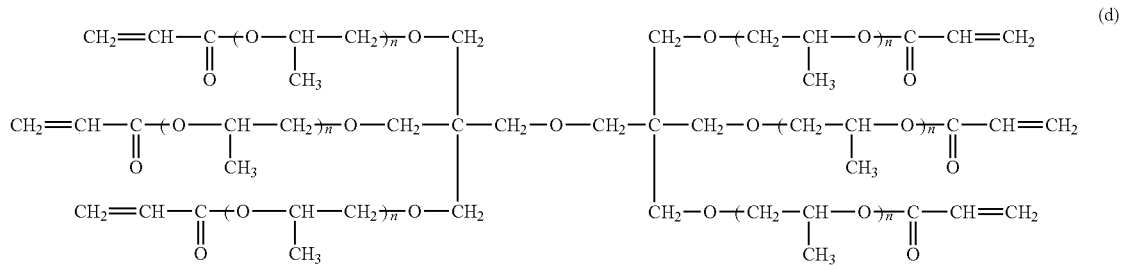
(d)
(the total of individual nS is 6)
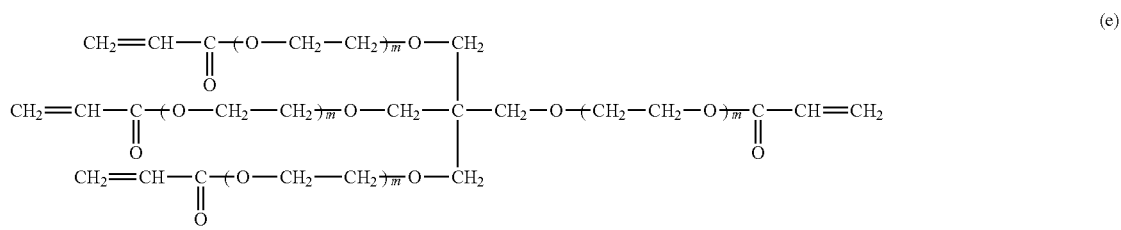
(e)
(the total of individual mS is 4)
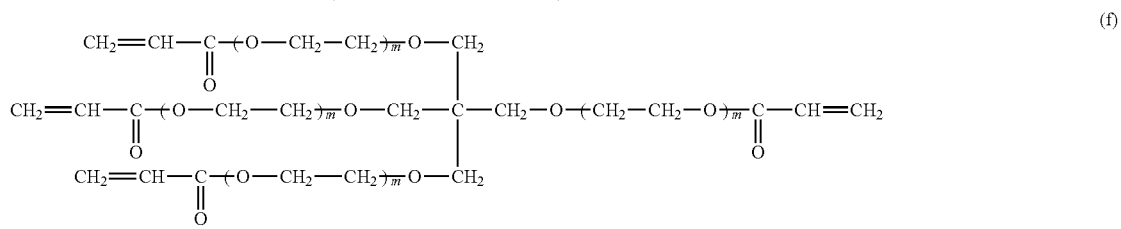
(f)
(the total of individual mS is 12)

Examples of the commercially available products of the polymerizing monomer and the like represented by General Formula (i) or (ii) include SR-494 manufactured by Sartomer Company, Inc. which is a tetrafunctional acrylate having four ethyleneoxy chains, DPCA-60 which is a hexafunctional acrylate having six pentyleneoxy chains, and TPA-330 which is a trifunctional acrylate having three isobutyleneoxy chains both of which are manufactured by Nippon Kayaku Co., Ltd.

In addition, the polymerizing monomer and the like are also preferably urethane acrylates described in JP1973-41708B (JP-S48-41708B), JP1976-37193A (JP-S51-37193A), JP1990-32293B (JP-H2-32293B), and JP1990-16765B (JP-H2-16765B) and urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B). Furthermore, as the polymerizing monomer and the like, it is possible to obtain curable compositions having an extremely excellent photosensitive speed using an addition-polymerizing monomer having an amino structure or a sulfide structure in the molecule described in JP1988-277653A (JP-S63-277653A), JP1988-260909A (JP-S63-260909A), and JP1989-105238A (JP-H1-105238A).

Examples of the commercially available products of the polymerizing monomer and the like include urethane oligomers UAS-10, UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), UA-306H, UA-306T, UA-306I, AH-600, T-600, AI-600 (manufactured by Kyoeisha Chemical Co., Ltd.), and the like.

The polymerizing monomer and the like are preferably polyfunctional thiol compounds having two or more mercapto (SH) groups in the same molecule. Particularly, polyfunctional thiol compounds represented by General Formula (I) described below are preferred.

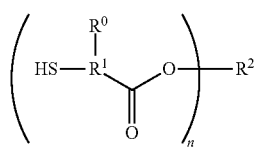

(I)

(In the formula, $R^1$ represents an alkyl group, $R^2$ represents an n-valent aliphatic group which may have an atom other than carbon, $R^0$ represents an alkyl group which is not hydrogen (H), and n represents 2 to 4.)

Examples of the polyfunctional thiol compounds represented by General Formula (1) include 1,4-bis(3-mercapto butyloxy)buthane having the following structural formula [Formula (II)], 1,3,5-tris(3-mercapto butyloxyethyl)-1,3,5-triazine-2,4,6(1H, 3H, 5H)-trione [Formula (III)], pentaerythtol tetrakis(3-mercaptobutylate) [Formula (IV)], and the like. The above-described polyfunctional thiols can be used singly or a combination of multiple polyfunctional thiols can be used.

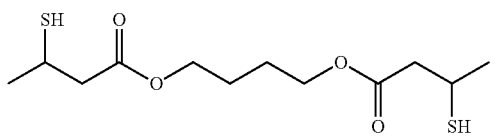

(II)

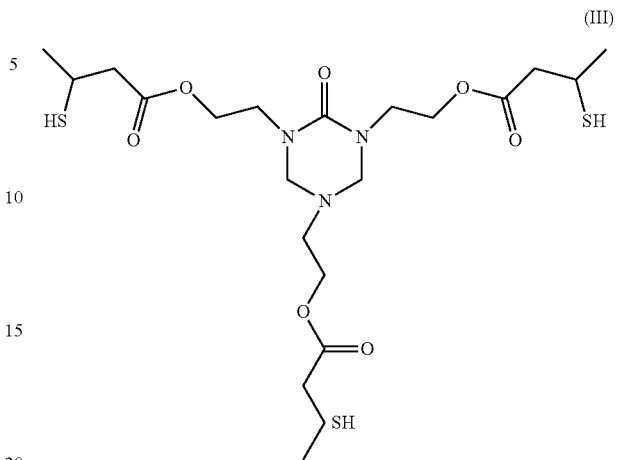

(III)

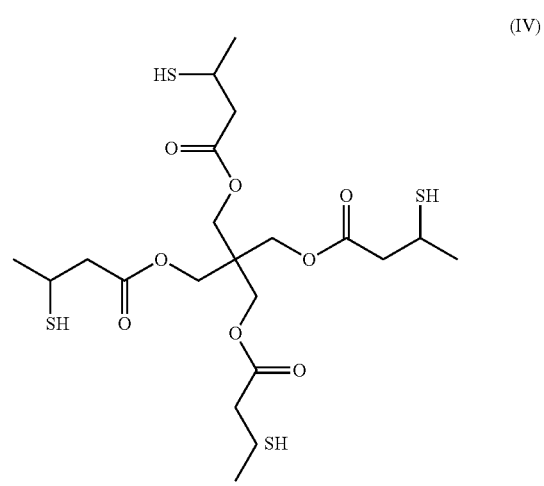

(IV)

In the present invention, as the polymerizing monomer and the like, a polymerizing monomer or oligomer having two or more epoxy groups or oxetanyl groups in the molecule is preferably used. Specific examples thereof are summarized in the section of compounds having an epoxy group or oxetanyl group described below.

<<B: Polymer Having Polymerizable Group at Side Chain>>

A second preferred aspect of the composition of the present invention includes a polymer having a polymerizable group at the side chain as the polymerizing compound.

Examples of the polymerizable group include an ethylenic unsaturated double bond group and an epoxy group or an oxetanyl group.

The polymer having the latter group will be collectively described in the section of a compound having an epoxy group or an oxetanyl group described below.

The polymer having an ethylenic unsaturated bond at the side chain is preferably a macromolecular compound having at least one selected from functional groups represented by any one of General Formulae (1) to (3) described below as the unsaturated double bond portion.

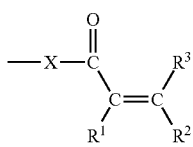

General Formula (1)

In General Formula (1), each of $R^1$ to $R^3$ independently represents a hydrogen atom or a monovalent organic group. Preferred examples of $R^1$ include a hydrogen atom, an alkyl group, and the like and, among these, a hydrogen atom and a methyl group are preferred due to their high radical reactivity. In addition, each of $R^2$ and $R^3$ independently represents a hydrogen atom, a halogen atom, an amino group, a carboxylic group, an alkoxycarbonyl group, a sulfo group, a nitro group, a cyano group, an alkyl group, an aryl group, an alkoxy group, an aryloxy group, an akylamino group, an arylamino group, an alkylsulfonyl group, an arylsulfonyl group, and the like and, among these, a hydrogen atom, a carboxylic group, an alkoxycarbonyl group, an alkyl group, and an aryl group are preferred due to their high radical reactivity.

X represents an oxygen atom, a sulfur atom, or —N($R^{12}$)— and $R^{12}$ represents a hydrogen atom or a monovalent organic group. Examples of $R'^2$ include an alkyl group and the like and, among these, $R^{12}$ is preferably a hydrogen atom, a methyl group, an ethyl group, or an isopropyl group due to their high radical reactivity.

Here, examples of an introducible substituent include an alkyl group, an alkenyl group, an alkynyl group, an aryl group, an alkoxy group, an aryloxy group, a halogen atom, an amino group, an alkylamino group, an arylamino group, a carboxyl group, an alkoxy carbonyl group, a sulfo group, a nitro group, a cyano group, an amide group, an alkyl sulfonyl group, an aryl sulfonyl group, and the like.

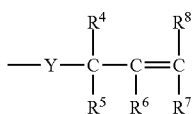

General Formula (2)

In General Formula (2), each of $R^4$ to $R^5$ independently represents a hydrogen atom or a monovalent organic group. Each of $R^4$ to $R^8$ is preferably a hydrogen atom, a halogen atom, an amino group, a dialkylamino group, a carboxyl group, an alkoxy carbonyl group, a sulfo group, a nitro group, a cyano group, an alkyl group, an aryl group, an alkoxy group, an aryloxy group, an alkylamino group, an arylamino group, an alkyl sulfonyl group, an aryl sulfonyl group, and the like and, among these, a hydrogen atom, a carboxyl group, an alkoxy carbonyl group, an alkyl group, and an aryl group are more preferred.

Examples of an introducible substituent include the same substituents as General Formula (1). In addition, Y represents an oxygen atom, a sulfur atom, or —N($R^{12}$)—. $R^{12}$ is identical to $R^{12}$ in General Formula (1) and the preferred range is also identical.

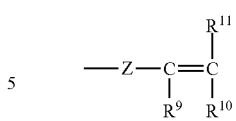

General Formula (3)

In General Formula (3), preferred examples of $R^9$ include a hydrogen atom, an alkyl group which may have a substituent, and the like and, among these, a hydrogen atom and a methyl group are preferred due to their high radical reactivity. Examples of each of $R^{19}$ and $R^{11}$ independently include a hydrogen atom, a halogen atom, an amino group, a dialkylamino group, a carboxyl group, an alkoxy carbonyl group, a sulfo group, a nitro group, a cyano group, an alkyl group, an aryl group, an alkoxy group, an aryloxy group, an alkylamino group, an arylamino group, an alkyl sulfonyl group, an aryl sulfonyl group, and the like and, among these, a hydrogen atom, a carboxyl group, an alkoxy carbonyl group, an alkyl group, and an aryl group are preferred due to their high radical reactivity.

Here, examples of an introducible sub stituent include the same sub stituents as General Formula (1). In addition, Z represents an oxygen atom, a sulfur atom, —N($R^{13}$)—, or a phenylene group. Examples of $R^{13}$ include an alkyl group and the like and, among these, a methyl group, an ethyl group, and an isopropyl group are preferred due to their high radical reactivity.

The polymer having an ethylenic unsaturated bond at the side chain in the present invention is preferably a compound having a configuration unit that includes a functional group represented by General Formulae (1) to (3) in a molecule in a range of 20 mol % to less than 95 mol %. The content of the configuration unit is more preferably in a range of 25 mol % to 90 mol % and still more preferably in a range of 30 mol % to less than 85 mol %.

A macromolecular compound having the configuration unit that includes the group represented by General Formulae (1) to (3) can be synthesized on the basis of the synthesis method described in Paragraphs [0027] to [0057] in JP2003-262958A. Among these, the macromolecular compound is preferably synthesized using the synthesis method 1) in the same publication.

The polymer having an ethylenic unsaturated bond used in the present invention may further include an acid group.

In the present specification, the acid group refers to an acid group having a dissociable group with a pKa of 14 or less, examples thereof include —COOH, —$SO_3H$, —$PO_3H_2$, —$OSO_3H$, —$OPO_2H_2$, -PhOH, —$SO_2H$, —$SO_2NH_2$, —$SO_2NHCO$—, —$SO_2NHSO_2$—, and the like, and among these, —COOH, —$SO_3H$, and —$PO_3H_2$ are preferred, and COOH is more preferred.

A polymer having the acid group and an ethylenic unsaturated bond at the side chain can be obtained by, for example, adding an ethylenic unsaturated group-containing epoxy compound to a carboxyl group in an alkali-soluble polymer having a carboxyl group.

Examples of the polymer having a carboxyl group include 1) polymers obtained by radical-polymerizing or ion-polymerizing monomers having a carboxyl group, 2) polymers obtained by radical-polymerizing or ion-polymerizing monomers having an acid anhydride and hydrolyzing or half-esterifying an acid anhydride unit, 3) epoxy acrylates obtained by denaturing an epoxy polymer using an unsaturated monocarboxylic acid and an acid anhydride, and the like.

Specific examples of a vinyl-based polymer having a carboxyl group include polymers obtained by singly polymerizing unsaturated carboxylic acids such as (meth)acrylic acid, 2-succinoyloxyethyl methacrylate, 2-maleinoyloxyethyl methacrylate, 2-phthaloyloxyethyl methacrylate, 2-hexahydrophthaloyloxyethyl methacrylate, maleic acid, fumaric acid, itaconic acid, or crotonic acid, which is a monomer having a carboxyl group, and polymers obtained by copolymerizing the above-described unsaturated carboxyl acid with a vinyl monomer having no carboxyl group such as styrene, α-methylstyrene, methyl (meth)acrylate, ethyl (meth)acrylate, propyl (meth)acrylate, isopropyl (meth)acrylate, butyl (meth)acrylate, vinyl acetate, acrylonitrile, (meth)acrylamide, glycidyl (meth)acrylate, allyl glycidyl ether, ethyl glycidyl acrylate, glycidyl crotonate ester, (meth)acrylic acid chloride, benzyl (meth)acrylate, hydroxyethyl (meth)acrylate, N-methylol acrylamide, N,N-dimethylacrylamide, N-methacryloylmopholine, N,N-dimethylaminoethyl (meth)acrylate, or N,N-dimethylaminoethylacrylamide.

In addition, examples thereof also include polymers obtained by copolymerizing anhydrous maleic acid and styrene, α-methyl styrene, or the like and half esterifying the anhydrous maleic acid unit portion with a monovalent alcohol such as methanol, ethanol, propanol, butanol, or hydroxyethyl (meth)acrylate or hydrolyzing the anhydrous maleic acid unit portion with water.

Among these, polymers having a carboxyl group, particularly, (meth)acrylic acid-(co)polymerized polymers including (meth)acrylate are preferred. Examples of the copolymers include methyl methacrylate/methacrylic acid copolymers described in JP1985-208748A (JP-S60-208748A), methyl methacrylate/methyl acrylate/methacrylic acid copolymers described in JP1985-214354A (JP-S60-214354A), benzyl methacrylate/methyl methacrylate/methacrylic acid/2-ethylhexyl acrylate copolymers described in JP 1993-36581A (JP-H5-36581A), methyl methacrylate/n-butyl methacrylate/2-ethylhexyl acrylate/methacrylic acid copolymers described in JP1993-333542A (JP-H5-333542A), styrene/methyl methacrylate/methyl acrylate/methacrylic acid copolymers described in JP1995-261407A (JP-H7-261407A), methyl methacrylate/n-butyl methacrylate/2-ethylhexyl acrylate/methacrylic acid copolymers described in JP1998-110008A (JP-H10-110008A), methyl methacrylate/n-butyl acrylate/2-ethylhexyl acrylate/styrene/methacrylic acid copolymers described in JP1998-198031A (JP-H10-198031 A), and the like.

A polymer including the acid group and the polymerizable group at the side chain in the present invention is preferably a macromolecular compound having at least one selected from configuration units represented by any one of General Formulae (1-1) to (3-1) described below as the unsaturated double bond portion.

General Formula (1-1)

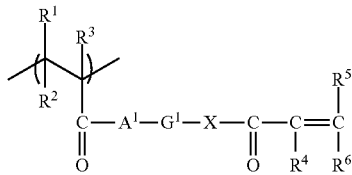

General Formula (2-1)

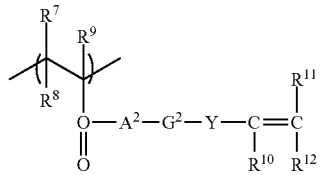

General Formula (3-1)

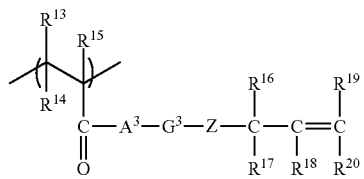

In General Formulae (1-1) to (3-1), each of $A^1$, $A^2$, and $A^3$ independently represents an oxygen atom, a sulfur atom, or —N($R^{21}$)— and $R^{21}$ represents an alkyl group. Each of $G^1$, $G^2$, and $G^3$ independently represents a divalent organic group. Each of X and Z independently represents an oxygen atom, a sulfur atom, or —N($R^{22}$)— and $R^{22}$ represents an alkyl group. Y represents an oxygen atom, a sulfur atom, a phenylene group, or —N($R^{23}$)— and $R^{23}$ represents an alkyl group. Each of $R^1$ to $R^{20}$ independently represents a monovalent substituent.

In General Formula (1-1), each of $R^1$ to $R^3$ independently represents a monovalent substituent. Examples of $R^1$ to $R^3$ include alkyl groups and the like which may further have a hydrogen atom and a sub stituent and, among these, $R^1$ and $R^2$ are preferably hydrogen atoms and $R^3$ is preferably a hydrogen atom or a methyl group.

Each of $R^4$ to $R^6$ independently represents a monovalent substituent. Examples of $R^4$ include alkyl groups and the like which may further have a hydrogen atom and a substituent and, among these, a hydrogen atom, a methyl group, and an ethyl group are preferred. Examples of each of $R^5$ and $R^6$ independently include a hydrogen atom, a halogen atom, an alkoxy carbonyl group, a sulfo group, a nitro group, a cyano group, an alkyl group which may further have a substituent, an aryl group which may further have a substituent, an alkoxy group which may further have a substituent, an aryloxy group which may further have a substituent, an alkyl sulfonyl group which may further have a substituent, an aryl sulfonyl group which may further have a sub stituent, and the like and, among these, a hydrogen atom, an alkoxy carbonyl group, an alkyl group which may further have a substituent, and an aryl group which may further have a substituent are preferred.

Here, examples of an introducible substituent include a methoxy carbonyl group, an ethoxy carbonyl group, anisopropioxy carbonyl group, a methyl group, an ethyl group, a phenyl group, and the like.

$A^1$ represents an oxygen atom, a sulfur atom, or —N($R^{21}$)— and X represents an oxygen atom, a sulfur atom, or —N($R^{22}$)—. Here, examples of $R^{21}$ and $R^{22}$ include an alkyl group.

$G^1$ represents a divalent organic group and is preferably an alkylene group. More preferred examples of $G^1$ include an alkylene group having 1 to 20 carbon atoms, a cycloalkylene group having 3 to 20 carbon atoms, an aromatic group having 6 to 20 carbon atoms, and the like and, among these, a linear or branched alkylene group having 1 to 10 carbon atoms, a cycloalkylene group having 3 to 10 carbon atoms, and an aromatic group having 6 to 12 carbon atoms are still more preferred in terms of performance such as strength and developing properties.

Here, the substituent in $G^1$ is preferably a hydroxyl group.

In General Formula (2-1), each of $R^7$ to $R^9$ independently represents a monovalent substituent. Examples of $R^7$ to $R^9$ include alkyl groups and the like which may further have a hydrogen atom and a sub stituent and, among these, $R^7$ and $R^8$ are preferably hydrogen atoms and $R^9$ is preferably a hydrogen atom or a methyl group.

Each of $R^{10}$ to $R^{12}$ independently represents a monovalent substituent. Examples of $R^{10}$ to $R^{12}$ include a hydrogen atom, a halogen atom, a dialkyl amino group, an alkoxy carbonyl group, a sulfo group, a nitro group, a cyano group, an alkyl group which may further have a substituent, an aryl group which may further have a substituent, an alkoxy group which may further have a substituent, an aryloxy group which may further have a substituent, an alkyl sulfonyl group which may further have a substituent, an aryl sulfonyl group which may further have a substituent, and the like and, among these, a hydrogen atom, an alkoxy carbonyl group, an alkyl group which may further have a sub stituent, and an aryl group which may further have a substituent are preferred.

Here, examples of an introducible substituent include the same substituents as represented by General Formula (1-1).

$A^2$ represents an oxygen atom, a sulfur atom, or —N($R^{21}$)— and examples of $R^{21}$ include a hydrogen atom, an alkyl group, and the like.

$G^2$ represents a divalent organic group and is preferably an alkylene group. More preferred examples of $G^2$ include an alkylene group having 1 to 20 carbon atoms, a cycloalkylene group having 3 to 20 carbon atoms, an aromatic group having 6 o 20 carbon atoms, and the like and, among these, a linear or branched alkylene group having 1 to 10 carbon atoms, a cycloalkylene group having 3 to 10 carbon atoms, and an aromatic group having 6 to 12 carbon atoms are still more preferred in terms of performance such as strength and developing properties. The substituent in $G^2$ is preferably a hydroxyl group.

Y represents an oxygen atom, a sulfur atom, —N($R^{23}$)—, or a phenylene group, and examples of $R^{23}$ include a hydrogen atom, an alkyl group, and the like.

In General Formula (3-1), each of $R^{13}$ to $R^{15}$ independently represents a monovalent substituent. Examples of $R^{13}$ to $R^{15}$ include a hydrogen atom, an alkyl group, and the like and, among these, $R^{13}$ and $R^{14}$ are preferably hydrogen atoms and $R^{15}$ is preferably a hydrogen atom or a methyl group.

Each of $R^{16}$ to $R^{20}$ independently represents a monovalent substituent. Examples of $R^{16}$ to $R^{20}$ include a hydrogen atom, a halogen atom, a dialkyl amino group, an alkoxy carbonyl group, a sulfo group, a nitro group, a cyano group, an alkyl group which may further have a substituent, an aryl group which may further have a substituent, an alkoxy group which may further have a substituent, an aryloxy group which may further have a substituent, an alkyl sulfonyl group which may further have a substituent, an aryl sulfonyl group which may further have a substituent, and the like and, among these, a hydrogen atom, an alkoxy carbonyl group, an alkyl group which may further have a sub stituent, and an aryl group which may further have a substituent are preferred. Examples of an introducible substituent include the same substituents as represented by General Formula (1).

$A^3$ represents an oxygen atom, a sulfur atom, or —N($R^{21}$)— and Z represents an oxygen atom, a sulfur atom, or —N($R^{22}$)—. Examples of $R^{21}$ and $R^{22}$ include the same alkyl groups as represented by General Formula (1).

$G^3$ represents a divalent organic group and is preferably an alkylene group. More preferred examples of $G^3$ include an alkylene group having 1 to 20 carbon atoms, a cycloalkylene group having 3 to 20 carbon atoms, an aromatic group having 6 to 20 carbon atoms, and the like and, among these, a linear or branched alkylene group having 1 to 10 carbon atoms, a cycloalkylene group having 3 to 10 carbon atoms, and an aromatic group having 6 to 12 carbon atoms are still more preferred in terms of performance such as strength and developing properties. The substituent in $G^3$ is preferably a hydroxyl group.

Regarding preferred examples of the configuration example having an ethylenic unsaturated bond and the acid group, the description of Paragraphs [0060] to [0063] and the like in JP2009-265518A can be referenced and the content thereof is incorporated into the specification of the present application by reference.

The acid value of the polymer having the acid group and an ethylenic unsaturated bond at the side chain is in a range of 20 mg-KOH/g to 300 mg-KOH/g, preferably in a range of 40 mg-KOH/g to 200 mg-KOH/g, and more preferably in a range of 60 mg-KOH/g to 150 mg-KOH/g.

The polymer having a polymerizable group at the side chain used in the present invention is also preferably a polymer having an ethylenic unsaturated bond and a urethane group at the side chain (hereinafter, in some cases, referred to as the "urethane polymer").

The urethane polymer is a urethane polymer having a structural unit represented by a reaction product between at least one of the diisocyanate compounds represented by General Formula (4) described below and at least one of the diol compounds represented by General Formula (5) as a basic skeleton (hereinafter, in some cases, appropriately referred to as the "specific polyurethane polymer").

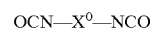    General Formula (4)

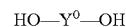    General Formula (5)

In General Formulae (4) and (5), each of $X^0$ and $Y^0$ independently represents a divalent organic residue.

When at least any one of the diisocyanate compound represented by General Formula (4) and the diol compound represented by General Formula (5) has at least one of the groups represented by General Formulae (1) to (3) which illustrate the above-described unsaturated double bond portions, the specific polyurethane polymer in which the group represented by one of General Formulae (1) to (3) is introduced into the side chain is generated as a reaction product between the diisocyanate compound and the diol compound. According to the above-described method, it is also possible to easily produce the specific polyurethane polymer according to the present invention by substituting and introducing a desired side chain after the reaction and generation of the polyurethane polymer.

1) Diisocyanate Compound

Examples of the diisocyanate compound represented by General Formula (4) include products obtained through an addition reaction between a triisocyanate compound and 1 equivalent weight of a monofunctional alcohol or a monofunctional amine compound which has an unsaturated group.

Regarding the triisocyanate compound, for example, the compounds described in Paragraphs [0099] to [0105] and the like in JP2009-265518A can be referenced and the content thereof is incorporated into the specification of the present application by reference.

Here, a method for introducing the unsaturated group into the side chain of the polyurethane polymer is preferably a method in which a diisocyanate compound having an unsaturated group at the side chain is used as a raw material for producing the polyurethane polymer. Regarding the diisocyanate compound which can be obtained by an addition reaction between a triisocyanate compound and 1 equivalent weight of a monofunctional alcohol or monofunctional amine compound having an unsaturated group and has an unsaturated group at the side chain, for example, the compounds described in Paragraphs [0107] to [0114] in JP2009-265518A can be referenced and the content thereof is incorporated into the specification of the present application by reference.

As the specific polyurethane polymer used in the present invention, it is possible to copolymerize diisocyanate compounds other than the above-described diisocyanate compound having an unsaturated group from the viewpoint of, for example, improving compatibility with other components in the polymerizing composition and improving preservation stability.

Examples of the diisocyanate compounds being copolymerized include the following compounds. A preferred compound is a diisocyanate compound represented by General Formula (6) described below.

OCN-L$^1$-NCO     General Formula (6)

In Formula (6), L$^1$ represents a divalent aliphatic or aromatic hydrocarbon group. If necessary, L$^1$ may include other functional groups that do not react with an isocyanate group, for example, an ester, urethane, an amide, or an ureido group.

Specific examples of the diisocyanate compound represented by General Formula (6) include compounds described below:

aromatic diisocyanate compounds such as 2,4-tolylenediisocyante, dimers of 2,4-tolylenediisocyante, 2,6-tolylenediisocyanate, p-xylenediisocyanate, m-xylenediisocyanate, 4,4'-diphenylmethanediisocyanate, 1,5-naphthylenediisocyanate, and 3,3 -dimethylbiphenyl-4,4'-diisocyante;

aliphatic diisocyante compounds such as hexamethylene diisocyanate, trimethyl hexamethylenediisocyanate, lysine diisocyanate, and dimer acid diisocyanate;

alicyclic diisocyanate compounds such as isophorone diisocyanate, 4,4'-methylene bis(cyclohexylisocyanate), methylcyclohexane-2,4(or 2,6) diisocyanate, and 1,3-(isocyanate methyl)cyclohexane; diisocyanate compounds which are reactants between a diol and diisocyante such as an adduct of 1 mol of 1,3-butylene glycol and 2 mol of tolylene diisocyanate; and the like.

2) Diol Compound

Examples of the diol compound represented by General Formula (5) broadly include polyether diol compounds, polyester diol compounds, polycarbonate diol compounds, and the like.

Here, a method for introducing the unsaturated group into the side chain of the polyurethane polymer is also preferably, in addition to the above-described method, a method in which a diol compound having an unsaturated group at the side chain is used as a raw material for producing the polyurethane polymer. The above-described diol compound may be, for example, a commercially available diol compound such as trimethylol propane monoallyl ether or may be a compound that is easily produced by reacting a halogenated diol compound, a triol compound, or an amino diol compound and carboxylic acid having an unsaturated group, an acid chloride, isocyanate, an alcohol, an amine, a thiol, or a halogenated alkyl compound. Regarding specific examples of the above-described compound, the compounds described in Paragraphs [0122] to [0125] and the like in JP2009-265518A can be referenced and the content thereof is incorporated into the specification of the present application by reference.

In addition, examples of a more preferred polymer in the present invention include polyurethane resins obtained using a diol compound represented by General Formula (G) as at least one of the diol compounds having an ethylenic unsaturated bond group when the polyurethane is synthesized.

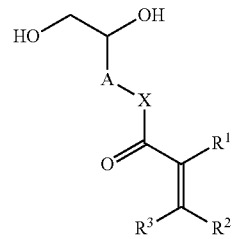

General Formula (G)

In General Formula (G), each of R$^1$ to R$^3$ independently represents a hydrogen atom or a monovalent organic group, A represents a divalent organic residue, X represents an oxygen atom, a sulfur atom, or —N(R$^{12}$)—, and R$^{12}$ represents a hydrogen atom or a monovalent organic group.

Meanwhile, R$^1$ to R$^3$ and X in General Formula (G) are identical to R$^1$ to R$^3$ and X in General Formula (1) and the preferred range is also identical.

When the polyurethane polymer derived from the above-described diol compound is used, the excessive molecular movement of the polymer main chain caused by a secondary alcohol having a great steric hindrance is suppressed. Therefore, it is considered that the above-described polyurethane polymer is capable of improving the film strength of layers.

Regarding specific examples of the diol compound represented by General Formula (G) which is preferably used for the synthesis of the specific polyurethane polymer, the compounds described in Paragraphs [0129] to [0131] and the like in JP2009-265518A can be referenced and the content thereof is incorporated into the specification of the present application by reference.

As the specific polyurethane polymer used in the present invention, it is possible to copolymerize diol compounds other than the above-described diol compound having an unsaturated group from the viewpoint of, for example, improving compatibility with other components in the polymerizing composition and improving preservation stability.

Examples of the above-described diol compounds include polyether diol compounds, polyester diol compounds, and polycarbonate diol compounds described above.

Examples of the polyether diol compounds include compounds represented by Formulae (7), (8), (9), (10), and (11) and random copolymers of an ethylene oxide having a hydroxyl group at the terminal and propylene oxide.

(7)

-continued

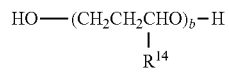 (8)

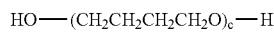 (9)

H—(CH$_2$CH$_2$O)$_d$—(CH$_2$CHO)$_e$—(CH$_2$CH$_2$O)$_d$—H (10)
　　　　　　　　　　　|
　　　　　　　　　　CH$_3$

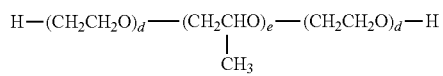 (11)

In Formulae (7) to (11), R$^{14}$ represents a hydrogen atom or a methyl group and X$^1$ represents the following group. In addition, each of a, b, c, d, e, f, and g represents an integer from 2 or more and each is preferably an integer from 2 to 100.

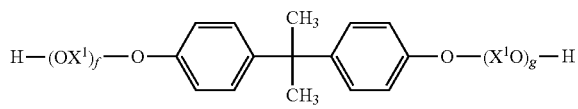

Regarding the polyether diol compounds represented by General Formulae (7) to (11), specifically, the compounds described in Paragraphs [0137] to [0140] and the like in JP2009-265518A can be referenced and the content thereof is incorporated into the specification of the present application by reference.

Specific examples of the random copolymers of an ethylene oxide having a hydroxyl group at the terminal and propylene oxide include the following copolymers.

The examples are NEWPOL (trade name) 50HB-100, NEWPOL 50HB-260, NEWPOL 50HB-400, NEWPOL 50HB-660, NEWPOL 50HB-2000, NEWPOL 50HB-5100, which are manufactured by Sanyo Chemical Industries, Ltd., and the like.

Examples of the polyester diol compounds include compounds represented by Formulae (12) and (13).

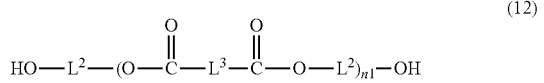 (12)

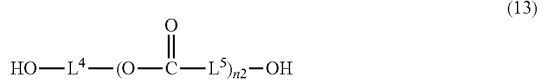 (13)

In Formulae (12) and (13), L$^2$, L$^3$, and L$^4$ may be identical to or different from each other and represent divalent aliphatic or aromatic hydrocarbon groups, and L$^5$ represents a divalent aliphatic hydrocarbon group. Preferably, each of L$^2$ to L$^4$ represents an alkylene group, an alkenyl group, an alkylene group, or an arylene group and L$^5$ represents an alkylene group. In addition, in L$^2$ to L$^5$, other functional groups that do not react with the isocyanate group, for example, ethers, carbonyl, esters, cyano, olefins, urethane, amides, ureido groups or halogen atoms may be present. Each of n1 and n2 is an integer of 2 or more and each is preferably an integer from 2 to 100.

The polycarbonate diol compound is a compound represented by Formula (14).

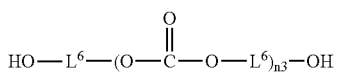 (14)

In Formula (14), L$^6$s may be identical to or different from each other and represent divalent aliphatic or aromatic hydrocarbon groups. Preferably, each of the L$^6$s represents an alkylene group, an alkenyl group, an alkylene group, or an arylene group. In addition, in L$^6$, other functional groups that do not react with the isocyanate group, for example, ethers, carbonyl, esters, cyano, olefins, urethane, amides, ureido groups or halogen atoms may be present. n3 is an integer of 2 or more and is preferably an integer from 2 to 100.

Regarding specific diol compounds represented by General Formula (12), (13), or (14), the compounds described in Paragraphs [0148] to [0150] and the like in JP2009-265518A can be referenced and the content thereof is incorporated into the specification of the present application by reference.

In addition, for the synthesis of the specific polyurethane polymer, it is also possible to jointly use a diol compound having a substituent that does not react with the isocyanate group in addition to the above-described diol compound. Examples of the above-described diol compound include compounds described below.

 (15)

 (16)

In Formulae (15) and (16), L$^7$ and L$^8$ may be identical to or different from each other and represent divalent aliphatic hydrocarbon groups, aromatic hydrocarbon groups, or heterocyclic groups which may have a substituent (for example, an alkyl group, an aralkyl group, an aryl group, an alkoxy group, an aryloxy group, or individual groups of halogen atoms such as —F, —Cl, —Br, and —I). If necessary, in L$^7$ and L$^8$, other functional groups that do not react with the isocyanate group, for example, a carbonyl group, an ester group, an urethane group, an amide group, and an ureido group may be present. Meanwhile, L$^7$ and L$^8$ may form a ring.

Furthermore, for the synthesis of the specific polyurethane polymer, it is also possible to jointly use a diol compound having a carboxyl group in addition to the diol compound.

Examples of the above-described diol compound include compounds represented by Formulae (17) to (19) described below.

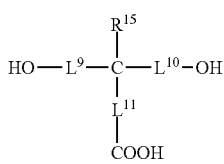 (17)

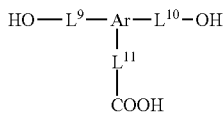 (18)

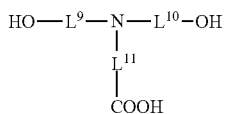

(19)

In Formulae (17) to (19), $R^{15}$ represents an alkyl group, an aralkyl group, an aryl group, an alkoxy group, or an aryloxy group which may have a substituent (for example, a cyano group, a nitro group, or individual groups of halogen atoms such as —F, —Cl, —Br, and —I, —CONH$_2$, —COOR$^{16}$, —OR$^{16}$, —NHCONHR$^{16}$, —NHCOOR$^{16}$, —NHCOR$^{16}$, —OCONHR$^{16}$ (here, $R^{16}$ represents an alkyl group having 1 to 10 carbon atoms or an aralkyl group having 7 to 15 carbon atoms)) and preferably represents a hydrogen atom, an alkyl group having 1 to 8 carbon atoms, or an aryl group having 6 to 15 carbon atoms. $L^9$, $L^{10}$, and $L^{11}$ may be identical to or different from each other. $L^9$, $L^{10}$, and $L^{11}$ represent single bonds or divalent aliphatic or aromatic hydrocarbon groups which may have a substituent (for example, individual groups such as alkyl groups, aralkyl groups, aryl groups, alkoxy groups, and halogen groups are preferred), preferably represent alkyl groups having 1 to 20 carbon atoms or arylene group having 6 to 15 carbon atoms, and more preferably represent alkylene groups having 1 to 8 carbon atoms. In addition, if necessary, in $L^9$ to $L^{11}$, other functional groups that do not react with the isocyanate group, for example, carbonyl, esters, urethane, amides, or ether groups may be present. Meanwhile, two or three out of $R^{15}$, $L^7$, $L^8$, and $L^9$ may form a ring.

Ar represents a trivalent aromatic hydrocarbon group and preferably represents an aromatic group having 6 to 15 carbon atoms.

Specific examples of the diol compound having a carboxyl group represented by Formulae (17) to (19) include the following compounds.

The examples are 3,5-dihydroxy benzoate, 2,2-bis(hydroxymethyl)propionate, 2,2-bis(2-hydroxyethyl)propionate, 2,2-bis(3-hydroxypropyl)propionate, bis(hydroxymethyl)acetate, bis(4-hydroxyphenyl)acetate, 2,2-bis(hydroxymethyl)acetate, 4,4-bis(4-hydroxyphenyl)pentanoate, tartaric acid, N,N-dihydroxyethyl glycine, N,N-bis(2-hydroxyethyl)-3-carboxy-propionamide, and the like.

The presence of the above-described carboxyl group is capable of imparting characteristics such as hydrogen-bonding properties and alkali-soluble properties to the polyurethane polymer and is thus preferred. Specifically, the polyurethane polymer having an ethylenic unsaturated bond at the side chain further has a carboxyl group at the side chain. More specifically, the polyurethane polymer having 0.3 meq/g or more of an ethylenic unsaturated bond group at the side chain and having 0.4 meq/g or more of a carboxyl group at the side chain is particularly preferably used as a binder polymer of the present invention.

In addition, for the synthesis of the specific polyurethane polymer, it is also possible to jointly use a compound in which a tetracarboxylic dianhydride represented by Formulae (20) to (22) described below is ring-opened using a diol compound in addition to the diol compound.

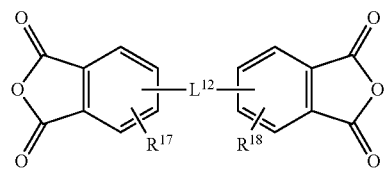

(20)

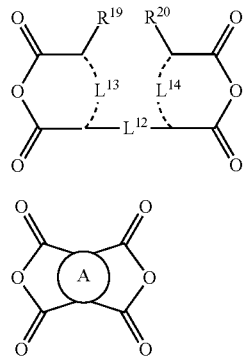

(21)

(22)

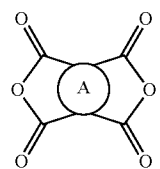

In Formulae (20) to (22), $L^{12}$ represent a single bonds, a divalent aliphatic or aromatic hydrocarbon group which may have a substituent (for example, alkyl groups, aralkyl groups, aryl groups, alkoxy groups, and individual groups of halogens, esters, and amides are preferred), —CO—, —SO—, —SO$_2$—, —O—, or —S— and preferably represent a single bonds, a divalent aliphatic hydrocarbon group having 1 to 15 carbon atoms, —CO—, —SO$_2$—, —O—, or S—. $L^{17}$ and $L^{18}$ may be identical to or different from each other and represent hydrogen atoms, alkyl groups, aralkyl groups, aryl groups, alkoxy groups, or halogen groups and preferably represent hydrogen atoms, alkyl groups having 1 to 8 carbon atoms, aryl groups having 6 to 15 carbon atoms, alkoxy groups having 1 to 8 carbon atoms, or halogen groups. In addition, two out of $L^{12}$, $R^{17}$, and $R^{18}$ may be bonded to each other so as to form a ring.

$R^{19}$ and $R^{20}$ may be identical to or different from each other and represent hydrogen atoms, alkyl groups, aralkyl groups, aryl groups, or halogen groups and preferably represents hydrogen atoms, alkyl groups having 1 to 8 carbon atoms, or aryl groups having 6 to 15 carbon atoms. In addition, two out of $L^{12}$, $R^{19}$, and $R^{20}$ may be bonded to each other so as to form a ring. $L^{13}$ and $L^{14}$ may be identical to or different from each other, represent single bonds, double bonds, or divalent aliphatic hydrocarbon groups, and preferably represent single bonds, double bonds, or methylene groups. A represents a mononuclear or polynuclear aromatic ring and preferably represents an aromatic ring having 6 to 18 carbon atoms.

Regarding compounds represented by General Formula (20), (21), or (22), specifically, the description of Paragraphs [0163] and [0164] and the like in JP2009-265518A can be referenced and the content thereof is incorporated into the specification of the present application by reference.

Regarding a method for introducing a compound in which the above-described tetracarboxylic dianhydride is ring-opened using a diol compound into the polyurethane polymer, examples thereof include the following methods.

a) A method in which a compound at the alcohol terminal obtained by ring-opening tetracarboxylic dianhydride using a diol compound and a diisocyanate compound are reacted together.

b) A method in which a urethane compound at the alcohol terminal obtained by reacting diisocyanate compounds under conditions of an excessive amount of a diol compound and are tetracarboxylic dianhydride reacted together.

Regarding the diol compound used in the ring-opening reaction at this time, specifically, the description of Paragraphs [0166] and the like in JP2009-265518A can be referenced and the content thereof is incorporated into the specification of the present application by reference.

The specific polyurethane polymer that can be used in the present invention is synthesized by heating the diisocyanate compound and the diol compound in a non-protonic solvent after the addition of a well-known catalyst having activity in accordance with the reactivity of the components. The molar ratio ($M_a:M_b$) between the diisocyanate compound and the diol compound used in the synthesis is preferably in a range of 1:1 to 1.2:1. When the diisocyanate compound and the diol compound used in the synthesis are treated using an alcohol, an amine, or the like, a product having desired properties such as molecular weight or viscosity is synthesized in a form in which an isocyanate group does not remain in the end.

Regarding the introduced amount of the ethylenic unsaturated bond included in the specific polyurethane polymer according to the present invention, the amount of the ethylenic unsaturated bond group included at the side chain is preferably 0.3 meq/g or more and more preferably in a range of 0.35 meq/g to 1.50 meq/g in terms of equivalent weight.

The molecular weight of the specific polyurethane polymer according to the present invention is preferably 10,000 or more and more preferably in a range of 40,000 to 200,000 in terms of weight-average molecular weight.

In the present invention, a styrene-based polymer having an ethylenic unsaturated bond at the side chain (hereinafter, in some cases, referred to as "styrene-based polymer") is also preferred and a styrene-based polymer having at least one of the styrenic double bonds represented by General Formula (23) (styrene and α methyl styrene-based double bond) and vinylpyridinium groups represented by General Formula (24) is more preferred.

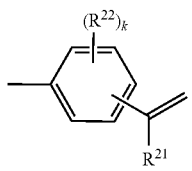

General Formula (23)

In General Formula (23), $R^{21}$ represents a hydrogen atom or a methyl group. $R^{22}$ represents an arbitrary substitutable atom or atomic group. k represents an integer from 0 to 4.

Meanwhile, the styrenic double bond represented by General Formula (23) is linked to the polymer main chain through a single bond or a linking group made of an arbitrary atom or atomic group and there is no particular limitation regarding the manner of bonding.

Regarding preferred examples of the repeating unit of a macromolecular compound having a functional group represented by General Formula (23), the description of Paragraphs [0179] to [0181] and the like in JP2009-265518A can be referenced and the content thereof is incorporated into the specification of the present application by reference.

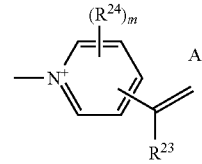

General Formula (24)

In General Formula (24), $R^{23}$ represents a hydrogen atom or a methyl group. $R^{24}$ represents an arbitrary substitutable atom or atomic group. m represents an integer from 0 to 4. $A^-$ represents an anion. In addition, a pyridinium ring may have a benzopyridium form in which a benzene ring is condensed as a substituent and, in this case, the pyridinium ring has a quinolinium group and an isoquinolinium group.

Meanwhile, the vinylpyridinium group represented by General Formula (24) is linked to the polymer main chain through a single bond or a linking group made of an arbitrary atom or atomic group and there is no particular limitation regarding the manner of bonding.

Regarding preferred examples of the repeating unit of a macromolecular compound having a functional group represented by General Formula (24), the description of Paragraphs [0184] and the like in JP2009-265518A can be referenced and the content thereof is incorporated into the specification of the present application by reference.

As a method for synthesizing the styrene-based polymer, there is a method in which monomers which have a functional group represented by General Formula (23) or (24) and have a functional group capable of copolymerizing other copolymerization components are copolymerized using a well-known copolymerization method. Here, the styrene-based polymer may be a homopolymer having only one kind of any one of the functional groups represented by General Formulae (23) and (24) or a copolymer having two or more kinds of either or both functional groups.

Furthermore, the styrene-based polymer may also be a copolymer with another copolymerization monomer that does not include the above-described functional group. In this case, for example, for the purpose of making the polymer soluble in an alkali aqueous solution, a carboxyl group-containing monomer is preferably selected as the copolymerization monomer and examples thereof include acrylic acid, methacrylic acid, 2-carboxyethyl acrylate ester, 2-carboxyethyl methacrylate ester, crotonic acid, maleic acid, fumaric acid, monoalkyl maleate ester, monoalkyl fumarate ester, 4-carboxystyrene, and the like.

It is also preferable to synthesize and use a (multicomponent) copolymer by introducing a monomer component other than the monomer having a carboxyl group into the copolymer. Regarding monomers that can be incorporated into the copolymer in this case, the description of Paragraphs [0187] and the like in JP2009-265518A can be referenced and the content thereof is incorporated into the specification of the present application by reference.

In a case in which the above-described copolymer is used as the styrene-based polymer, the fraction of the repeating unit having the functional group represented by General Formula (23) and/or General Formula (24) in the total copolymer composition is preferably 20% by mass or more and more preferably 40% by mass or more. In the above-described range, a high-sensitivity crosslinked composition can be obtained.

The molecular weight of the styrene-based polymer is preferably in a range of 10,000 to 300,000, more preferably in a range of 15,000 to 200,000, and most preferably in a range of 20,000 to 150,000 in terms of weight-average molecular weight.

Additional examples of the polymer having an ethylenic unsaturated bond at the side chain are as described below.

Examples of a novolac polymer having an ethylenic unsaturated group at the side chain include the polymers described in JP1997-269596A (JP-H9-269596A), polymers in which an ethylenic unsaturated bond is introduced into the side chain using the method described in JP2002-62648A, and the like.

In addition, examples of an acetal polymer having an ethylenic unsaturated bond at the side chain include the polymers described in JP2002-162741A and the like.

Furthermore, examples of a polyamide-based polymer having an ethylenic unsaturated bond at the side chain include the polymers described in JP2003-321022, polymers in which an ethylenic unsaturated bond is introduced into the side chain of a polyamide polymer cited in the above-described polymers using the method described in JP2002-62648A, and the like.

Examples of a polyimide polymer having an ethylenic unsaturated bond at the side chain include the polymers described in JP2003-339785A, polymers in which an ethylenic unsaturated bond is introduced into the side chain of a polyimide polymer cited in the above-described polymers using the method described in JP2002-62648A, and the like.

<<C: Compound Having Epoxy Group or Oxetanyl Group>>

A third preferred aspect of the present invention includes a compound having an epoxy group or an oxetanyl group as the polymerizing compound. Examples of the compound having an epoxy group or an oxetanyl group include polymers having an epoxy group at the side chain and polymerizing monomers or oligomers having two or more epoxy groups in the molecule and specific examples thereof include bisphenol A-type epoxy resins, bisphenol F-type epoxy resins, phenol novolac-type epoxy resins, cresol novolac-type epoxy resins, aromatic epoxy resins, and the like. A monofunctional or polyfunctional glycidyl ether compound can also be used as the compound having an epoxy group or an oxetanyl group and a polyfunctional aliphatic glycidyl ether compound is preferred.

As the above-described compound, a commercially available product may be used or the compound can be obtained by introducing an epoxy group into the side chain in the polymer.

Regarding the commercially available product, for example, the description of Paragraphs [0191] and the like in JP2012-155288A can be referenced and the content thereof is incorporated into the specification of the present application by reference.

Examples of the commercially available product include polyfunctional aliphatic glycidyl ether compounds such as DENACOL EX-212L, EX-214L, EX-216L, EX-321L, and EX-850L (all manufactured by Nagase ChemteX Corporation). The above-described products are low-chlorine products and EX-212, EX-214, EX-216, EX-321, EX-850, and the like, which are not low-chlorine products, can also be used in a similar manner.

Additionally, examples thereof include ADEKA RESIN EP-4000S, ADEKA RESIN EP-4003S, ADEKA RESIN EP-4010S, ADEKA RESIN EP-4011S (all manufactured by Adeka Corporation), NC-2000, NC-3000, NC-7300, XD-1000, EPPN-501, EPPN-502 (all manufactured by Adeka Corporation), JER1031S, and the like.

Furthermore, examples of the commercially available product of the phenol novolac-type epoxy resins include JER-157565, JER-152, JER-154, JER-157570 (all manufactured by Mitsubishi Chemical Corporation), and the like.

As a specific example of a polymer having an oxetanyl group at the side chain and the above-described polymerizing monomer or oligomer having two or more oxetanyl groups in the molecule, it is possible to use ARON OXETANE OXT-121, OXT-221, OX-SQ, and PNOX (all manufactured by Toagosei Co., Ltd.).

In a case in which the compound is synthesized by introducing an epoxy group into the side chain in the polymer, the introduction reaction can be carried out by causing a reaction in an organic solvent at a reaction temperature in a range of 50° C. to 150° C. for several hours to several tens of hours using, for example, a ternary amine such as trimethylamine or benzylmethylamine, a quaternary ammonium salt such as dodecyl trimethyl ammonium chloride, tetramethyl ammonium chloride, or tetraethyl ammonium chloride, pyridine, or triphenylphosphine as a catalyst. The introduced amount of an alicyclic epoxy unsaturated compound is preferably controlled so that the acid value of the obtained polymer falls in a range of 5 KOH·mg/g to 200 KOH·mg/g. In addition, the weight-average molecular weight is in a range of 500 to 5,000,000 and, furthermore, preferably in a range of 1000 to 500,000.

As the epoxy unsaturated compound, it is also possible to use a compound having a glycidyl group as an epoxy group such as glycidyl (meth)acrylate or allyl glycidyl ether. A preferred example of the epoxy unsaturated compound is an unsaturated compound having an alicyclic epoxy group. Regarding the above-described unsaturated compound, the description of Paragraphs [0045] and the like in JP2009-265518A and the like can be referenced and the content thereof is incorporated into the specification of the present application by reference.

For the above-described polymerizing compounds, the details of the structure and the use method such as whether the polymerizing compounds are used singly or jointly and the amount added can be arbitrarily designed in accordance with the final performance design of the near-infrared-absorbing composition. For example, from the viewpoint of sensitivity, a structure having a large content of an unsaturated group in one molecule is preferred and, in many cases, a di- or more-functional compound is preferred. From the viewpoint of increasing the strength of the near-infrared cut-off filter, a tri- or more-functional compound is preferred. When compounds having different functional groups and different polymerizable groups (for example, acrylic acid esters, methacrylic acid esters, styrene-based compounds, or vinyl ether-based compounds) are jointly used, it is also effective to adjust both sensitivity and strength. Regarding the compatibility with other components included in the near-infrared-absorbing composition (for example, metal oxides, pigments, and polymerization initiators) and dispersibility as well, the selection and use method of the polymerizing compound are important factors and, for example, when a low-purity compound is used or two or more compounds are jointly used, compatibility can be improved. In addition, from the viewpoint of improving adhesiveness to the curable surface of a supporter or the like, it is also possible to select a specific structure.

The amount of the curable compound added to the composition of the present invention is in a range of 1% by mass to 80% by mass, more preferably in a range of 5% by mass to 50% by mass, and particularly preferably in a range of 7% by mass to 40% by mass in relation to the total solid content excluding the solvent.

The number of the polymerizing compounds may be one or more and, in a case in which two or more polymerizing compounds are used, the total amount thereof needs to fall into the above-described range.

<Binder Polymer>

The present invention may include a binder polymer as necessary in addition to the above-described polymerizing compound for the purpose of improving coat characteristics. As the binder polymer, an alkali-soluble resin is preferably used. When the present invention includes an alkali-soluble resin, heat resistance and the like are improved and coating aptitude can be finely adjusted.

Regarding the alkali-soluble resin, the description in Paragraphs [0558] to [0571] (Paragraphs [0685] to [0700] in the specification of the corresponding US2012/0235099A) and thereafter in JP2012-208494A can be referenced and the content thereof is incorporated into the specification of the present application by reference.

The content of the binder polymer in the present invention is preferably in a range of 1 mass % to 80 mass %, more preferably in a range of 5 mass % to 50 mass %, and still more preferably in a range of 7 mass % to 30 mass % in relation to the total solid content of the composition.

<Surfactant>

The composition of the present invention may include a surfactant. Only one surfactant may be used or a combination of two or more surfactants may be used. The amount of the surfactant added is preferably in a range of 0.0001% by mass to 2% by mass, more preferably in a range of 0.005% by mass to 1.0% by mass, and still more preferably in a range of 0.01% by mass to 0.1% by mass in relation to the solid content of the composition of the present invention.

As the surfactant, a variety of surfactants such as a fluorine-based surfactant, a nonionic surfactant, a cationic surfactant, an anionic surfactant, and a silicone-based surfactant can be used.

Particularly, when the composition of the present invention includes at least any of fluorine-based surfactants and silicone-based surfactants, the liquid characteristics (particularly, fluidity) are further improved when a coating fluid is produced. Therefore, the uniformity of the coating thickness or liquid-saving properties is further improved.

That is, in a case in which a film is formed using a coating fluid to which the composition including at least any one of fluorine-based surfactants and silicone-based surfactants is applied, the surface tension between a surface to be coated and the coating fluid decreases and thus the wetting properties to the surface to be coated improve and the coating properties to the surface to be coated improve. Therefore, in a case in which a thin film having a thickness of approximately several micrometers is formed using a small amount of the fluid as well, the inclusion of the surfactant is effective since a film having a uniform thickness with little thickness variation is more preferably formed.

The content ratio of fluorine in the fluorine-based surfactant is preferably in a range of 3% by mass to 40% by mass, more preferably in a range of 5% by mass to 30% by mass, and particularly preferably in a range of 7% by mass to 25% by mass. A fluorine-based surfactant having a content ratio of fluorine in the above-described range is effective in terms of the uniformity of the thickness of a coated film or liquid-saving properties and also has favorable solubility in the near-infrared absorbing composition.

Examples of the fluorine-based surfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F479, MEGAFAC F482, MEGAFAC F554, MEGAFAC F780, MEGAFAC R08 (all manufactured by DIC Corporation), FLORADO FC430, FLORADO FC431, FLORADO FC171 (all manufactured by Sumitomo 3M Limited), SAFLON S-382, SAFLON S-141, SAFLON S-145, SAFLON SC-101, SAFLON SC-103, SAFLON SC-104, SAFLON SC-105, SAFLON SC1068, SAFLON SC-381, SAFLON SC-383, SAFLON S393, SAFLON H-40 (all manufactured by Asahi Glass Co., Ltd.), EFTOP EF301, EFTOP EF303, EFTOP EF351, EFTOP EF352 (all manufactured by Jemco Inc.), PF636, PF656, PF6320, PF6520, PF7002 (manufactured by OMNOVA Solutions Inc.), and the like.

As the fluorine-based surfactant, a polymer having a fluoroaliphatic group is also preferred. Examples of the polymer having a fluoroaliphatic group include fluorine-based surfactants obtained from fluoroaliphatic compounds which have a fluoroaliphatic group which is manufactured using a telomerization method (also called a telomer method) or an oligomerization method (also called an oligomer method).

Here, the "telomerization method" refers to a method for synthesizing a compound having 1 or 2 active groups in the molecule by polymerizing low-molecular-weight substances. In addition, the "oligomerization method" refers to a method for converting a monomer or a mixture of monomers to an oligomer.

Examples of the fluoroaliphatic group in the present invention include —$CF_3$ group, —$C_2F_5$ group, —$C_3F_7$ group, —$C_4F_9$ group, —$C_5F_{11}$ group, —$C_6F_{13}$ group, —$C_7F_{15}$ group, —$C_8F_{17}$ group, $C_9F_{19}$ group, and $C_{10}F_{21}$ group and, in terms of compatibility and coating properties, —$C_2F_5$ group, —$C_3F_7$ group, —$C_4F9$ group, —$C_5F_{11}$ group, —$C_6F_{13}$ group, —$C_7F_{15}$ group, and —$C_8F_{17}$ group are preferred.

The fluoroaliphatic compound in the present invention can be synthesized using the method described in JP2002-90991A.

The polymer having the fluoroaliphatic group in the present invention is preferably a copolymer of a monomer having the fluoroaliphatic group in the present invention and (poly(oxyalkylene)acrylate and/or (poly(oxyalkylene)) methacrylate. The copolymer may be irregularly distributed or block-copolymerized. In addition, examples of the poly (oxyalkylene) group include a poly(oxyethylene) group, a poly(oxypropylene) group, a poly(oxybutylene) group, and the like and the poly(oxyalkylene) group may be a unit having alkylenes having different chain lengths in the same chain length such as a poly(a block-linked body of oxyethylene, oxypropylene, and oxyethylene) group or a poly (block-linked body of oxyethylene, oxypropylene, and oxyethylene) group. Furthermore, the copolymer of a monomer having the fluoroaliphatic group and (poly(oxyalkylene)) acrylate (or methacrylate) may be not only a two-component copolymer but also a three or more-component copolymer of monomers having two different kinds of fluoroaliphatic groups or two different kinds of (poly(oxyalkylene))acrylate (or methacrylate).

Examples of commercially available surfactants including the polymer having the fluoroaliphatic group in the present invention include the surfactants described in Paragraph [0552] in JP2012-208494A ([0678] in the specification of US2012/0235099) and the content thereof is incorporated into the specification of the present application. In addition, it is possible to use a copolymer MEGAFAC F-781 (manufactured by DIC Corporation), acrylate (or methacrylate) having a $C_6F_{13}$ group, (poly(oxyethylene))acrylate (or methacrylate), and (poly(oxypropylene))acrylate (or methacrylate), a copolymer of acrylate (or methacrylate) having a $C_5F_{17}$ group and (poly(oxyalkylene))acrylate (or methacrylate), a copolymer of acrylate (or methacrylate) having a $C_8F_{17}$ group, (poly(oxyethylene))acrylate (or methacrylate), and (poly(oxypropylene))acrylate (or methacrylate), or the like.

Examples of nonionic surfactants include polyoxyethylene alkyl ethers, polyoxyethylene alkyl allyl ethers, polyoxyethylene aliphatic acid esters, sorbitan aliphatic esters, polyoxyethylene sorbitan aliphatic acid esters, polyoxyethylene alkyl amines, glycerin aliphatic acid esters, oxyethyleneoxy propylene block copolymers, acetylene glycol-based surfactants, acetylene-based polyoxyethylene oxides, and the like. The above-described surfactants can be used singly or two or more surfactants can be used.

Examples of specific commercially available products thereof include SURFYNOL 61, 82, 104, 104E, 104H, 104A, 104BC, 104DPM, 104PA, 104PG-50, 104S, 420, 440, 465, 485, 504, CT-111, CT-121, CT-131, CT-136, CT-141, CT-151, CT-171, CT-324, DF-37, DF-58, DF-75, DF-110D, DF-210, GA, OP-340, PSA-204, PSA-216, PSA-336, SE, SE-F, TG GA, DYNOL 604 (all manufactured by Nissin Chemical Co., Ltd. and Air Products & Chemicals, Inc.), OLFIN A, B, AK-02, CT-151W, E1004, E1010, P, SPC, STG, Y, 32W, PD-001, PD-002W, PD-003, PD-004, EXP. 4001, EXP. 4036, EXP. 4051, AF-103, AF-104, SK-14, AE-3 (all manufactured by Nissin Chemical Co., Ltd.), ACETYLENOL E00, E13T, E40,E60, E81, E100, E200 (all are trade names and are manufactured by Kawaken Fine Chemicals Co., Ltd.), and the like. Among these, OLFIN E1010 is preferred.

Additionally, regarding the nonionic surfactants, specifically, the nonionic surfactants described in Paragraph [0553] in JP2012-208494A ([0679] in the specification of the corresponding US2012/0235099) can be referenced and the contents thereof can be incorporated into the specification of the present application by reference.

Specific examples of cationic surfactants include the cationic surfactants described in Paragraph [0554] in JP2012-208494A ([0680] in the specification of the corresponding US2012/0235099) and the contents thereof can be incorporated into the specification of the present application by reference.

Specific examples of the anionic surfactants include W004, W005, W017 (manufactured by Yusho Co., Ltd.), and the like.

Examples of silicone-based surfactants include the silicone-based surfactants described in Paragraph [0556] in JP2012-208494A ([0682] in the specification of the corresponding US2012/0235099) and the contents thereof can be incorporated into the specification of the present application by reference. In addition, examples thereof also include "TORAY SILICONE SF8410", "TORAY SILICONE SF8427", TORAY SILICONE SF8400", "ST80PA", "ST83PA", "ST86PA" all manufactured by Dow Corning Toray Co., Ltd., "TSF-400", "TSF-401", "TSF-410", "TSF-4446" manufactured by Momentive Performance Materials Worldwide Inc., "KP321", "KP323", "KP324", "KP340" manufactured by Shin-Etsu Chemical Co., Ltd. and the like.

<Polymerization Initiator>

The composition of the present invention may include a polymerization initiator. The number of the polymerization initiators included may be one or more and, in a case in which the composition includes two or more polymerization initiators, the total amount thereof falls into the following range. The content of the polymerization initiator is preferably in a range of 0.01% by mass to 30% by mass, more preferably in a range of 0.1% by mass to 20% by mass, and particularly preferably in a range of 0.1% by mass to 15% by mass.

The polymerization initiator is not particularly limited as long as the polymerization initiator has the capability of initiating the polymerization of the polymerizing compounds using either or both light and heat and can be appropriately selected depending on the purpose. Among these, the polymerization initiator is preferably a photopolymerizing compound. In a case in which polymerization is initiated using light, the polymerization initiator preferably has photosensitivity to light rays in an ultraviolet to visible light range.

In addition, in a case in which polymerization is initiated using heat, a polymerization initiator that is decomposed at a temperature in a range of 150° C. to 250° C. is preferred.

The polymerization initiator that can be used in the present invention is preferably a compound having at least an aromatic group and examples thereof include acylphosphine compounds, acetophenone-based compounds, α-aminoketone compounds, benzophenone-based compounds, benzoin ether-based compounds, ketal derivative compounds, thioxanthone compounds, oxime compounds, hexaaryl biimidazole compounds, trihalomethyl compounds, azo compounds, organic peroxides, onium salt compounds such as diazonium compounds, iodonium compounds, sulfonium compounds, azinium compounds, benzoin ether-based compounds, ketal derivative compounds, and metallocene compunds, organic borate compounds, disulfo compounds, thiol compounds, and the like.

From the viewpoint of sensitivity, oxime compounds, acetophenone-based compounds, α-aminoketone compounds, trihalomethyl compounds, hexaaryl biimidazole compounds, and thiol compounds are preferred.

Regarding the acetophenone-based compounds, the trihalomethyl compounds, the hexaaryl biimidazole compounds, and the oxime compounds, specifically, the description in Paragraphs [0506] to [0510] in JP2012-208494A ([0622] to [0628] in the specification of the corresponding US2012/0235099A) and the like can be referenced and the content thereof is incorporated into the specification of the present application by reference.

Preferably, furthermore, the polymerization initiator can also be preferably used for the cyclic oxime compounds described in JP2007-231000A and JP2007-322744A.

Additional examples thereof include the oxime compounds having a specific substituent described in JP2007-269779A and the oxime compounds having a thioaryl group described in JP2009-191061A.

Specifically, the oxime compounds are also preferably compounds represented by Formula (1) described below. Meanwhile, the N—O bond in an oxime may be an oxime compound of an (E) body, an oxime compound of a (Z) body, or a mixture of the (E) body and the (Z) body. Regarding the compound represented by Formula (1), the description of the compound represented by Formula (OX-1) or (OX-2) in Paragraphs [0513] ([0632] in the specification of the corresponding US2012/235099A) and thereafter in JP2012-208494A can be referenced and the content thereof is incorporated into the specification of the present application by reference.

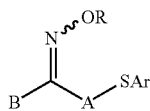

(1)

(In Formula (1), each of R and B independently represents a monovalent substituent, A represents a divalent organic group, and Ar represents an aryl group.)

The monovalent substituent represented by R is preferably a monovalent non-metal atomic group. Examples of the monovalent non-metal atomic group include alkyl groups having 1 to 30 carbon atoms, aryl groups having 6 to 30 carbon atoms, acyl groups having 2 to 20 carbon atoms, alkyoxcarbonyl groups having 2 to 20 carbon atoms, aryloxycarbonyl groups having 2 to 20 carbon atoms, heterocyclic groups, alkylthiocarbonyl groups, arylthiocarboxyl groups, and the like.

The monovalent substituent represented by B represents an aryl group, a heterocyclic group, an arylcarbonyl group, or a heterocyclic carbonyl group.

Examples of the divalent organic group represented by A include an alkylene group having 1 to 12 carbon atoms, a cyclohexylene group, and an alkylene group.

The above-described groups may have one or more substituents. In addition, the above-described substituent may be substituted with another substituent. Examples of the substituent include a halogen atom, an aryloxy group, an alkoxycarbonyl group, an aryloxy carbonyl group, an acyloxy group, an acyl group, an alkyl group, an aryl group, and the like.

Regarding specific examples of the oxime compounds that are preferably used, the description of Paragraph [0033] in JP2012-032556A, Paragraph [0033] in JP2012-122045A, and the like can be referenced and the content thereof is incorporated into the specification of the present application. (Plox-1) to (Plox-13) will be illustrated below, but the present invention is not limited thereto.

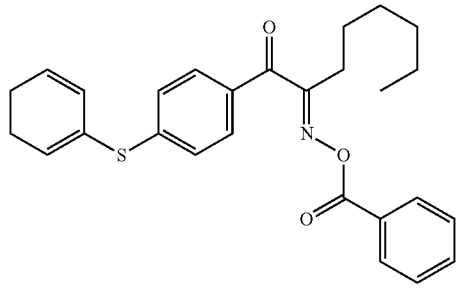

Plox-1

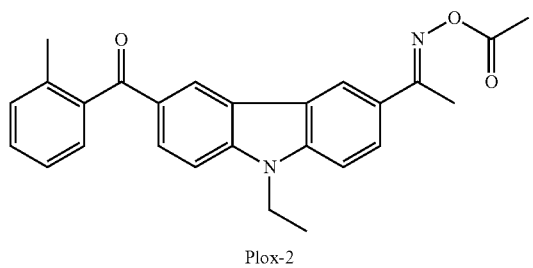

Plox-2

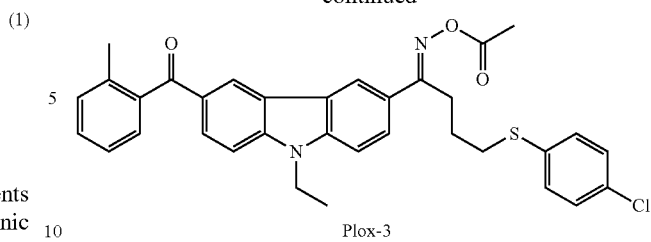

Plox-3

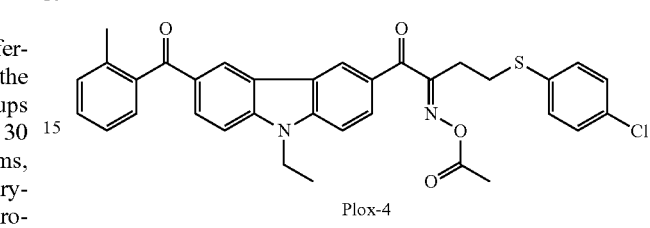

Plox-4

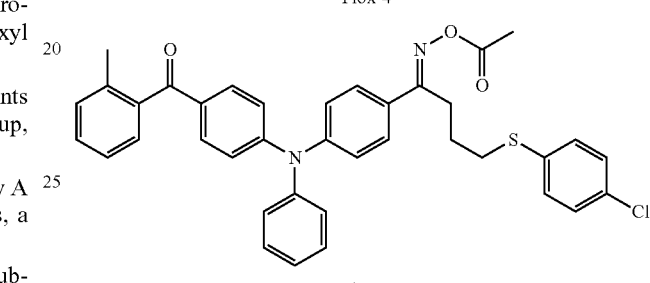

Plox-5

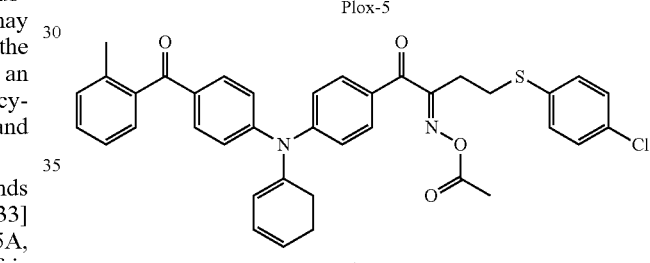

Plox-6

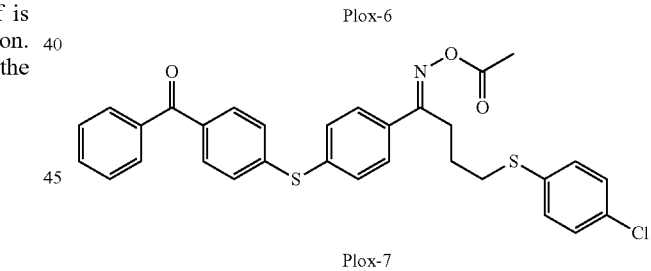

Plox-7

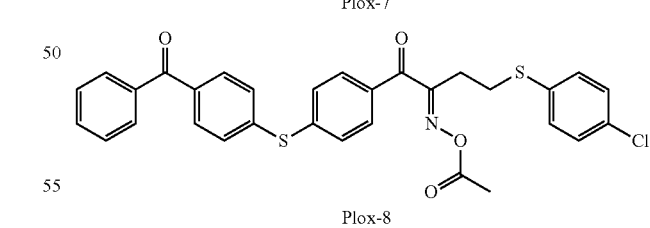

Plox-8

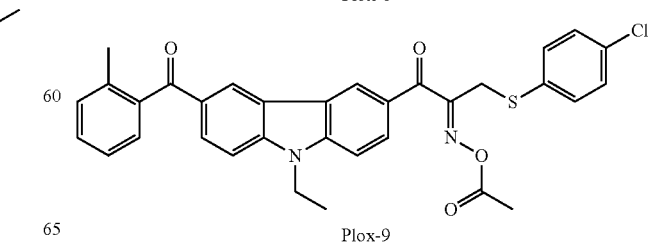

Plox-9

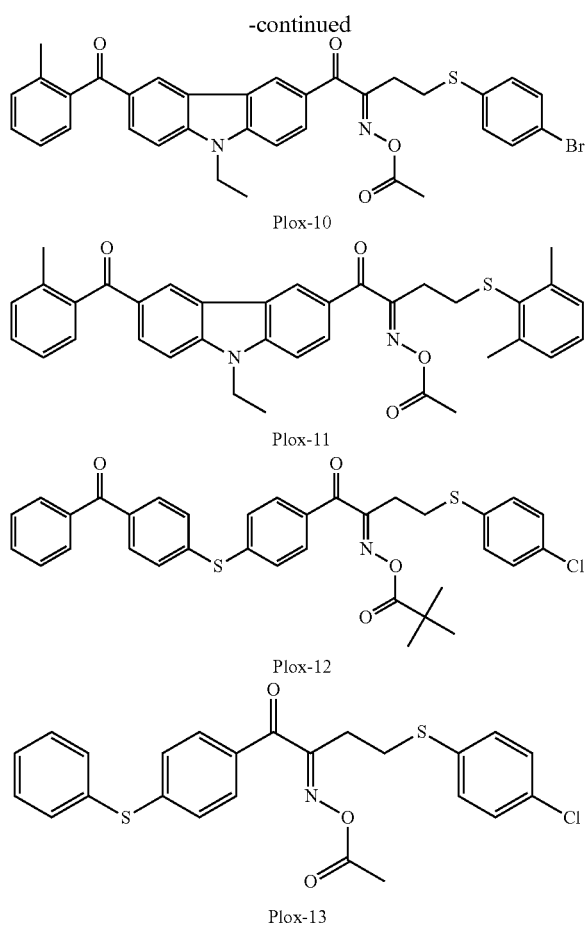

Plox-10

Plox-11

Plox-12

Plox-13

The oxime compound preferably has the maximum absorption wavelength in a wavelength range of 350 nm to 500 nm, more preferably has the maximum absorption wavelength in a wavelength range of 360 nm to 480 nm, and particularly preferably has high absorbance at 365 nm and 455 nm.

The mole absorption coefficient of the oxime compound at 365 nm or 405 nm is preferably in a range of 3,000 to 300,000, more preferably in a range of 5,000 to 300,000, and particularly preferably in a range of 10,000 to 200,000 from the viewpoint of sensitivity.

For the mole absorption coefficient of the compound, it is possible to use a well-known method and is preferably measured using, for example, a UV-visible spectrophotometer (Carry-5 spectrophotometer manufactured by Varian Inc.) and an ethyl acetate solvent at a concentration of 0.01 g/L.

A photopolymerization initiator is more preferably a compound selected from the group consisting of oxime compounds, acetophenone-based compounds, and acylphosphine compounds. For example, it is also possible to use the aminoacetophenone-based initiators described in JP1998-291969A (JP-H10-291969A), the acylphosphine oxide-based initiators described in JP4225898B, the above-described oxime-based initiators, and, furthermore, as the oxime-based initiators, the compounds described in JP2001-233842A.

As the oxime compound, it is possible to use a commercially available products of IRGACURE-OXE01 (manufactured by BASF) or IRGACURE-OXE02 (manufactured by BASF). As the acetophenone-based initiator, it is possible to use commercially available products of IRGACURE-907, IRGACURE-369, and IRGACURE-379 (trade name, all manufactured by BASF Japan). In addition, as the acylphosphine-based initiator, it is possible to use a commercially available product of IRGACURE-819, and DAROCUR-TPO (trade name, all manufactured by BASF Japan).

(Thermal Radical Generator)

The composition of the present invention may include a thermal radical generator. In a case in which the composition of the present invention includes an ethylenic unsaturated compound such as the above-described compound having at least one ethylenic unsaturated double bond, the composition of the present invention preferably includes a thermal radical generator.

In the present invention, as the thermal radical generator, it is possible to use a well-known thermal radical generator. The thermal radical generator refers to a compound that generates a radical using heat energy and initiates or accelerates the polymerization reaction of the polymerizing compound.

Examples of preferred thermal radical generators include aromatic ketones, onium salt compounds, organic peroxides, thio compounds, hexaaryl biimidazole compounds, ketoxime ester compounds, acylphosphine oxide compounds, borate compounds, azinium compounds, metallocene compounds, active ester compounds, compounds having a carbon halogen bond, azo-based compounds, bibenzyl compounds, and the like.

Specific examples of the thermal radical generator include IRGACURE 184, IRGACURE 369, IRGACURE 379, IRGACURE 651, IRGACURE 907, IRGACURE 819 (manufactured by BASF), DAROCUR 4265, DAROCUR TPO (manufactured by Merck KGaA, Darmstadt, Germany), PERHEXA H, PERHEXA HC, PERHEXA C, PERHEXA V, PERHEXA 22, PERBUTYL H, PERCUMYL D, PERBUTYL P, PERBUTYL C, PERBUTYL D, PERHEXYL D, PERHEXA 25B, PERHEXYNE 25B, PEROYL L, NYPER BW, NYPER BMT-K40, NYPER BMT-M, PERBUTYL PV, PERHEXA 250, PEROCTA O, PERHEXYL O, PERBUTYL O, PERBUTYL L, PERBUTYL 355, PERHEXYL I, PERBUTYL I, PERBUTYL E, PERHEXA 25Z, PERBUTYL A, PERHEXYL Z, PERBUTYL ZT, PERBUTYL Z (manufactured by NOF Corporation), and the like.

The thermal radical generator may be used singly or two or more thermal radical generators can be jointly used.

The amount of the thermal radical generator added to the composition of the present invention is preferably in a range of 0.05 weight % to 15 weight % and more preferably in a range of 0.1 weight % to 10 weight % in relation to the total solid content of the composition.

(Thermal Acid Generator)

The composition of the present invention may include a thermal acid generator in order to further improve the heat resistance or hardness of an obtained cured film. Examples thereof include onium salts such as sulfonium salts, benzothiazonium salts, ammonium salts, and phosphonium salts. Examples of the sulfonium salts include alkyl sulfonium salts, benzyl sulfonium salts, dibenzyl sulfonium salts, substituted benzyl sulfonium salts, benzothiazonium salts, and the like.

As the thermal acid generator, a sulfonium salt or a benzothiazonium salt is preferably used and, particularly, 4-acetoxyphenyl dimethyl sulfonium hexafluoroantimonate, benzyl-4-hydroxyphenyl methyl sulfonium hexafluoroantimonate, 4-acetoxyphenylbenzyl methyl sulfonium hexafluoroantimonate, dibenzyl-4-hydroxyphenyl sulfonium hexafluoroantimonate, 4-acethoxyphenyl benzylsulfonium hexafluoroantimonate, or 3-benzylbenzothiazolium hexafluoroantimonate is preferably used.

Examples of the commercially available products thereof include SAN-AID SI-L85, SAN-AID SI-L110, SAN-AID SI-L110L, SAN-AID SI-L145, SAN-AID SI-L150, SAN-AID SI-L160, (all manufactured by Sanshin Chemical Industry Co., Ltd.), and the like.

The thermal acid generator may be used singly or two or more thermal acid generators can be jointly used.

The amount of the thermal acid generator added to the composition of the present invention is preferably in a range of 0.05 weight % to 15 weight % and more preferably in a range of 0.1 weight % to 10 weight % in relation to the total solid content of the composition.

<Other Components>

In the composition of the present invention, in addition to the above-described essential components and the above-described preferred additives, other components may be selectively used in an appropriate manner depending on the purpose as long as the effects of the present invention are not impaired.

Examples of the other components that can be jointly used include a binder polymer, a dispersing agent, a sensitizer, a crosslinking agent, a curing accelerator, a filler, a thermal curing accelerator, a thermopolymerization inhibitor, a plasticizer, and the like and, furthermore, an adhesion accelerator to the surface of a base material and other auxiliary agents (for example, conductive particles, a filler, a defoamer, a flame retardant, a levelling agent, a peeling accelerator, an antioxidant, a fragrance, a surface tension adjuster, a chain transfer agent, and the like) may also be jointly used.

When the composition of the present invention appropriately includes the above-described components, it is possible to adjust properties such as stability and film properties of the target near-infrared cut filter.

Regarding the above-described components, for example, the descriptions in Paragraphs [0183] and thereafter in JP2012-003225A, Paragraphs [0101] and [0102] in JP2008-250074A, Paragraphs [0103] and [0104] in JP2008-250074A, Paragraphs [0107] to [0109] in JP2008-250074A, and the like can be referenced and the contents thereof can be incorporated into the specification of the present application by reference.

Since the composition of the present invention may be in a liquid form, it is possible to easily produce the near-infrared cut-off filter by, for example, directly applying and drying the composition of the present invention and the production aptitude that has not been sufficient in the above-described near-infrared cut-off filter of the related art can be improved.

The use of the near-infrared-absorbing composition of the present invention is not particularly limited and examples thereof include compositions for near-infrared cut-off filters on the light-receiving side of a solid-state imaging element substrate (for example, compositions for near-infrared cut-off filters for wafer-level lenses, and the like), compositions for near-infrared cut-off filters on the back surface side of the solid-state imaging element substrate (the side opposite to the light-receiving side), and the like. The near-infrared-absorbing composition of the present invention is preferably used for light-shielding films on the light-receiving side of the solid-state imaging element substrate. Particularly, the near-infrared-absorbing composition of the present invention is preferably directly applied onto an image sensor for the solid-state imaging element so as to form a coated film.

Particularly, the near-infrared-absorbing composition of the present invention is preferably used to produce a near-infrared cut-off filter which includes a copper compound and the structure of Formula (1) and has a film thickness of 200 µm or less and a visible light transmissivity of 90% or more.

In addition, in a case in which an infrared cut-off layer is formed through coating, the viscosity of the near-infrared-absorbing composition of the present invention is preferably in a range of 1 mPa·s to 3000 mPa·s, more preferably in a range of 10 mPa·s to 2000 mPa·s, and still more preferably in a range of 100 mPa·s to 1500 mPa·s.

In a case in which the near-infrared-absorbing composition of the present invention is used for near-infrared cut-off filters on the light-receiving side of the solid-state imaging element substrate and an infrared cut-off layer is formed through coating, the viscosity thereof is preferably in a range of 10 mPa·s to 3000 mPa·s, more preferably in a range of 500 mPa·s to 1500 mPa·s, and most preferably in a range of 700 mPa·s to 1400 mPa·s from the viewpoint of thick film formability and uniform coating properties.

The total solid content of the near-infrared-absorbing composition of the present invention varies depending on the coating method and is preferably in a range of 1% by mass to 50% by mass, more preferably in a range of 1% by mass to 30% by mass, and still more preferably in a range of 10% by mass to 30% by mass in relation to the composition.

The present invention may be a laminate including a near-infrared cut-off layer obtained by curing the near-infrared-absorbing composition and a dielectric multilayer film. Examples thereof include (i) an aspect in which a transparent supporter, a near-infrared cut-off layer, and a dielectric multilayer film are sequentially provided and (ii) an aspect in which a near-infrared cut-off layer, a transparent supporter, and a dielectric multilayer film are sequentially provided. As the transparent supporter, a glass substrate or a transparent resin substrate can be used.

The dielectric multilayer film is a film having the capability of reflecting and/or absorbing near-infrared rays.

As a material for the dielectric multilayer film, for example, ceramics can be used. Alternatively, a noble metal film that absorbs light in the near-infrared range may be used in consideration of the thickness and the number of layers so as to prevent the visible light transmissivity of the near-infrared cut-off filter from being affected.

As the dielectric multilayer film, specifically, it is possible to preferably use a configuration in which high-refractive index material layers and low-refractive index material layers are alternately laminated.

As a material that configures the high-refractive index material layer, a material having a refractive index of 1.7 or more can be used and a material having a refractive index in a range of 1.7 to 2.5 is generally selected.

Examples of the material include titanium oxide (titania), zirconium oxide, tantalum pentaoxide, niobium pentaoxide, lanthanum oxide, yttrium oxide, zinc oxide, zinc sulfide, indium oxide, and materials which contain the above-described oxide as a main component and contain a small amount of titanium oxide, zinc oxide, and/or cerium oxide. Among these, titanium oxide (titania) is preferred.

As a material configuring the low-refractive index material layer, it is possible to use a material having a refractive index of 1.6 or less and a material having a refractive index in a range of 1.2 to 1.6 is generally selected.

Examples of the material include silica, alumina, lanthanum fluoride, magnesium fluoride, and sodium aluminum hexafluoride. Among these, silica is preferred.

The thickness of each of the high-refractive index layer and the low-refractive index layer is generally as thick as 0.1λ to 0.5λ of the wavelength λ (nm) of an infrared ray which is planned to be shielded. When the thickness is outside the above-described range, the product (n×d) of the refractive index (n) and the film thickness (d) is significantly different from the optical film thickness computed using λ/4 and thus the optical characteristic relationship between reflection and refraction is no longer valid, and there is a tendency that it becomes difficult to control the shielding and transmitting of specific wavelengths.

In addition, the number of layers laminated in the dielectric multilayer film is preferably in a range of 5 to 50 and more preferably in a range of 10 to 45

There is no particular limitation regarding the method for forming the dielectric multilayer film and examples thereof include a method in which a dielectric multilayer film in which high-refractive index layers and low-refractive index layers are alternately laminated is formed using a CVD method, a sputtering method, a vacuum deposition method, or the like and is attached to the film using an adhesive and a method in which a dielectric multilayer film in which high-refractive index layers and low-refractive index layers are alternately laminated is directly formed on the film using a CVD method, a sputtering method, a vacuum deposition method, or the like.

In a case in which a substrate is warped during the deposition of the dielectric multilayer film, in order to prevent the above-described warping, it is possible to employ methods in which the dielectric multilayer films are deposited on both surfaces of the substrate or the surface of the substrate and in which the surfaces the dielectric multilayer film is deposited are irradiated with a radioactive ray such as an infrared ray. Meanwhile, in a case in which the surface is irradiated with a radioactive ray, the surface may be irradiated with a radioactive ray while the dielectric multilayer film is deposited or the surface may be separately irradiated with a radioactive ray after the dielectric multilayer film is deposited.

The present invention relates to a method for producing a near-infrared cut-off filter including a step of applying (preferably coating or printing and more preferably applicator-coating) the near-infrared-absorbing composition of the present invention to the light-receiving side of a solid-state imaging element substrate so as to form a film and a step of drying the film. The film thickness, the lamination structure, and the like can be appropriately selected depending on the purpose.

A supporter may be a transparent substrate made of glass, a solid-state imaging element substrate, another substrate (for example, a glass substrate 30 described below) provided on the light-receiving side of the solid-state imaging element substrate, or a layer such as a flattened layer provided on the light-receiving side of the solid-state imaging element substrate.

The near-infrared-absorbing composition (coating fluid) can be applied onto the supporter using, for example, a spin coater, a slit spin coater, a slit coater, screen printing, applicator application, or the like.

In addition, the conditions for drying the coated film vary depending on the kind and fractions of individual components and a solvent; however, generally, the coated film is dried at a temperature in a range of 60° C. to 150° C. for approximately 30 seconds to 15 minutes.

The thickness of the film is not particularly limited and can be appropriately selected depending on the purpose. The thickness of the film is, for example, preferably in a range of 1 μm to 500 μm, more preferably in a range of 1 μm to 300 μm, and particularly preferably in a range of 1 μm to 200 μm. In the present invention, even in a case in which a film as thin as described above is produced, it is possible to maintain near-infrared shielding properties.

A method for forming the near-infrared cut-off filter using the near-infrared-absorbing composition of the present invention may include other steps. The other steps are not particularly limited and can be appropriately selected depending on the purpose. Examples of the other steps include a surface treatment step of the base material, a pre-heating step (prebaking step), a curing treatment step, a post heating step (post baking step), and the like.

<Preheating Step and Post Heating Step>

The heating temperatures in the preheating step and the post heating step are generally in a range of 80° C. to 200° C. and preferably in a range of 90° C. to 150° C.

The heating times in the preheating step and the post heating step are generally in a range of 30 seconds to 240 seconds and preferably in a range of 60 seconds to 180 seconds.

<Curing Treatment Step>

The curing treatment step refers to a step of carrying out a curing treatment on the formed film as necessary and the curing treatment improves the mechanical strength of the near-infrared cut-off filter.

The curing treatment step is not particularly limited and can be appropriately selected depending on the purpose and preferred examples thereof include a full-surface exposure treatment, a full-surface thermal treatment, and the like. In the present invention, the meaning of "exposure" includes the irradiation of the surface with a radioactive ray such as an electron beam or an X ray as well as light rays having a variety of wavelengths.

The exposure is preferably carried out through irradiation using an radioactive ray and, as the radioactive ray that can be used in the exposure, particularly, an ultraviolet ray such as an electron beam, KrF, ArF, a g-ray, an h-ray, or an i-ray or visible light is preferably used. Among these, KrF, a g-ray, an h-ray, and an i-ray are preferred.

Examples of the exposure method include stepper exposure, exposure using a high-pressure mercury lamp, and the like.

The exposure amount is preferably in a range of 5 J/cm$^2$ to 3000 mJ/cm$^2$, more preferably in a range of 10 J/cm$^2$ to 2000 mJ/cm$^2$, and particularly preferably in a range of 50 J/cm$^2$ to 1000 mJ/cm$^2$.

Examples of a method for the full-surface exposure treatment include a method in which the full surface of the above-described formed film is exposed. In a case in which the near-infrared-absorbing composition includes the polymerizing compound, the full-surface exposure accelerates the curing of a polymerizing component in the film formed of the composition, makes the film cured to a greater extent, and improves the mechanical strength and the durability.

An apparatus for carrying out the full-surface exposure is not particularly limited and can be appropriately selected depending on the purpose, and preferred examples thereof include UV steppers such as ultrahigh-pressure mercury lamps.

In addition, examples of the method for the full-surface thermal treatment include a method in which the full surface of the above-described formed film is heated. The heating of the full surface increases the film strength of a pattern.

The heating temperature in the full-surface heating is preferably in a range of 80° C. to 250° C. and more preferably in a range of 120° C. to 250° C. When the heating temperature is 120° C. or higher, the film strength is improved by the heating treatment and, when the heating temperature is 250° C. or lower, components in the film are decomposed and it is possible to prevent film qualities from becoming weak and brittle.

The heating time in the full-surface heating is preferably in a range of 3 minutes to 180 minutes and more preferably in a range of 5 minutes to 120 minutes.

An apparatus for carrying out the full-surface heating is not particularly limited and can be appropriately selected from well-known apparatuses depending on the purpose, and examples thereof include a dry oven, a hot plate, an IR heater, and the like.

The present invention also relates to a camera module including a solid-state imaging element substrate and a near-infrared cut-off filter disposed on the light-receiving side of the solid-state imaging element substrate, in which the near-infrared cut-off filter is the near-infrared cut-off filter of the present invention.

Hereinafter, a camera module according to an embodiment of the present invention will be described with reference to FIGS. 1 and 2, but the present invention is not limited by specific examples described below.

Figure 2:
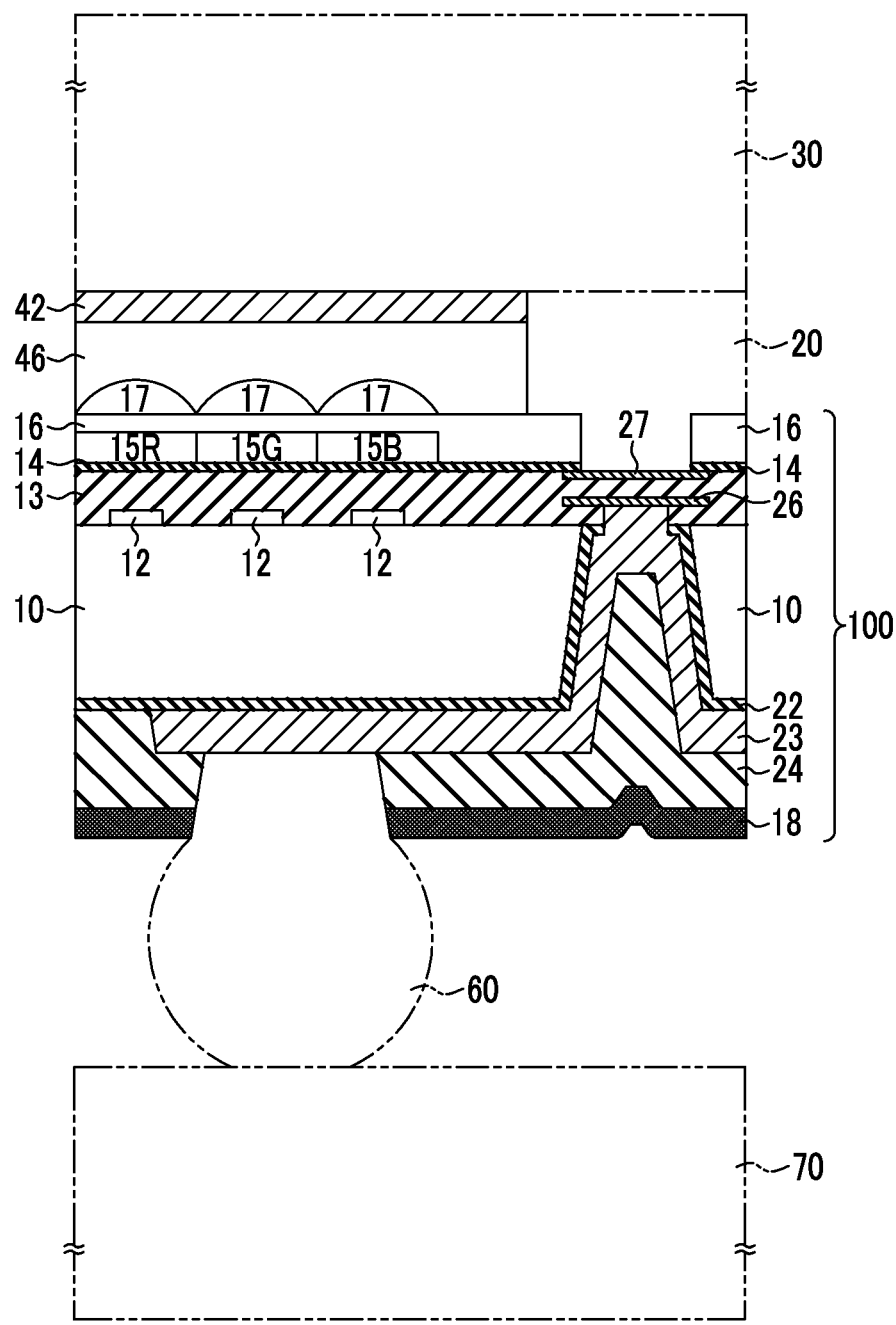
FIG. 2 is a schematic sectional view of a solid-state imaging element substrate according to the embodiment of the present invention.

In FIGS. 1 and 2, common portions are given common reference signs.

In addition, in the description, "upper", "upward", and "upper side" indicate the side far from a silicon substrate 10 and "lower", "downward", and "lower side" indicate the side close to the silicon substrate 10.

FIG. 1 is a schematic sectional view illustrating the configuration of a camera module including a solid-state imaging element.

A camera module 200 illustrated in FIG. 1 is connected to a circuit board 70 which is a mounting board through solder balls 60 that are connection members.

In detail, the camera module 200 includes a solid-state imaging element substrate 100 having an imaging element section on a first main surface of a silicon substrate, a flattening layer provided on the first main surface side (light-receiving side) of the solid-state imaging element substrate 100 (not illustrated in FIG. 1), a near-infrared cut-off filter 42 provided on the flattening layer, a lens holder 50 which is disposed above the near-infrared cut-off filter 42 and includes an imaging lens 40 in the inner space, and a light shielding and electromagnetic shield 44 disposed so as to surround the peripheries of the solid-state imaging element substrate 100 and a glass substrate 30. The glass substrate 30 (light transmissive substrate) may be provided on the flattening layer. The respective members are adhered using adhesives 20 and 45.

The present invention also relates to a step of forming a film by applying the near-infrared-absorbing composition of the present invention to the light-receiving side of the solid-state imaging element substrate in a method for manufacturing the camera module including the solid-state imaging element substrate and the near-infrared cut-off filter disposed on the light-receiving side of the solid-state imaging element substrate.

Therefore, in the camera module according to the present embodiment, for example, the near-infrared cut-off filter 42 can be formed by applying the near-infrared-absorbing composition of the present invention so as to form a film on the flattening layer. A method for forming the near-infrared cut-off filter 42 by applying the near-infrared-absorbing composition is as described above.

In the camera module 200, incident light hν coming from the outside sequentially passes through the imaging lens 40, the near-infrared cut-off filter 42, the glass substrate 30, and the flattening layer and then reaches the imaging element section in the solid-state imaging element substrate 100. In addition, the camera module 200 is connected to the circuit board 70 through the solder balls 60 (connection material) on a second main surface side of the solid-state imaging element substrate 100.

The camera module 200 may include the near-infrared cut-off filter directly provided on the flattening layer without the glass substrate 30 or may include the near-infrared cut-off filter directly provided on the glass substrate 30 without the flattening layer.

FIG. 2 is an enlarged view of the solid-state imaging element substrate 100 in FIG. 1.

The solid-state imaging element substrate 100 includes the silicon substrate 10 which is a basic body, imaging elements 12, an interlayer insulating film 13, a base layer 14, a red color filter 15R, a green color filter 15G; a blue color filter 15B, an overcoat 16, micro lenses 17, a light-shielding film 18, an insulating film 22, a metal electrode 23, a solder resist layer 24, an internal electrode 26, and an element surface electrode 27.

Here, the solder resist layer 24 may not be provided.

Regarding the solid-state imaging element substrate 100, the description of the solid-state imaging element substrate 100 in Paragraphs [0245] ([0407]) in the specification of the corresponding US2012/068292) and thereafter in JP2012-068418A can be referenced and the content thereof is incorporated into the specification of the present application by reference.

EXAMPLES

Hereinafter, the present invention will be more specifically described using examples. Materials, amounts used, fractions, treatment contents, treatment orders, and the like described in the following examples can be appropriately changed within the scope of the gist of the present invention. Therefore, the scope of the present invention is not limited to specific examples described below.

In the present examples, the following abbreviations will be employed.

<Copper Compound>

The following compounds illustrate copper complexes having the following two structures respectively as ligands. In the following compounds, "-" indicates a portion at which a coordination bond with copper is formed. For example, copper compounds A-1 to A-4 illustrate sulfonic acid copper complexes having the following two structures as ligands. Copper compounds A-5 and A-6 illustrate phosphorous-containing copper complexes having the following two structures as ligands. Copper compounds A-7 and A-8 illustrate copper complexes having a carboxylic acid group.

Copper compound A-1: the following compound

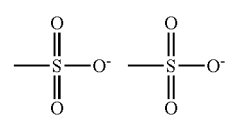

(A-1)

Copper compound A-2: the following compound

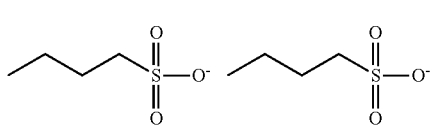
(A-2)

Copper compound A-3: the following compound

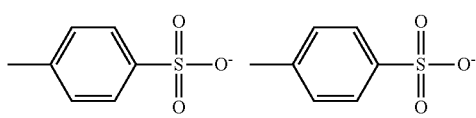
(A-3)

Copper compound A-4: the following compound

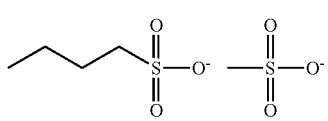
(A-4)

Copper compound A-5: the following compound

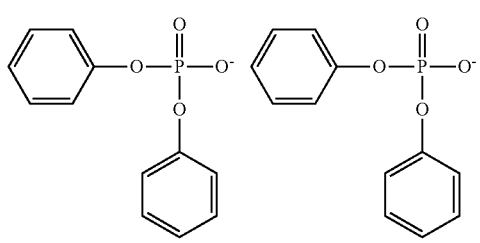
(A-5)

Copper compound A-6: the following compound

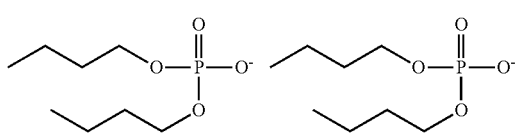
(A-6)

Copper compound A-7: the following compound

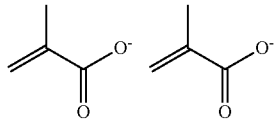
(A-7)

Copper compound A-8: the following compound

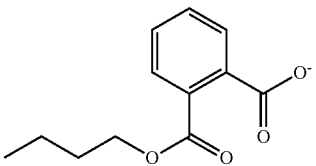
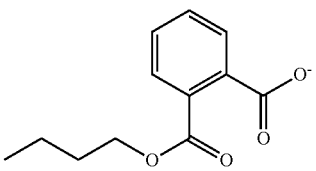
(A-8)

Synthesis Example of Copper Compound A-1

The above-described sulfonic acid compound A-1 was dissolved in methanol. After the solution was heated to 50° C., a methanol solution of copper acetate was added dropwise and the components were reacted at 50° C. for 2 hours. After the end of the reaction, the generated acetic acid and the solvent were distilled away using an evaporator, thereby obtaining a copper compound A-1.

Copper compounds A-2 to A-8 were obtained in the same manner as the case of the copper compound A-1 except for the fact that the sulfonic acid compound A-1 was changed to the above-described sulfonic acid compound A-2 to A-4, the above-described phosphorous-containing compounds A-5 and A-6, and the above-described compounds A-7 and A-8 including a carboxylic group.

<Compounds Having Structure of Formula (1)>

As a compound having the structure of Formula (1), compounds having RC(=O)NR partial structure represented by B-1 to B-7 illustrated below were used.

B-1: a compound having the following structure: polyacrylamide (manufactured by Sigma-Aldrich Co., LLC., aqueous solution)

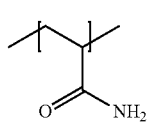
(B-1)

B-2: a compound having the following structure (weight-average molecular weight: 100,000)

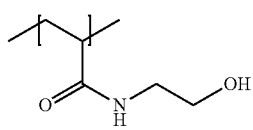
(B-2)

B-3: a compound having the following structure (weight-average molecular weight: 50,000)

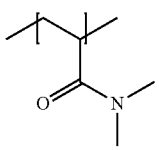
(B-3)

B-4: a compound having the following structure: polyvinylpyrrolidone K-30W (manufactured by Nippon Shokubai Co., Ltd.)

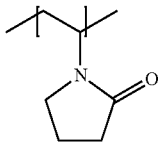
(B-4)

B-5: a compound having the following structure (weight-average molecular weight: 50,000)

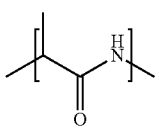
(B-5)

B-6: a compound having the following structure (weight-average molecular weight: 50,000)

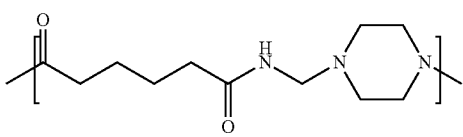
(B-6)

B-7: a compound having the following structure (weight-average molecular weight: 50,000)

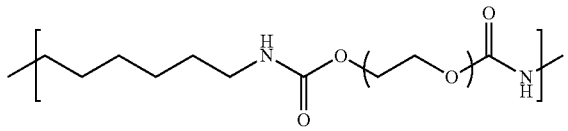
(B-7)

<Curable Compounds>

C-1: KAYARAD D-320: (manufactured by Nippon Kayaku Co., Ltd., dipentaerythritol tetraacrylate)

C-2: M-510: (manufactured by Toagosei Co., Ltd., polybasic acid-denatured acryl oligomer)

C-3: M-520: (manufactured by Toagosei Co., Ltd., polybasic acid-denatured acryl oligomer)

C-4: DPCA-60: (manufactured by Nippon Kayaku Co., Ltd., hexafunctional acrylate having six penthyleneoxy chains)

C-5: JER157S65: epoxy resin (manufactured by Japan Epoxy Resin Co., Ltd.)

C-6: NK ester ATM-35E: ethyleneoxy-denatured pentaerythritol tetraacrylate (polymerizing compound) (manufactured by Shin-Nakamura Chemical Co., Ltd.)

C-7: EX-321: epoxy resin (manufactured by Nagase ChemteX Corporation)

<Other Compounds>

D-1: SAN-AID SI-L110L (manufactured by Sanshin Chemical Industry Co., Ltd., thermal acid generator)

D-7. the following compound: PERBUTYL Z (manufactured by NOF Corporation)

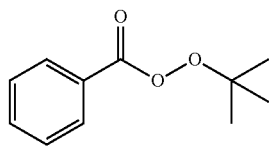
(D-2)

<Solvent>

MeOH: methanol EtOH: ethanol

Evaluation of Near-Infrared-Absorbing Composition

Preparation of Near-Infrared-Absorbing Composition

The above-described compounds were combined together as described in Table 1, thereby preparing near-infrared-absorbing compositions of Examples 1 to 24. The amounts of the examples added were as described below and "-" in Table 1 indicates that the following compounds were not added.

| | |
|---|---|
| Copper compound | 40 parts by mass |
| Compound represented by Formula (1) | 20 parts by mass |
| Curable compound | 35 parts by mass |
| Other compounds | 5 parts by mass |
| Solvent | 100 parts by mass |

Production of Near-Infrared Cut-Off Filter

Each of the near-infrared-absorbing compositions prepared in the examples was applicator-applied onto a glass substrate using an applicator coating method (baker applicator manufactured by Yoshimitsu Seiki Co., Ltd., used after a YBA-3 type was adjusted to a slit width of 250 μm) and was prebaked at 100° C. for 120 seconds. After that, all the samples were heated at 180° C. for 180 seconds using a hot plate, thereby obtaining near-infrared cut-off filters having a film thickness of 70 μm.

Evaluation of Near-Infrared Shielding Properties

The transmissivities at a wavelength of 800 nm of the near-infrared cut-off filters obtained as described above were measured using a spectrophotometer U-4100 (manufactured by Hitachi High-Technologies Corporation). The near-infrared shielding properties were evaluated on the basis of the following standards. The results are described in Table 1.

A: transmissivity at 800 nm≤5%
B: 5%<transmissivity at 800 nm≤7%
C: 7%<transmissivity at 800 nm≤10%
D: 10%<transmissivity at 800 nm Evaluation of Moisture Resistance The near-infrared cut-off filters obtained as described above were left to stand at a high temperature and a high humidity of 60° C./90% RH for 1 hour. The maximum absorbance (Absλmax) at a wavelength of 700 nm to 1400 nm and the minimum absorbance (Absλmin) at a wavelength of 400 nm to 700 nm were measured using a spectrophotometer U-4100 (manufactured by Hitachi High-Technologies Corporation) respectively before and after the moisture resistance test and the absorbance ratios represented by "Abskmax/Absλmin" were obtained.

The absorbance ratio change rates represented by |(the absorbance ratio before the test−the absorbance ratio after the test)/the absorbance ratio before the test×100|(%) were evaluated on the basis of the following standards.

A: absorbance ratio change rate≤2%
B: 2%<absorbance ratio change rate≤4%
C: 4%<absorbance ratio change rate≤7%
D: 7%<absorbance ratio change rate

| Copper complex having the following sulfophthalic acid as a ligand | 10 parts by mass |
| Compound represented by Formula (1) | 10 parts by mass |
| Solvent (water) | 80 parts by mass |

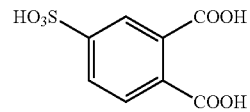

(Method for Synthesizing Sulfophthalic Acid Copper Complex)

A 53% aqueous solution of sulfophthalic acid was dissolved in methanol, the solution was heated to 50° C., then, copper hydroxide was added, and the components were reacted at 50° C. for 2 hours. After the end of the reaction, the solvent and the generated water were distilled away using an evaporator, thereby obtaining a copper complex A (8.57 g).

TABLE 1

| | Copper compound | Compound having RC(=O)NR partial structure | Content of copper compound in 1 g of compound having RC(=O)NR partial structure (moles) | Curing compound | Other compounds | Solvent | Near-infrared shielding properties | Moisture resistance |
|---|---|---|---|---|---|---|---|---|
| Example 1 | A-1 | B-1 | 7.88E−03 | | | Water | A | B |
| Example 2 | A-1 | B-2 | 7.88E−03 | | | Water | A | B |
| Example 3 | A-1 | B-3 | 7.88E−03 | | | Water | A | B |
| Example 4 | A-1 | B-4 | 7.88E−03 | | | Water | A | B |
| Example 5 | A-1 | B-5 | 7.88E−03 | | | MeOH | A | B |
| Example 6 | A-1 | B-6 | 7.88E−03 | | | MeOH | A | B |
| Example 7 | A-1 | B-7 | 7.88E−03 | | | MeOH | A | B |
| Example 8 | A-2 | B-4 | 5.92E−03 | | | Water | A | B |
| Example 9 | A-3 | B-4 | 4.93E−03 | | | MeOH | A | B |
| Example 10 | A-4 | B-4 | 6.76E−03 | | | MeOH | A | B |
| Example 11 | A-5 | B-4 | 3.56E−03 | | | MeOH | A | B |
| Example 12 | A-6 | B-4 | 4.15E−03 | | | MeOH | A | B |
| Example 13 | A-7 | B-4 | 8.56E−03 | | | MeOH | A | B |
| Example 14 | A-8 | B-4 | 3.95E−03 | | | MeOH | A | B |
| Example 15 | A-4 | B-3 | 6.76E−03 | C-1 | | MeOH | A | A |
| Example 16 | A-4 | B-3 | 6.76E−03 | C-2 | | MeOH | A | A |
| Example 17 | A-4 | B-3 | 6.76E−03 | C-3 | | MeOH | A | A |
| Example 18 | A-4 | B-3 | 6.76E−03 | C4, C-5 (17.5 parts by mass respectively) | | EtOH | A | A |
| Example 19 | A-4 | B-3 | 6.76E−03 | C-5 | | EtOH | A | A |
| Example 20 | A-4 | B-3 | 6.76E−03 | C-6 | | MeOH | A | A |
| Example 21 | A-4 | B-3 | 6.76E−03 | C-7 | | MeOH | A | A |
| Example 22 | A-4 | B-3 | 6.76E−03 | C-6 | | MeOH | A | A |
| Example 23 | A-4 | B-4 | 6.76E−03 | C-5 | D-1 | EtOH | A | A |
| Example 24 | A-4 | B-5 | 6.76E−03 | C-6 | D-2 | MeOH | A | A |

As is clear from Table 1, the near-infrared-absorbing compositions of Examples 1 to 24 were capable of forming cured films having excellent moisture resistance while maintaining strong near-infrared shielding properties when the cured films were produced. The content of the copper compound is preferably in a range of 3×10⁻³ mol to 1 mol, more preferably in a range of 3×10⁻³ mol to 1×10⁻² mol, and still more preferably in a range of 6×10⁻³ mol to 7×10⁻³ mol in relation to 1 g of the compound having the partial structure represented by Formula (1) described below.

Example 25

The following compounds were mixed together, thereby preparing a near-infrared-absorbing composition of Example 25.

It was confirmed that, in the near-infrared-absorbing composition of Example 25, the near-infrared absorbing performance was further improved compared with Examples 1 to 24.

Example 26

The following compounds were mixed together, thereby preparing a near-infrared-absorbing composition of Example 26.

| Sulfophthalic acid copper complex described above | 10 parts by mass |
| Binder A described below | 10 parts by mass |
| Solvent (water) | 80 parts by mass |

Binder A: the following compound

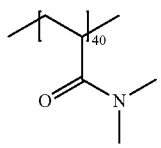

Examples 27 to 51

Near-infrared-absorbing compositions of Examples 27 to 51 were prepared in the same manner as in Example 26 except for the fact that copper complexes for which the compounds (ligand raw materials) described in Table 2 and copper compounds were reacted together were used instead of the sulfophthalic acid copper complex in Example 26.

It was confirmed that, in the near-infrared-absorbing compositions of Examples 27 to 51, the near-infrared absorbing performance was further improved compared with Examples 1 to 24.

In Table 2, the ligand raw material (acid) indicates materials used to obtain the above-described copper complexes. In addition, "-" indicates that the compound (ii) was not used.

TABLE 2

| | Ligand raw material (acid) | | (i):(ii) [Molar ratio] | Acid group/ Cu ratio |
|---|---|---|---|---|
| | Compound (i) | Compound (ii) | | |
| Example 27 | 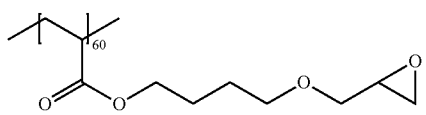 | — | 1:0 | 2/1 |
| Example 28 | | — | 1:0 | 2/1 |
| Example 29 | | — | 1:0 | 2/1 |
| Example 30 | | — | 1:0 | 2/1 |
| Example 31 | | — | 1:0 | 2/1 |
| Example 32 | | — | 1:0 | 2/1 |
| Example 33 | | — | 1:0 | 2/1 |
| Example 34 | | — | 1:0 | 4/1 |
| Example 35 | | — | 1:0 | 2/1 |

TABLE 2-continued

| | Ligand raw material (acid) | | | |
|---|---|---|---|---|
| | Compound (i) | Compound (ii) | (i):(ii) [Molar ratio] | Acid group/ Cu ratio |
| Example 36 | HO$_3$S–C$_6$H$_3$(COOH)$_2$ (4-sulfophthalic acid) | — | 1:0 | 6/1 |
| Example 37 | HO$_3$S–C$_6$H$_3$(COOH)$_2$ | — | 1:0 | 3/1 |
| Example 38 | HO$_3$S–C$_6$H$_3$(COOH)$_2$ | — | 1:0 | 2/1 |
| Example 39 | methoxyacetic acid (CH$_3$OCH$_2$COOH) | — | 1:0 | 2/1 |
| Example 40 | CH$_3$O(CH$_2$CH$_2$O)$_2$CH$_2$COOH | — | 1:0 | 2/1 |
| Example 41 | HOOCCH$_2$OCH$_2$COOH (diglycolic acid) | — | 1:0 | 2/1 |
| Example 42 | HOOCCH$_2$(OCH$_2$CH$_2$)$_n$OCH$_2$COOH  Ms = 600 | — | 1:0 | 2/1 |
| Example 43 | citric acid | — | 1:0 | 2/1 |
| Example 44 | acrylic acid (CH$_2$=CHCOOH) | — | 1:0 | 2/1 |
| Example 45 | CH$_2$=CHCOO–CH$_2$CH$_2$–OOC–CH$_2$CH$_2$–COOH | — | 1:0 | 2/1 |
| Example 46 | CH$_2$=C(CH$_3$)COO–(CH$_2$)$_3$–SO$_3$H | — | 1:0 | 2/1 |
| Example 47 | methoxyacetic acid | HO$_3$S–C$_6$H$_3$(COOH)$_2$ | 1:1 | 2/1 |

TABLE 2-continued

| | Ligand raw material (acid) | | (i):(ii) [Molar ratio] | Acid group/ Cu ratio |
|---|---|---|---|---|
| | Compound (i) | Compound (ii) | | |
| Example 48 | methoxyacetic acid structure | HO₃S-benzene-(COOH)₂ structure | 3:1 | 2/1 |
| Example 49 | acrylate-ethylene glycol-succinate structure | HO₃S-benzene-(COOH)₂ structure | 1:1 | 2/1 |
| Example 50 | acrylate-ethylene glycol-succinate structure | methoxyacetic acid structure | 1:1 | 2/1 |
| Example 51 | methacrylate-propyl-SO₃H structure | HO₃S-benzene-(COOH)₂ structure | 1:1 | 2/1 |

What is claimed is:

1. A near-infrared-absorbing composition, comprising:
a copper compound; and
a compound having a partial structure represented by Formula (1) described below,
wherein:
the compound having the partial structure represented by Formula (1) has a structure represented by any one of Formulae (1-2) to (1-5) described below,
the content of the copper compound is in a range of $3 \times 10^{-3}$ mol to 1 mol in relation to 1 g of the compound having the partial structure represented by Formula (1) described below, Formula (1)

$$-\underset{\|}{\overset{O}{C}}-\underset{|}{\overset{R^1}{N}}-$$

wherein in Formula (1), $R^1$ represents a hydrogen atom or an organic group,

General Formula (1-2)

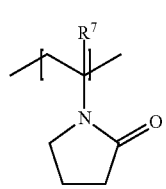

wherein in Formula (1-2), $R^7$ represents a hydrogen atom or a methyl group,

General Formula (1-3)

$$-\left[L^1-\underset{|}{\overset{R^8}{N}}-\underset{\|}{\overset{O}{C}}\right]-$$

wherein in Formula (1-3), $L^1$ represents a divalent linking group and $R^8$ represents a hydrogen atom or an organic group, General Formula (1-4)

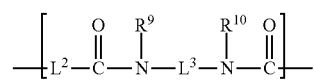

wherein in Formula (1-4), each of $L^2$ and $L^3$ independently represents a divalent linking group and each of $R^9$ and $R^{10}$ independently represents a hydrogen atom or an organic group, General Formula (1-5)

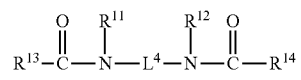

wherein in Formula (1-5), $L^4$ represents a divalent linking group and each of $R^{11}$ to $R^{14}$ independently represents a hydrogen atom or an organic group, and
the copper compound is a copper complex selected from the group consisting of a sulfonic acid copper complex, a carboxylic acid copper complex, and a copper complex represented by Formula (A), $$Cu(L)_{n1} \cdot (X)_{n2} \quad \text{Formula (A)}$$

wherein in Formula (A), L represents a ligand that coordinates copper,

X is not present or represents a halogen atom, $H_2O$, $NO_3$, $ClO_4$, $SO_4$, CN, SCN, $BF_4$, $PF_6$, $BPh_4$ in which Ph represents a phenyl group, or an alcohol, and each of n1 and n2 independently represents an integer from 1 to 4.

2. The near-infrared-absorbing composition according to claim 1, wherein the content of the compound having the partial structure represented by Formula (1) is in a range of 5 mass % to 80 mass % in the near-infrared-absorbing composition.

3. The near-infrared-absorbing composition according to claim 1, wherein the compound having the partial structure represented by Formula (1) is a polymer.

4. The near-infrared-absorbing composition according to claim 3, wherein the polymer has the partial structure represented by Formula (1) at a side chain thereof.

5. The near-infrared-absorbing composition according to claim 1, further comprising:

a curable compound and a solvent.

6. The near-infrared-absorbing composition according to claim 1, wherein the solids content of the near-infrared-absorbing composition is in a range of 35 mass % to 90 mass %.

7. A coated film of the near-infrared-absorbing composition according to claim 1, which is formed on an image sensor for a solid-state imaging element.

8. A near-infrared cut-off filter produced with the near-infrared-absorbing composition according to claim 1.

9. A camera module comprising:

a solid-state imaging element substrate; and the near-infrared cut-off filter according to claim 8 disposed on a light-receiving side of the solid-state imaging element substrate.

10. A method for manufacturing a camera module including a solid-state imaging element substrate and the near-infrared cut-off filter disposed on a light-receiving side of the solid-state imaging element substrate, comprising:

applying the near-infrared absorbing composition according to claim 1 to the light-receiving side of the solid-state imaging element substrate so as to form the near-infrared cut-off filter.

11. The near-infrared-absorbing composition according to claim 1, wherein the content of the copper compound is in a range of $3.56 \times 10^{-3}$ mol to $8.56 \times 10^{-3}$ mol in relation to 1 g of the compound having the partial structure represented by Formula (1).

12. A near-infrared-absorbing composition comprising:

a copper compound; and a compound having a partial structure represented by Formula (1) described below, wherein the compound having the partial structure represented by Formula (1) further includes an epoxy group or an oxetanyl group, the content of the copper compound is in a range of $3 \times 10^{-3}$ mol to 1 mol in relation to 1 g of the compound having the partial structure represented by Formula (1) described below,

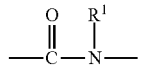

Formula (1)

wherein in Formula (1), $R^1$ represents a hydrogen atom or an organic group, and the copper compound is a copper complex selected from the group consisting of a sulfonic acid copper complex, a carboxylic acid copper complex, and a copper complex represented by Formula (A),

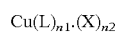

Formula (A)

wherein in Formula (A), L represents a ligand that coordinates copper,

X is not present or represents a halogen atom, $H_2O$, $NO_3$, $ClO_4$, $SO_4$, CN, SCN, $BF_4$, $PF_6$, $BPh_4$ in which Ph represents a phenyl group, or an alcohol, and each of n1 and n2 independently represents an integer from 1 to 4.

13. A near-infrared-absorbing composition comprising:

a copper compound; and a compound having a partial structure represented by Formula (1) described below, wherein the compound having the partial structure represented by Formula (1) is a polymer including a repeating unit that has the partial structure represented by Formula (1) and a repeating unit that includes an epoxy group or an oxetanyl group, the content of the copper compound is in a range of $3 \times 10^{-3}$ mol to 1 mol in relation to 1 g of the compound having the partial structure represented by Formula (1) described below,

Formula (1)

wherein in Formula (1), $R^1$ represents a hydrogen atom or an organic group, and the copper compound is a copper complex selected from the group consisting of a sulfonic acid copper complex, a carboxylic acid copper complex, and a copper complex represented by Formula (A),

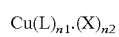

Formula (A)

wherein in Formula (A), L represents a ligand that coordinates copper,

X is not present or represents a halogen atom, $H_2O$, $NO_3$, $ClO_4$, $SO_4$, CN, SCN, $BF_4$, $PF_6$, $BPh_4$ in which Ph represents a phenyl group, or an alcohol, and each of n1 and n2 independently represents an integer from 1 to 4.

* * * * *